United States Patent
Lee et al.

(10) Patent No.: US 12,106,721 B2
(45) Date of Patent: *Oct. 1, 2024

(54) DISPLAY DEVICE

(71) Applicant: Samsung Display Co., Ltd., Yongin-Si (KR)

(72) Inventors: Yu Jin Lee, Suwon-si (KR); Mu Kyung Jeon, Ulsan (KR); Mee Hye Jung, Suwon-si (KR); Hee Jean Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,361

(22) Filed: Aug. 10, 2023

(65) Prior Publication Data
US 2023/0386412 A1    Nov. 30, 2023

Related U.S. Application Data

(63) Continuation of application No. 17/482,521, filed on Sep. 23, 2021, now Pat. No. 11,727,884.

(30) Foreign Application Priority Data

Nov. 23, 2020   (KR) .......................... 10-2020-0157619

(51) Int. Cl.
*G09G 3/3266* (2016.01)
*G09G 3/3233* (2016.01)
(Continued)

(52) U.S. Cl.
CPC ......... *G09G 3/3266* (2013.01); *H10K 59/124* (2023.02); *H10K 59/131* (2023.02);
(Continued)

(58) Field of Classification Search
CPC ... G09G 3/3266; H10K 59/131; H10K 59/124
(Continued)

(56) References Cited

U.S. PATENT DOCUMENTS

2013/0334503 A1* 12/2013 Seo ..................... H10K 59/131
                                                                        257/40
2016/0111485 A1*  4/2016 Chida ................. H10K 59/131
                                                                        438/26
(Continued)

FOREIGN PATENT DOCUMENTS

| KR | 10-2014-0062376 A | 5/2014 |
| KR | 10-2018-0030325 A | 3/2018 |
| KR | 10-2019-0036461 A | 4/2019 |

*Primary Examiner* — Prabodh M Dharia
(74) *Attorney, Agent, or Firm* — Innovation Counsel LLP

(57) ABSTRACT

Embodiments of the present disclosure relates to a display device. According to an embodiment of the disclosure, a display device includes a substrate including a first display region and a second display region surrounding the first display region, a first pixel disposed in the first display region, a second pixel disposed in the second display region, and scan stages which are disposed in the second display region and apply scan signals to the first pixel and the second pixel. The first pixel includes a first pixel driver including a first pixel transistor and a first pixel light-emitting device connected to the first pixel driver. The second pixel includes a second pixel driver including a second pixel transistor and a second pixel light-emitting device connected to the second pixel driver. The second pixel driver is disposed between scan stages adjacent to each other along a first direction.

19 Claims, 29 Drawing Sheets

(51) Int. Cl.
*H10K 59/124* (2023.01)
*H10K 59/131* (2023.01)

(52) U.S. Cl.
CPC ... *G09G 3/3233* (2013.01); *G09G 2300/0426* (2013.01); *G09G 2300/0804* (2013.01); *G09G 2300/0809* (2013.01); *G09G 2310/0202* (2013.01); *G09G 2320/0233* (2013.01)

(58) Field of Classification Search
USPC .......................................... 345/206; 438/26
See application file for complete search history.

(56) References Cited

U.S. PATENT DOCUMENTS

| | | |
|---|---|---|
| 2016/0293884 A1* | 10/2016 | Zhang ................. H10K 59/124 |
| 2017/0249905 A1 | 8/2017 | Kim et al. |
| 2018/0350318 A1 | 12/2018 | Lee et al. |
| 2019/0035876 A1* | 1/2019 | Kim ................. H10K 59/1213 |
| 2019/0189073 A1 | 6/2019 | Haga et al. |
| 2019/0318693 A1 | 10/2019 | Jung et al. |
| 2019/0371248 A1 | 12/2019 | Kim et al. |
| 2022/0310748 A1 | 9/2022 | Li et al. |
| 2022/0344427 A1 | 10/2022 | Wei et al. |

* cited by examiner

DISPLAY DEVICE

CROSS-REFERENCE TO RELATED APPLICATION

This application is a continuation application of U.S. patent application Ser. No. 17/482,521 filed on Sep. 23, 2021, which claims priority under 35 USC § 119 to Korean Patent Application No. 10-2020-0157619 filed on Nov. 23, 2020, and all the benefits accruing therefrom under 35 U.S.C. § 119, the disclosures of which are incorporated herein in their entirety by reference.

BACKGROUND

1. Field of the Disclosure

The present disclosure relates to a display device.

2. Description of the Related Art

As the information society develops, demands for display devices for displaying images are increasing in various forms. For example, display devices are applied to various electronic devices such as smartphones, digital cameras, notebook computers, navigation systems, and smart televisions.

The display devices may include flat display devices such as liquid-crystal display devices, field-emission display devices, light-emitting display devices, or the like. The light-emitting display devices include organic light-emitting display devices including organic light-emitting elements, inorganic light-emitting display devices including inorganic light-emitting elements, such as inorganic semiconductors, and ultra-compact light-emitting display devices including ultra-compact light-emitting elements.

The light-emitting display device may include a display region including pixels for displaying an image, and a non-display region in which an image is not displayed and which includes a scan driver for driving the pixels. Recently, display devices in which an area of a non-display region is reduced so that an area of a display region may be increased are required.

SUMMARY

Embodiments of the current disclosure to provide a display device in which pixels for displaying an image are arranged in a region in which a scan driver is disposed so that an area of a non-display region in which an image is not displayed may be reduced, thereby increasing an area of a display region in which an image is displayed.

According to an embodiment of the disclosure, a display device includes a substrate including a first display region and a second display region surrounding the first display region, a first pixel disposed in the first display region, a second pixel disposed in the second display region, and scan stages which are disposed in the second display region and apply scan signals to the first pixel and the second pixel. The first pixel includes a first pixel driver including a first pixel transistor and a first pixel light-emitting device connected to the first pixel driver. The second pixel includes a second pixel driver including a second pixel transistor and a second pixel light-emitting device connected to the second pixel driver. The second pixel driver is disposed between scan stages adjacent to each other along a first direction.

The second pixel driver and the second pixel light-emitting device may be disposed not to overlap each other in a plan view.

The display device may further include a connection line connecting the second pixel driver to the second pixel light-emitting device.

The second pixel light-emitting device may overlap any one scan stage among the scan stages in a plan view.

The connection line may overlap the one scan stage in a plan view.

The display device may further include scan control lines which are disposed in the second display region and are connected to the scan stages. The second pixel light-emitting device may overlap any one scan control line among the scan control lines in a plan view.

The connection line may overlap the scan control line in a plan view.

The display device may further include light-emitting stages which are disposed in the second display region and apply light-emitting signals to the first pixel and the second pixel, and light-emitting control lines which are disposed in the second display region and are connected to the light-emitting stages.

The second pixel light-emitting device may overlap any one light-emitting stage among the light-emitting stages in a plan view.

The connection line may overlap the light-emitting stage in a plan view.

The second pixel light-emitting device may overlap any one light-emitting control line among the light-emitting control lines in a plan view.

The connection line may overlap the light-emitting control line in a plan view.

The display device may further include a data line which is disposed in the second display region and is connected to the second pixel driver.

The data line may overlap any one scan stage among the scan stages in a plan view.

The connection line may overlap the one scan stage in a plan view.

The display device may further include a first planarization film disposed on the first pixel transistor and the second pixel transistor which are disposed on the substrate, a data line which is disposed on the first planarization film and is connected to the second pixel driver, and a second planarization film disposed on the data line.

The second pixel light-emitting device includes a pixel electrode disposed on the second planarization film, a light-emitting layer disposed on the pixel electrode, and a common electrode disposed on the light-emitting layer. The connection line may be made of the same material as the pixel electrode and be disposed on the same layer as the pixel electrode.

The display device may further include a first planarization film disposed on the first pixel transistor and the second pixel transistor which are disposed on the substrate, a shielding electrode disposed on the first planarization film, a second planarization film disposed on the shielding electrode, a data line which is disposed on the second planarization film and is connected to the second pixel driver, and a third planarization film disposed on the data line.

The second pixel light-emitting device may include a pixel electrode disposed on the third planarization film, a light-emitting layer disposed on the pixel electrode, and a common electrode disposed on the light-emitting layer. The connection line may be made of the same material as the pixel electrode and is disposed on the same layer as the pixel electrode.

The shielding electrode may be electrically connected to the common electrode.

The display device may further include a first planarization film disposed on the first pixel transistor and the second pixel transistor which are disposed on the substrate, a data line which is disposed on the first planarization film and is connected to the second pixel driver, and a second planarization film disposed on the data line. The connection line is disposed on the second planarization film.

The second pixel light-emitting device may include a pixel electrode disposed on a third planarization film which is disposed on the connection line, a light-emitting layer disposed on the pixel electrode, and a common electrode disposed on the light-emitting layer.

According to an embodiment of the disclosure, a display device includes a substrate including a front portion, a first side portion extending from a first side of the front portion, a second side portion extending from a second side of the front portion, and a corner portion disposed between the first side portion and the second side portion, a first display region which is disposed on the front portion of the substrate and includes a first pixel for displaying an image, and a second display region which is disposed on the first side portion and the corner portion of the substrate and includes a second pixel for displaying an image and scan stages that apply scan signals to the first pixel and the second pixel. A horizontal length of a scan stage of the first side portion among the scan stages is greater than a horizontal length of a scan stage of the corner portion.

A vertical length of the scan stage of the first side portion may be smaller than a vertical length of the scan stage of the corner portion.

The second display region may further include light-emitting stages that apply light-emitting signals to the first pixel and the second pixel. A horizontal length of a light-emitting stage of the first side portion among the light-emitting stages is greater than a horizontal length of a light-emitting stage of the corner portion.

A vertical length of the light-emitting stage of the first side portion may be smaller than a vertical length of the light-emitting stage of the corner portion.

The first pixel may include a first pixel driver including a first pixel transistor and a first pixel light-emitting device connected to the first pixel driver, the second pixel includes a second pixel driver including a second pixel transistor and a second pixel light-emitting device connected to the second pixel driver, and the second pixel driver is disposed between scan stages adjacent to each other along a first direction.

According to an embodiment of the disclosure, a second display region disposed between a first display region and a non-display region includes second pixels and includes a scan driver and a light-emission driver which apply scan signals and light-emitting signals not only to the second pixels for displaying an image but also to first pixels in the first display region and the second pixels in the second display region, and thus an area of the display region can be increased. Further, the scan driver and the light-emission driver are not disposed in the non-display region, and thus an area of the non-display region can be reduced.

According to an embodiment of the disclosure, second pixel drivers and second pixel light-emitting devices of second pixels can be disposed to be spaced apart from each other and can be connected to connection lines. In particular, the second pixel driver can be disposed between adjacent scan stages or between adjacent light-emitting stages. In this case, the second pixel light-emitting device can be disposed on any one of the adjacent scan stages or any one of the adjacent light-emitting stages. Accordingly, for each second pixel, a difference in distance between the second pixel driver and the second pixel light-emitting device can be minimized. Therefore, for each second pixel, due to a difference in line resistance between the connection lines that connect the second pixel drivers to the second pixel light-emitting devices, it is possible to minimize or prevent a grayscale difference or a luminance difference from being generated between the second pixel light-emitting devices.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
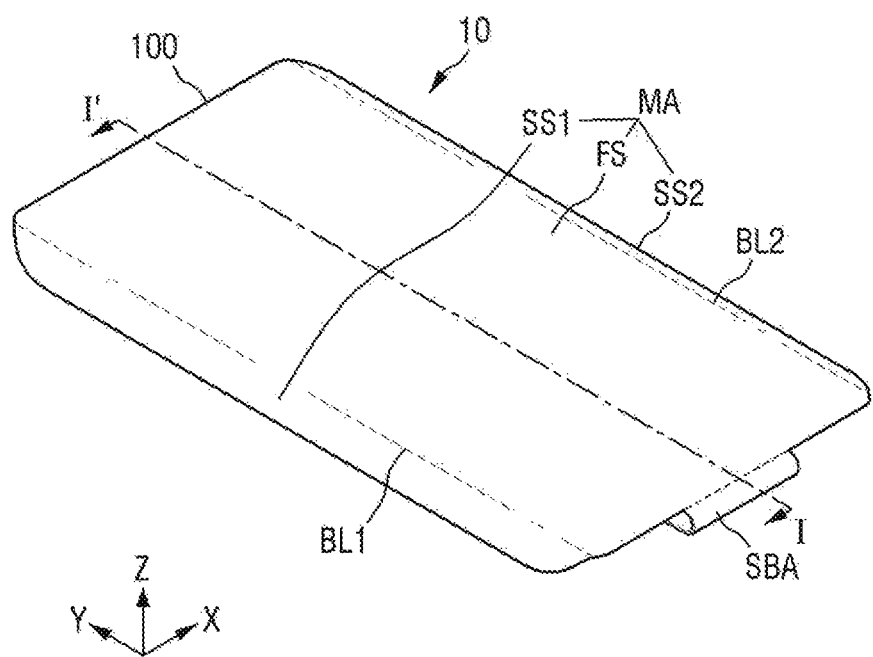
FIG. 1 is a perspective view illustrating a display device according to an embodiment.

The inventive concept now will be described more fully hereinafter with reference to the accompanying drawings, in which various embodiments are shown. This inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

FIG. 1 is a perspective view illustrating a display device according to an embodiment.

A display device 10 according to the embodiment may be portable electronic devices such as mobile phones, smartphones, tablet personal computers (PCs), mobile communication terminals, electronic organizers, electronic books, portable multimedia players (PMPs), navigation systems, ultra-mobile PCs (UMPCs), or the like. Alternatively, the display device 10 according to the embodiment may be display units of televisions, notebook computers, monitors, billboards, and Internet of Things (IoT). Alternatively, the display device 10 according to the embodiment may be wearable devices such as smart watches, watch phones, glasses-type displays, or head-mounted displays (HMDs). Alternatively, the display device 10 according to the embodiment may be dashboards of automobiles, center fasciae of automobiles, center information displays (CIDs) disposed on dashboards of automobiles, room mirror displays that replace side mirrors of automobiles, or displays disposed on rear surfaces of front seats of automobiles serving as entertainment for rear passengers.

Referring to FIG. 1, the display device 10 according to the embodiment includes a display panel 100.

In this specification, a first direction (an X-axis direction) may be a short side direction of the display panel 100, for example, a horizontal direction of the display panel 100. A second direction (a Y-axis direction) may be a long side direction of the display panel 100, for example, a longitudinal direction of the display panel 100. A third direction (a Z-axis direction) may be a thickness direction of the display panel 100.

The display panel 100 may be a light-emitting display panel including light-emitting elements. For example, the display panel 100 may be an organic light-emitting display panel using organic light-emitting diodes (LEDs) including an organic light-emitting layer, a micro light-emitting diode display panel using micro LEDs, a quantum dot light-emitting display panel using quantum dot LEDs including a quantum dot light-emitting layer, or an inorganic light-emitting display panel using inorganic LEDs including an inorganic semiconductor. Hereinafter, a display panel 100 which is an organic light-emitting display panel will be mainly described.

The display panel 100 may include a main region MA and a subregion SBA. The main region MA may include a front portion FS, a first side portion SS1, and a second side portion SS2.

The front portion FS may have a rectangular planar shape having a short side in the first direction (X-axis direction) and a long side in the second direction (Y-axis direction), but embodiments of the present specification are not limited thereto. The front portion FS may have another polygonal, circular, or elliptical planar shape. A corner of the front portion FS in which the short side in the first direction (X-axis direction) and the long side in the second direction (Y-axis direction) meet may be rounded to have a predetermined curvature or may be formed at a right angle. The front portion FS is illustrated as being formed flat, but embodiments of the present specification are not limited thereto. For example, the front portion FS may include a curved surface.

The first side portion SS1 may extend from a left side of the front portion FS. The first side portion SS1 may be bent along a first bending line BL1 of the left side of the front portion FS and may have a first radius of curvature.

The second side portion SS2 may extend from a right side of the front portion FS. The second side portion SS2 may be bent along a second bending line BL2 of the right side of the front portion FS and may have a second radius of curvature. The second radius of curvature may be substantially the same as or different from the first radius of curvature.

In FIG. 1, the main region MA is illustrated as including the first side portion SS1 that is bent from the front portion FS to have the first radius of curvature and the second side portion SS2 that is bent from the front portion FS to have the second radius of curvature, but embodiments of the present specification are not limited thereto. For example, the main region MA may include only the front portion FS which is flat.

The subregion SBA may protrude from a lower side of the front portion FS in the second direction (Y-axis direction). A length of the subregion SBA in the first direction (X-axis direction) may be smaller than a length of the front portion FS in the first direction (X-axis direction) and a length of the subregion SBA in the second direction (Y-axis direction) may be smaller than a length of the front portion FS in the second direction (Y-axis direction), but embodiments of the present specification are not limited thereto. The subregion SBA may be bent and may be disposed below the front portion FS. In this case, the subregion SBA may overlap the front portion FS in the third direction (Z-axis direction).

Figure 2:
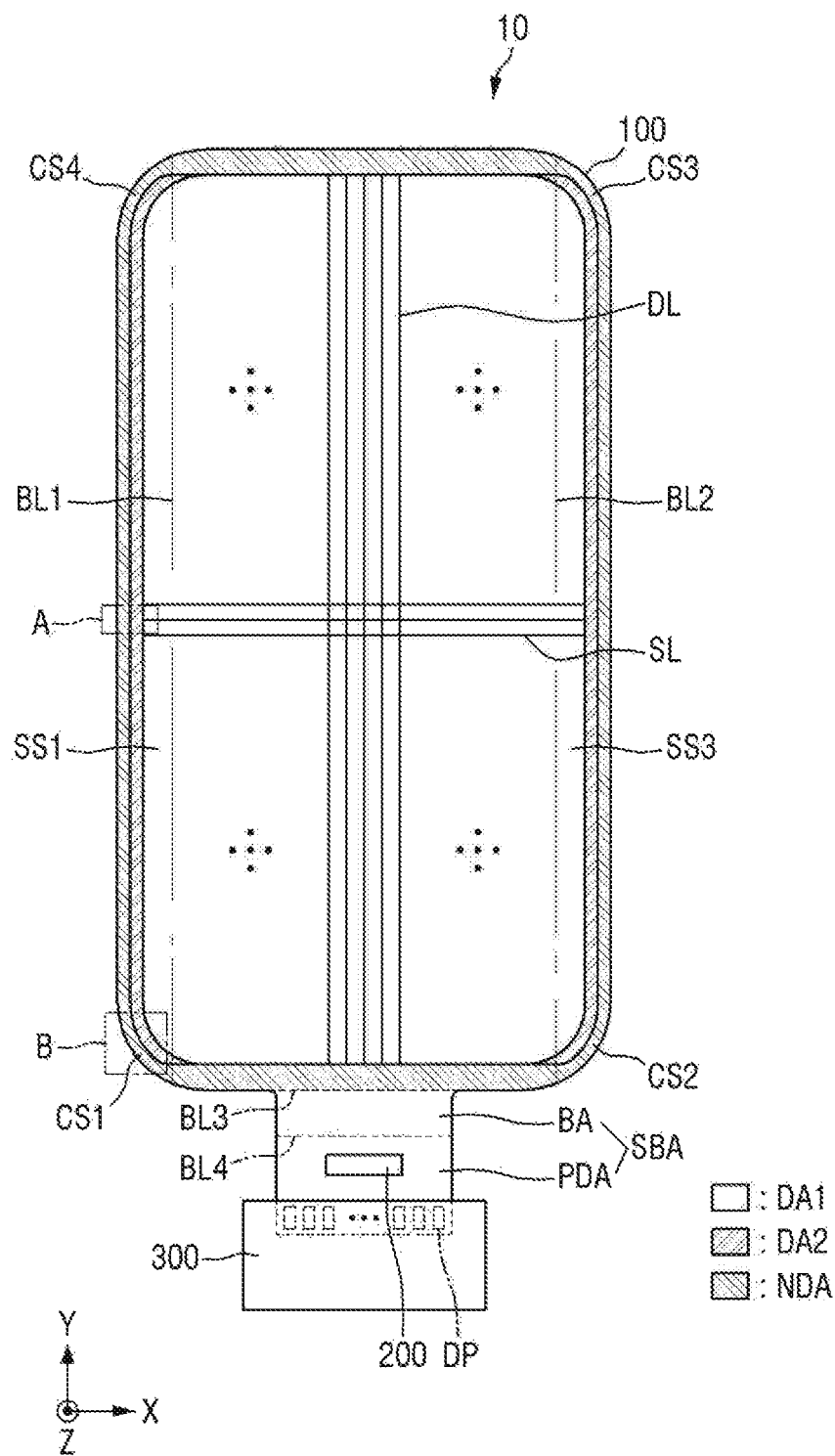
FIG. 2 is an unfolded view illustrating a display device according to an embodiment.

FIG. 2 is an unfolded view illustrating a display device according to an embodiment. In FIG. 2, a display device 10 is illustrated in a state in which a subregion SBA is not bent and is unfolded.

Referring to FIG. 2, a display panel 100 may include a front portion FS, a first side portion SS1, and a second side portion SS2. The first side portion SS1 may include a first corner portion CS1 and a fourth corner portion CS4 and the second side portion SS2 may include a second corner portion CS2 and a third corner portion CS3.

The first corner portion CS1 may be disposed at a lower side of the first side portion SS1 and the second corner portion CS2 may be disposed at a lower side of the second side portion SS2. The third corner portion CS3 may be disposed at an upper side of the second side portion SS2 and the fourth corner portion CS4 may be disposed at an upper side of the first side portion SS1.

A first display region DA1 and a second display region DA2 refer to regions in which pixels are included so that an image is displayed. A non-display region NDA refers to a region in which pixels are not included so that an image is not displayed. A power line for driving pixels may be disposed in the non-display region NDA.

The first display region DA1 may be a main display region of the display panel 100. The first display region DA1 may include the front portion FS, a portion of the first side portion SS1, and a portion of the second side portion SS2. The portion of the first side portion SS1 refers to a region extending from a left side of the front portion FS and the portion of the second side portion SS2 refers to a region extending from a right side of the front portion FS. The first display region DA1 may occupy most of the front portion FS. Each of corners of the first display region DA1 may be rounded to have a predetermined radius of curvature.

The second display region DA2 may be an auxiliary display region of the display panel 100. A resolution of the second display region DA2 may be different from a resolution of the first display region DA1. For example, since the second display region DA2 serves to assist the first display region DA1, the resolution of the second display region DA2 may be lower than the resolution of the first display region DA1. That is, the number of second pixels PX2 (see FIG. 4) per unit area (pixels per inch 2) in the second display region DA2 may be smaller than the number of first pixels PX1 (see FIG. 4) per unit area in the first display region DA1.

However, embodiments of the present specification are not limited thereto, and the resolution of the second display region DA2 may be substantially the same as the resolution of the first display region DA1. For example, the unit area may be an area of a square which corresponds to an area of one inch in a first direction (an X-axis direction) and one inch in a second direction (a Y-axis direction), but embodiments of the present specification are not limited thereto.

The second display region DA2 may include another portion of the first side portion SS1 and another portion of the second side portion SS2. Another portion of the first side portion SS1 refers to a region extending from the portion of the first side portion SS1 and another portion of the second side portion SS2 refers to a region extending from the portion of the second side portion SS2.

The non-display region NDA may be disposed on edges of the display panel 100. The non-display region NDA may be disposed to surround the first display region DA1 and the second display region DA2. The non-display region NDA may be disposed to completely surround the first display region DA1 and the second display region DA2. The non-display region NDA may be disposed on a lower outer side and an upper outer side of the first display region DA1 and a left outer side and a right outer side of the second display region DA2. The non-display region NDA may be disposed on the front portion FS, the first side portion SS1, and the second side portion SS2.

Figure 3:
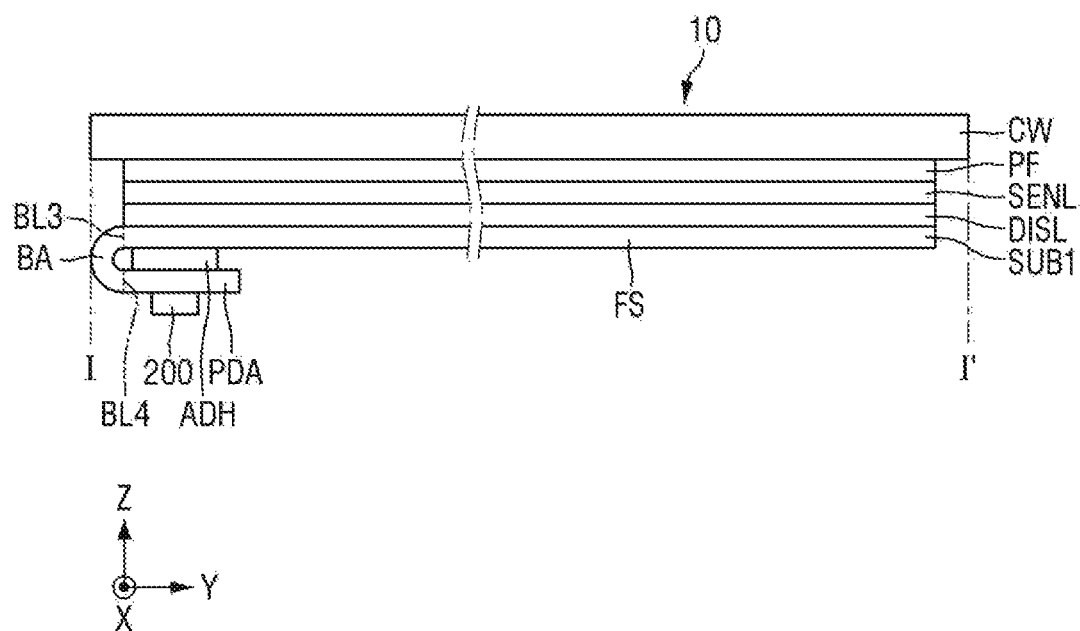
FIG. 3 is a cross-sectional view illustrating a display device according to an embodiment.

The subregion SBA may include a bending portion BA and a pad portion PDA. The bending portion BA may be bent as illustrated in FIG. 3. The bending portion BA may be bent along a third bending line BL3 at a lower side of the front portion FS. The pad portion PDA may be bent along a fourth bending line BL4 at a lower side of the bending portion BA.

A display driving circuit 200 and a display circuit board 300 may be disposed on the pad portion PDA. The display driving circuit 200 may be attached onto the pad portion PDA by a chip on plastic (COP) method or an ultrasonic method. The pad portion PDA may include pads DP. The display circuit board 300 may be attached onto the pad portion PDA to the pads DP of the subregion SBA of the display panel 100 using a low-resistance and high-reliability material such as an anisotropic conductive film or self-assembled anisotropic conductive paste (SAP).

In the first display region DA1 and the second display region DA2, scan lines SL may extend in the first direction (X-axis direction) and may be disposed in the second direction (Y-axis direction). In the first display region DA1, data lines DL may extend in the second direction (Y-axis direction) and may be disposed in the first direction (X-axis direction). In the first display region DA1, the data lines DL may cross the scan lines SL.

The display driving circuit 200 may receive digital video data, control signals, and power voltages through the display circuit board 300 and generate and output signals and voltages for driving the display panel 100. The display driving circuit 200 may be attached onto the subregion SBA of the display panel 100. Alternatively, the display driving circuit 200 may be attached onto the display circuit board 300.

The display circuit board 300 may be a flexible printed circuit board that may be bent, a rigid printed circuit board that is hard and does not bend easily, or a composite printed circuit board including both of the rigid printed circuit board and the flexible printed circuit board. The display circuit board 300 may be attached onto the subregion SBA of the display panel 100.

As illustrated in FIG. 2, since the front portion FS, the first side portion SS1, and the second side portion SS2 of the display panel 100 include the display regions DA1 and DA2 in which an image is displayed, a user may view an image displayed not only on the front portion FS of the display panel 100 but also on the side portions SS1 and SS2.

FIG. 3 is a cross-sectional view illustrating a display device according to an embodiment. In FIG. 3, an example of the display device 10 taken along line I-I' of FIG. 1 is illustrated.

Referring to FIG. 3, the display device 10 may further include a cover window CW and a polarizing film PF covering a display panel 100. The display panel 100 may include a substrate SUB, a display layer DISL, and a sensor electrode layer SENL. The polarizing film PF may be disposed on the display panel 100 and the cover window CW may be disposed on the polarizing film PF.

The display layer DISL may be disposed on the substrate SUB. The display layer DISL may include display regions DA1 and DA2 (see FIG. 2) and a non-display region NDA. The display layer DISL may include a thin film transistor layer TFTL (see FIG. 9), a light-emitting element layer EML (see FIG. 9) in which light-emitting elements emitting light are disposed, and an encapsulation layer TFE (see FIG. 9) for encapsulating the light-emitting element layer.

The sensor electrode layer SENL may be disposed on the display layer DISL. The sensor electrode layer SENL may include sensor electrodes. The sensor electrode layer SENL may sense a touch of a person or an object using the sensor electrodes.

The polarizing film PF may be disposed on the sensor electrode layer SENL. The polarizing film PF may include a first base member, a linear polarizing plate, phase delay films such as a quarter-wave ($\lambda/4$) plate and/or a half-wave ($\lambda/2$) plate, and a second base member. For example, the first base member, the linear polarizing plate, the $\lambda/4$ plate, the $\lambda/2$ plate, and the second base member may be sequentially stacked on the sensor electrode layer SENL.

The cover window CW may be disposed on the polarizing film PF. The cover window CW may be attached onto the polarizing film PF using a transparent adhesive layer, such as an optically clear adhesive (OCA) film or an optically clear resin (OCR). The cover window CW may be made of an inorganic material such as glass or may be made of an organic material such as plastic or a polymer material.

The bending portion BA may be bent along a third bending line BL3, and the pad portion PDA may be bent along a fourth bending line BL4 and disposed on a lower surface of the display panel 100 opposing the front portion FS. The pad portion PDA may be attached onto the lower surface of the display panel 100 opposing the front portion FS using an adhesive member ADH. The adhesive ADH may be a pressure sensitive adhesive.

Figure 4:
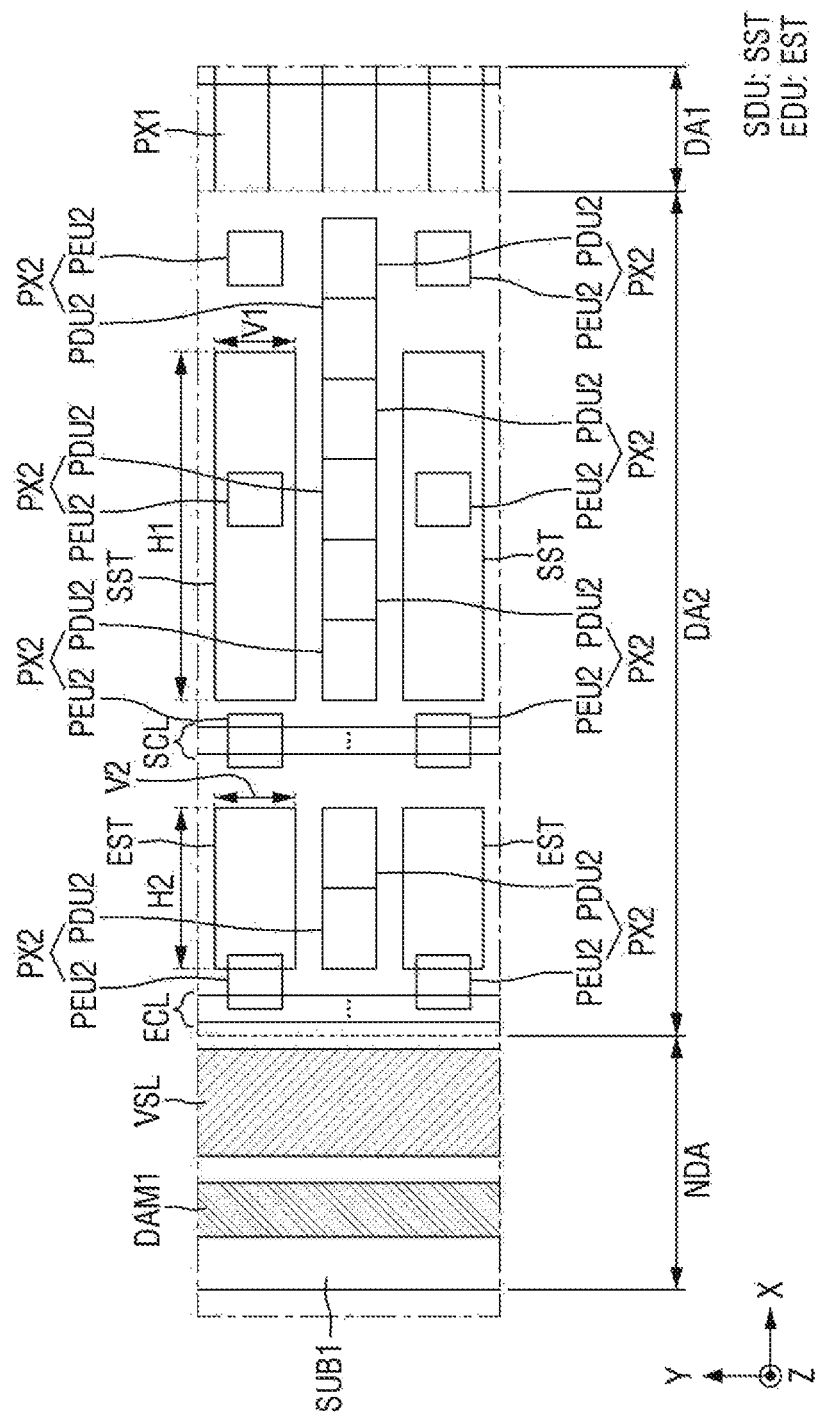
FIG. 4 is a layout diagram illustrating a first display region, a second display region, and a non-display region of a first side portion of a display panel according to an embodiment.

FIG. 4 is a layout diagram illustrating a first display region, a second display region, and a non-display region of a first side portion of a display panel according to an embodiment. In FIG. 4, a layout of region A of FIG. 2 is illustrated.

Referring to FIG. 4, a first display region DA1 includes first pixels PX1. The first pixels PX1 may be arranged in a matrix form in a first direction (an X-axis direction) and a second direction (a Y-axis direction). Each of the first pixels PX1 may include a first pixel light-emitting device PEU1 (see FIGS. 8A to 8C) which emits predetermined light, and a first pixel driver PDU1 (see FIGS. 8A to 8C) which applies a driving current or a driving voltage to a first pixel electrode 171 (see FIG. 9) of the first pixel light-emitting device PEU1

Figure 8A:
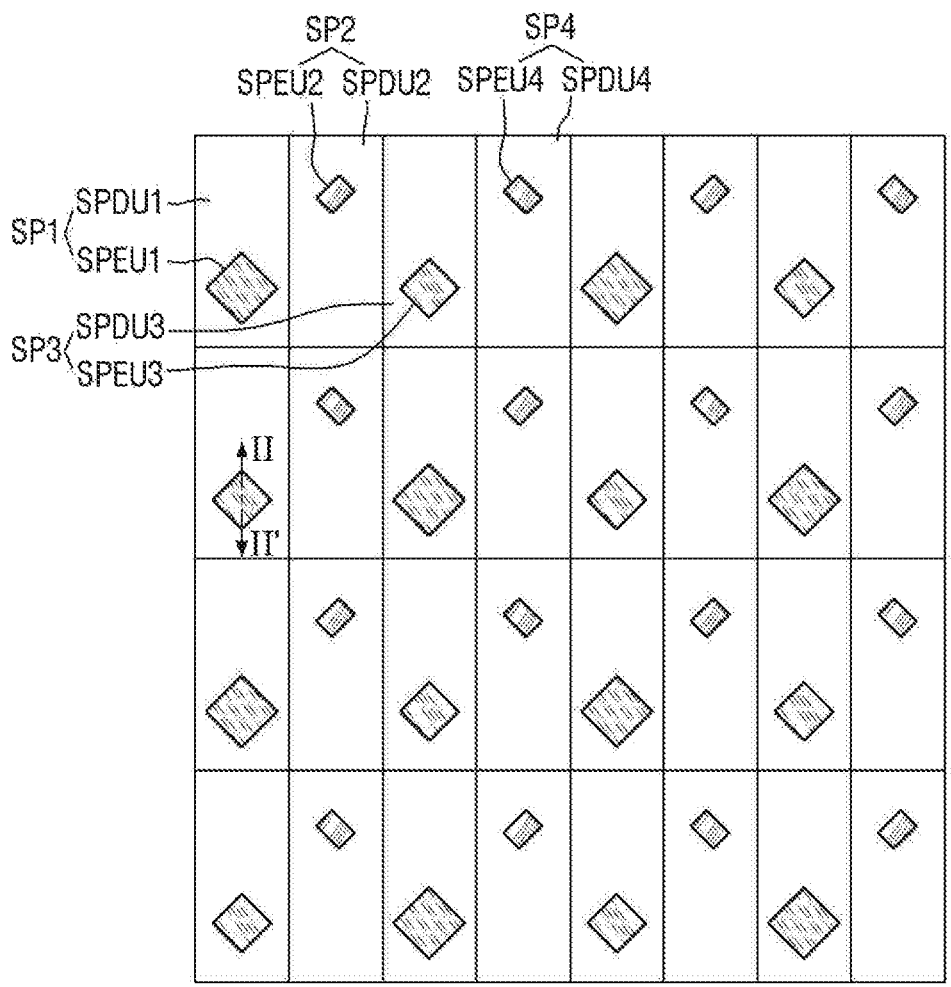
FIG. 8A is a layout diagram illustrating an example of first pixels of FIG. 4.
Figure 8B:
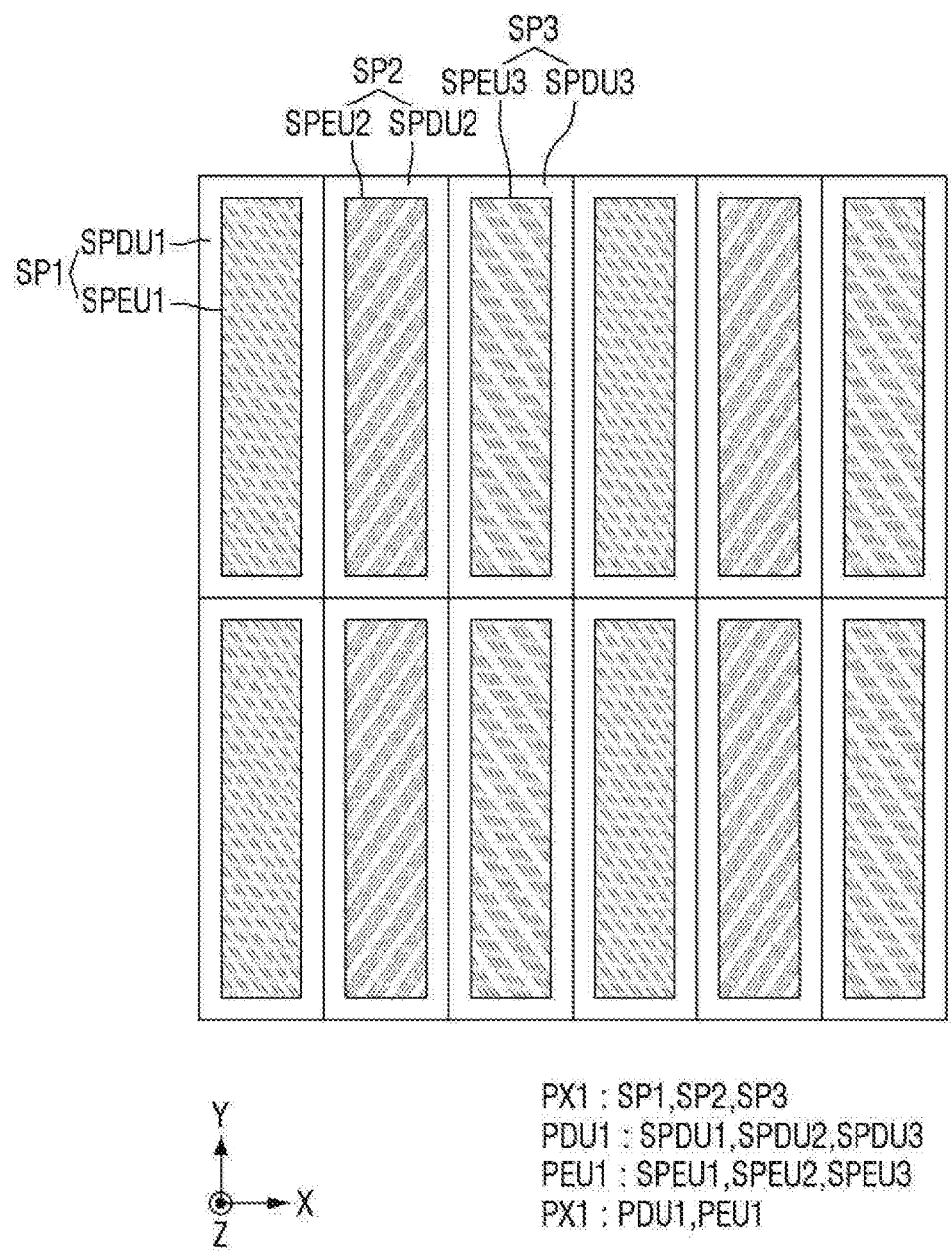
FIG. 8B is a layout diagram illustrating another example of the first pixels of FIG. 4.
Figure 8C:
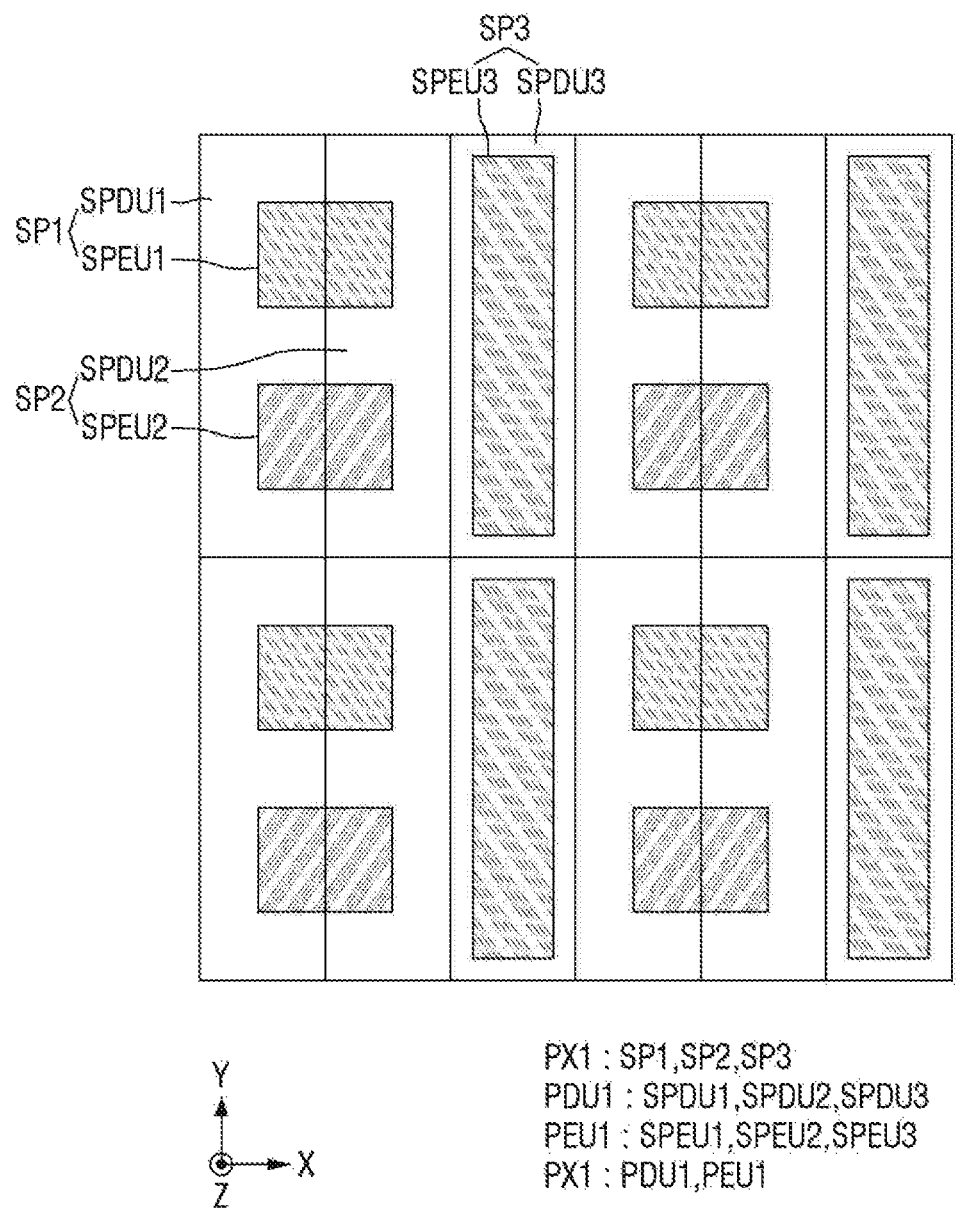
FIG. 8C is a layout diagram illustrating still another example of the first pixels of FIG. 4.

(see FIGS. 8A to 8C). Descriptions of the first pixel driver PDU1 (see FIGS. 8A to 8C) and the first pixel light-emitting device PEU1 (see FIGS. 8A to 8C) of each of the first pixels PX1 will be given below with reference to FIGS. 8A to 8C.

A second display region DA2 includes second pixels PX2, a scan driver SDU including a plurality of scan stages SST, a light-emission driver EDU including a plurality of light-emitting stages EST, scan control lines SCL, and light-emitting control lines ECL.

The scan driver SDU may include a plurality of scan stages SST. The plurality of scan stages SST each may be connected to one of the scan control lines SCL. The plurality of scan stages SST may generate scan signals in response to scan control signals of the scan control lines SCL and output the generated scan signals to scan lines SLk and SLk+1 (see FIG. 6).

In a first side portion SS1, the scan stages SST may be arranged in the second direction (Y-axis direction). In the first side portion SS1, a horizontal length H1 of each of the scan stages SST may be greater than a vertical length V1. In the first side portion SS1, the horizontal length H1 of each of the scan stages SST may be a length in the first direction (X-axis direction) and the vertical length V1 may be a length in the second direction (Y-axis direction).

In the first side portion SS1, the scan control lines SCL may extend in the second direction (Y-axis direction). The scan control lines SCL may be disposed between the scan driver SDU and the light-emission driver EDU in the first direction (X-axis direction). The scan control lines SCL may be electrically connected to a display driving circuit 200. The scan control lines SCL may receive scan control signals from the display driving circuit 200. The scan control signals may include scan clock signals and a scan start signal.

The light-emission driver EDU may be disposed farther from the display panel 100 than the scan driver SDU. The light-emission driver EDU may be disposed closer to a non-display region NDA than the scan driver SDU.

The light-emission driver EDU may include a plurality of light-emitting stages EST. The plurality of light-emitting stages EST each may be connected to one of the light-emitting control lines ECL. The plurality of light-emitting stages EST may generate light-emitting signals in response to light-emitting control signals received from the light-emitting control lines ECL and output the generated light-emitting signals to light-emitting lines ELk and ELk+1 (see FIG. 7).

In the first side portion SS1, the light-emitting stages EST may be arranged in the second direction (Y-axis direction). In the first side portion SS1, a horizontal length H2 of each of the light-emitting stages EST may be greater than a vertical length V2. In the first side portion SS1, the horizontal length H2 of each of the light-emitting stages EST may be a length in the first direction (X-axis direction) and the vertical length V2 may be a length in the second direction (Y-axis direction).

In the first side portion SS1, the light-emitting control lines ECL may extend in the second direction (Y-axis direction). The light-emitting control lines ECL may be disposed between the light-emission driver EDU and the non-display region NDA in the first direction (X-axis direction). The light-emitting control lines ECL may be electrically connected to the display driving circuit 200. The light-emitting control lines ECL may receive light-emitting control signals from the display driving circuit 200. The light-emitting control signals may include light-emitting clock signals and a light-emitting start signal.

Each of the second pixels PX2 may include a second pixel light-emitting device PEU2 which emits predetermined light, and a second pixel driver PDU2 which applies a driving current or a driving voltage to a second pixel electrode 171' (see FIG. 12) of the second pixel light-emitting device PEU2. The second pixel driver PDU2 and the second pixel light-emitting device PEU2 may be disposed to be spaced apart from each other. The second pixel driver PDU2 and the second pixel light-emitting device PEU2 may be disposed not to overlap each other in a plan view. The second pixel driver PDU2 and the second pixel light-emitting device PEU2 may be connected by connection lines CL1, CL2, and CL3 (see FIG. 10).

The second pixel light-emitting devices PEU2 may be disposed at a first interval in the first direction (X-axis direction). The second pixel light-emitting devices PEU2 may be disposed at a second interval in the second direction (Y-axis direction). The second interval may be substantially the same as or different from the first interval.

The second pixel light-emitting device PEU2 may overlap at least one of the light-emitting control lines ECL in a third direction (Z-axis direction). The second pixel light-emitting device PEU2 may overlap any one of the light-emitting stages EST in the third direction (Z-axis direction). The second pixel light-emitting device PEU2 may overlap at least one of the light-emitting control lines ECL and any one of the light-emitting stages EST in the third direction (Z-axis direction).

The second pixel light-emitting device PEU2 may overlap at least one of the scan control lines SCL in the third direction (Z-axis direction). The second pixel light-emitting device PEU2 may overlap any one of the scan stages SST in the third direction (Z-axis direction). The second pixel light-emitting device PEU2 may not overlap the scan control lines SCL, the scan stages SST, the light-emitting control lines ECL, and the light-emitting stage EST in the third direction (Z-axis direction).

Some of the second pixel drivers PDU2 may be disposed between scan stages SST adjacent to each other in the second direction (Y-axis direction). Another part of the second pixel drivers PDU2 may be disposed between light-emitting stages EST adjacent to each other in the second direction (Y-axis direction). The second pixel drivers PDU2 may not overlap the light-emitting control lines ECL and the scan control lines SCL in the third direction (Z-axis direction).

Figure 10:
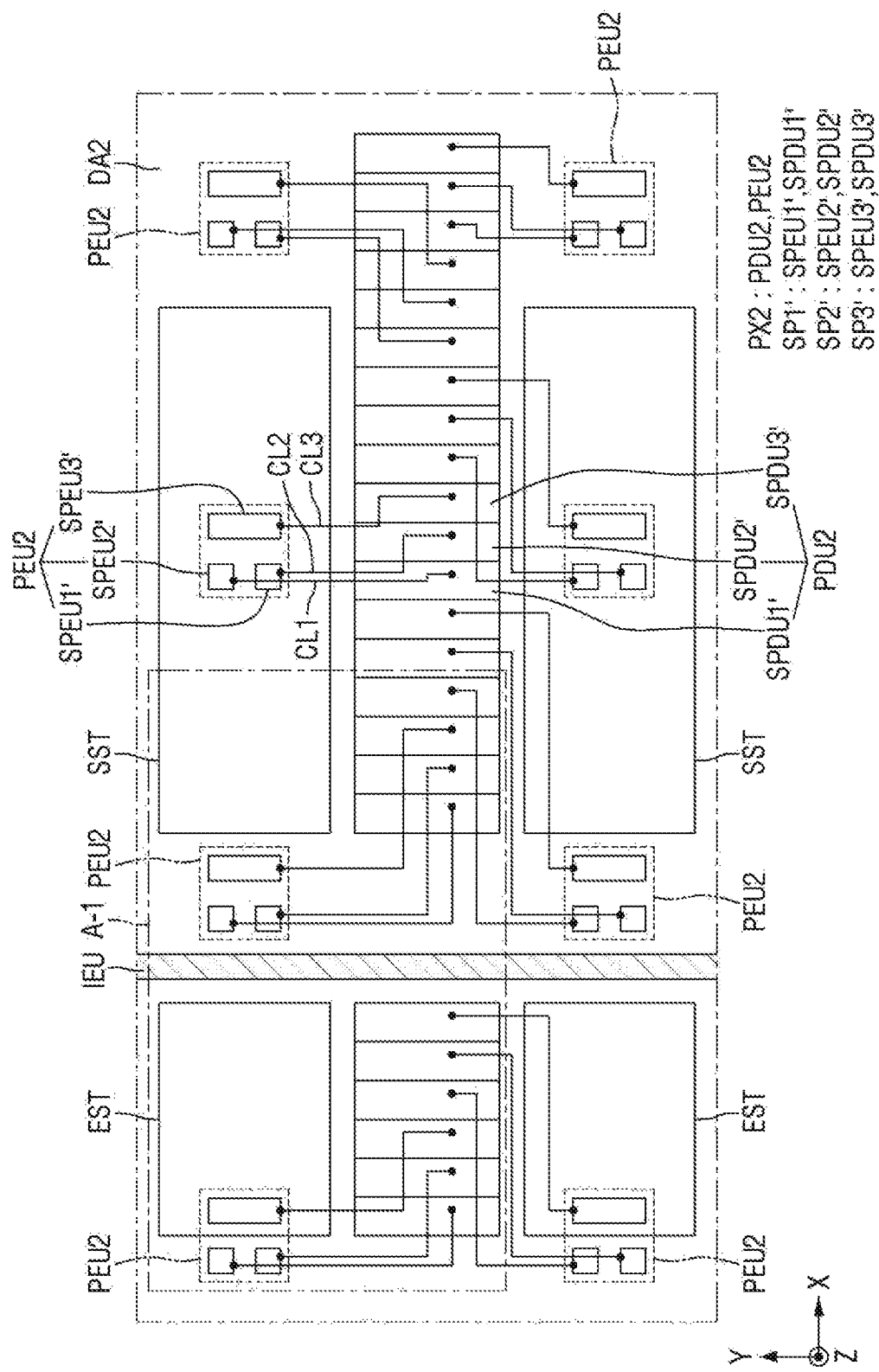
FIG. 10 is a diagram illustrating an example of a second display region of FIG. 4 in detail.

As illustrated in FIG. 4, the second pixel driver PDU2 and the second pixel light-emitting device PEU2 may be disposed not to overlap each other in a plan view but may be connected by the connection lines CL1, CL2, and CL3 (see FIG. 10). In particular, the second pixel driver PDU2 may be disposed between the scan stages SST adjacent to each other in the second direction (Y-axis direction) or may be disposed between the light-emitting stages EST adjacent to each other in the second direction (Y-axis direction). In this case, the second pixel light-emitting device PEU2 may be disposed on any one of the scan stages SST adjacent to each other in the second direction (Y-axis direction) or may be disposed on any one of the light-emitting stages EST adjacent to each other in the second direction (Y-axis direction). Accordingly, for each second pixel PX2, a deviation in distance between the second pixel driver PDU2 and the second pixel light-emitting device PEU2 may be minimized. Therefore, for each second pixel PX2, due to a difference in line resistance between the connection lines CL1, CL2, and CL3 (see FIG. 10) that connect the second pixel drivers PDU2 to the second pixel light-emitting devices PEU2, it is possible to minimize or prevent a grayscale difference or a luminance difference from being generated between the second pixel light-emitting devices PEU2.

The non-display region NDA includes a first power line VSL and a first dam DAM1.

In the first side portion SS1, the first power line VSL may extend in the second direction (Y-axis direction). The first power line VSL may be disposed between the light-emitting control lines ECL and the first dam DAM1 in the first direction (X-axis direction). The first power line VSL may be electrically connected to the display driving circuit 200. The first power line VSL may receive a first power voltage from the display driving circuit 200. Since the first power line VSL is electrically connected to a common electrode 173 (see FIG. 9) of the first pixel light-emitting device PEU1 and a common electrode 173' (see FIG. 12) of the second pixel light-emitting device PEU2, the first power voltage may be supplied to the common electrode 173 (see FIG. 9) of the first pixel light-emitting device PEU1 and the common electrode 173' (see FIG. 12) of the second pixel light-emitting device PEU2.

The first dam DAM1 is a structure for preventing an encapsulation organic film TFE2 (see FIG. 9) of the encapsulation layer TFE (see FIG. 9) from overflowing to edges of the display panel 100. In the first side portion SS1, the first dam DAM1 may extend in the second direction (Y-axis direction). The first dam DAM1 may be disposed at the edges of the display panel 100 to completely surround the first display region DA1 and the second display region DA2.

Meanwhile, since a first display region DA1, a second display region DA2, and a non-display region NDA of a second side portion SS2 are substantially the same as those described with reference to FIG. 4, descriptions thereof will be omitted. However, since a first display region DA1, a second display region DA2, and a non-display region NDA of a first corner portion CS1, a second corner portion CS2, a third corner portion CS3, and a fourth corner portion CS4 of the first side portion SS1 and the second side portion SS2 are different from those in the embodiment of FIG. 4, descriptions thereof will be given below with reference to FIGS. 19 and 20.

As illustrated in FIG. 4, since the second display region DA2 includes the scan driver SDU and the light-emission driver EDU for applying the scan signals and the light-emitting signals not only to the second pixels PX2 for displaying an image but also to the first pixels PX1 of the first display region DA1 and the second pixels PX2 of the second display region DA2, an area of the display region may be increased. Further, since the scan driver SDU and the light-emission driver EDU are not disposed in the non-display region NDA, an area of the non-display region NDA may be reduced.

Figure 5:
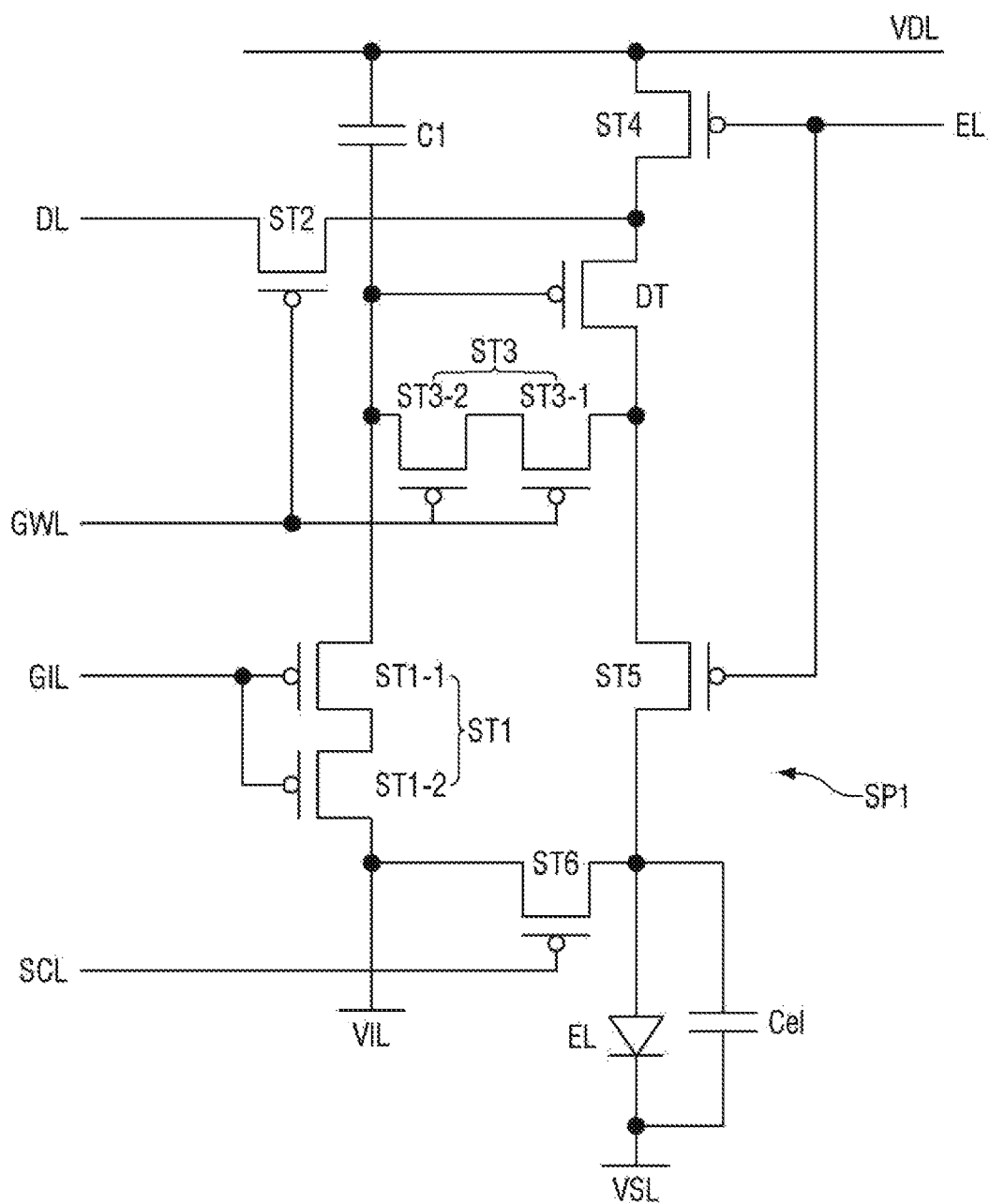
FIG. 5 is a circuit diagram illustrating an example of a first sub-pixel of a first pixel in the first display region of FIG. 4.

FIG. 5 is a circuit diagram illustrating an example of a first sub-pixel of the first pixel in the first display region of FIG. 4.

Referring to FIG. 5, a first sub-pixel SP1 of the first pixel PX1 (see FIG. 4) may be connected to any two of the scan lines SL, any one of the light-emitting lines EL, and any one of the data lines DL. For example, as illustrated in FIG. 5, the first sub-pixel SP1 may be connected to a write scan line GWL, an initialization scan line GIL, a control scan line GCL, the light-emitting line EL, and the data line DL. In an embodiment, the write scan line GWL and the control scan line GCL may be a $k^{th}$ scan line SLk of FIG. 6 and the initialization scan line GIL may be a $(k-1)^{th}$ scan line SLk−1 of FIG. 6, but embodiments of the present specification are not limited thereto. Further, the light-emitting line EL may be a $k^{th}$ light-emitting line Elk of FIG. 6, but embodiments of the present specification are not limited thereto.

The first sub-pixel SP1 includes a first sub-pixel light-emitting device SPEU1 having a light-emitting element LEL, and a first sub-pixel driver SPDU1 having a driving transistor DT, switch elements, and a capacitor C1, as illustrated in FIG. 5.

The driving transistor DT includes a gate electrode, a first electrode, and a second electrode. The driving transistor DT controls a drain-source current Ids (hereinafter, referred to as a "driving current") flowing between the first electrode and the second electrode according to a data voltage applied to the gate electrode.

The light-emitting element LEL emits light according to the driving current Ids. An amount of light emitted from the light-emitting element LEL may be proportional to the driving current Ids.

The light-emitting element LEL may be an organic light emitting diode including an anode electrode, a cathode electrode, and an organic light-emitting layer disposed between the anode electrode and the cathode electrode. Alternatively, the light-emitting element LEL may be an inorganic light-emitting element including an anode electrode, a cathode electrode, and an inorganic semiconductor disposed between the anode electrode and the cathode electrode. Alternatively, the light-emitting element LEL may be a quantum dot light-emitting element including an anode electrode, a cathode electrode, and a quantum dot light-emitting layer disposed between the anode electrode and the cathode electrode. Alternatively, the light-emitting element LEL may be a micro light-emitting diode.

The anode electrode of the light-emitting element LEL may be connected to a first electrode of a fifth transistor ST5 and a second electrode of a sixth transistor ST6, and the cathode electrode may be connected to the first power line VSL. A parasitic capacitance Cel may be formed between the anode electrode and the cathode electrode of the light-emitting element LEL.

The capacitor C1 is formed between a control electrode of the driving transistor DT and a first driving voltage line VDDL. One electrode of the capacitor C1 may be connected to the control electrode of the driving transistor DT and the other electrode may be connected to a second power line VDL.

When a first electrode of each of first to sixth transistors ST1, ST2, ST3, ST4, ST5, and ST6 and a first electrode of the driving transistor DT are source electrodes, second electrodes thereof may be drain electrodes. Alternatively, when the first electrode of each of the first to sixth transistors ST1, ST2, ST3, ST4, ST5, and ST6 and the first electrode of the driving transistor DT are drain electrodes, the second electrodes thereof may be source electrodes.

An active layer of each of the first to sixth transistors ST1, ST2, ST3, ST4, ST5, and ST6 and an active layer of the driving transistor DT may be formed of any one of polycrystalline silicon, amorphous silicon, and oxide semiconductor. When a semiconductor layer of each of the first to sixth transistors ST1, ST2, ST3, ST4, ST5, and ST6 and a semiconductor layer of the driving transistor DT are formed of polycrystalline silicon, a process for forming the semiconductor layers may be a low-temperature polycrystalline silicon (LTPS) process.

Further, in FIG. 5, the first to sixth transistors ST1, ST2, ST3, ST4, ST5, and ST6 and the driving transistor DT are mainly described as being formed as a P-type metal-oxide-semiconductor field-effect transistor (MOSFET), but embodiments of the present specification are not limited thereto, and the first to sixth transistors ST1, ST2, ST3, ST4, ST5, and ST6 and the driving transistor DT may be formed as an N-type MOSFET.

Meanwhile, the first pixel PX1 may include a plurality of sub-pixels as illustrated in FIGS. 8A to 8C. In this case, remaining sub-pixels of the first pixel PX1 may also be substantially the same as that described with reference to FIG. 5.

Figure 6:
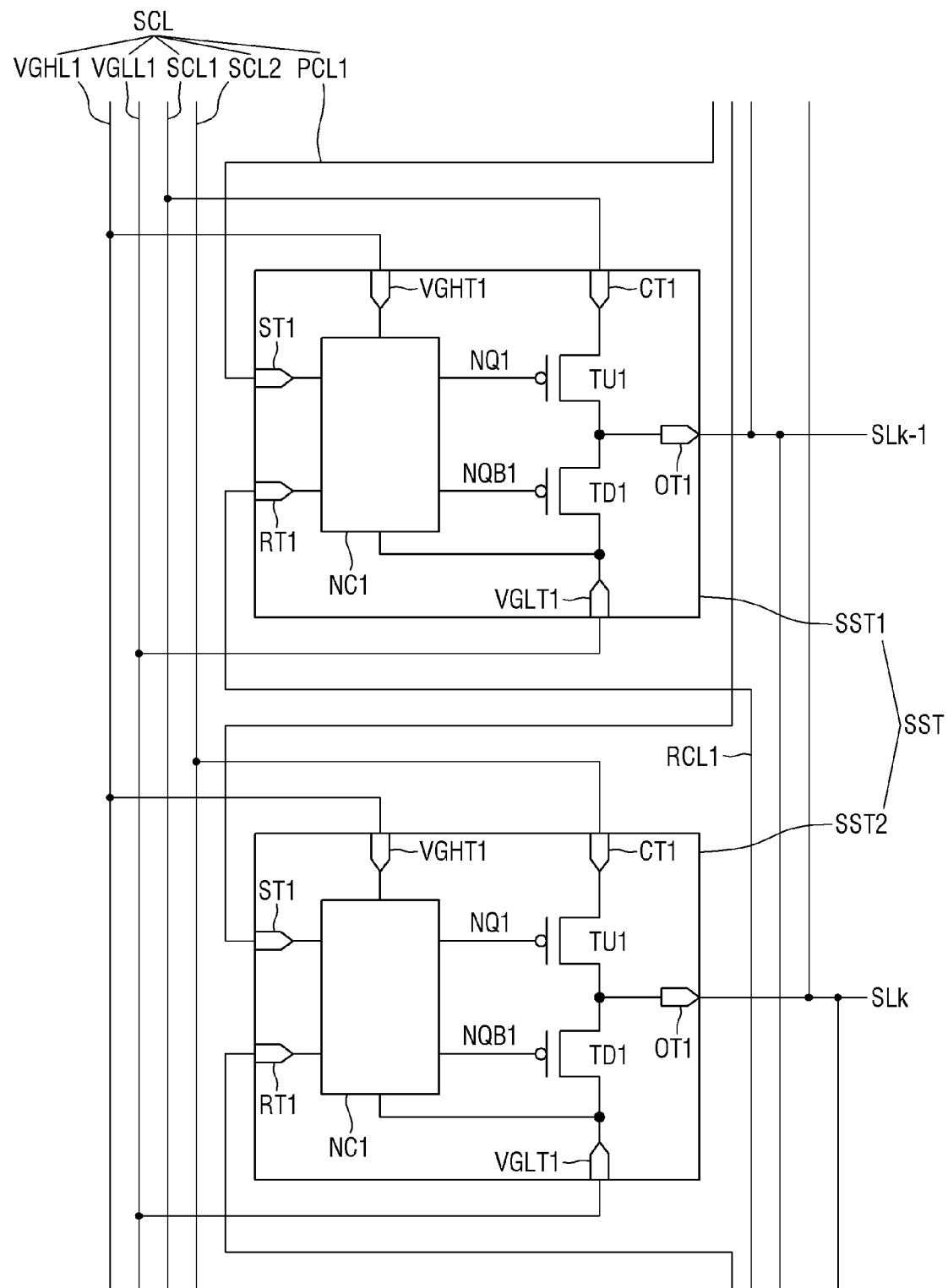
FIG. 6 is a diagram illustrating an example of a scan stage of FIG. 4.

FIG. 6 is a circuit diagram illustrating an example of the scan stage of FIG. 4.

Referring to FIG. 6, a scan stage SST may include a first sub-scan stage SST1 and a second sub-scan stage SST2.

The first sub-scan stage SST1 and the second sub-scan stage SST2 may sequentially output scan signals. For example, the first sub-scan stage SST1 may be connected to a $(k-1)^{th}$ scan line SLk-1 to output a $(k-1)^{th}$ scan signal. The second sub-scan stage SST2 may be connected to a $k^{th}$ scan line SLk to output a $k^{th}$ scan signal.

The first sub-scan stage SST1 and the second sub-scan stage SST2 may be connected to scan control lines SCL. The scan control lines SCL may include a first front-end carry line PCL1 to which an output signal of a front-end sub stage is applied, scan clock lines SCL1 and SCL2 to which scan clock signals are applied, a first gate-on voltage line VGHL1, and a first gate-off voltage line VGLL1. Instead of the first front-end carry line PCL1, a first stage may include a scan start signal line to which a scan start signal is applied as the scan control lines SCL.

Each of the first sub-scan stage SST1 and the second sub-scan stage SST2 includes a first pull-up node NQ1, a first pull-down node NQB1, a first pull-up transistor TU1 which is turned on when the first pull-up node NQ1 has a first gate-on voltage, a first pull-down transistor TD1 which is turned on when the first pull-down node NQB1 has a first gate-on voltage, and a first node controller NC1 for controlling charging and discharging of the first pull-up node NQ1 and the first pull-down node NQB1, as illustrated in FIG. 6.

The first node controller NC1 includes a first start terminal STR1, a first reset terminal RT1, a first gate-on voltage terminal VGHT1, a first gate-off voltage terminal VGLT1, a first clock terminal CT1, and a first output terminal OT1. The first start terminal STR1 may be connected to the scan start signal line to which the scan start signal is applied or to a first front-end carry line PCL1 to which an output signal of a front-end stage is applied. The first reset terminal RT1 may be connected to a first rear-end carry line RCL1 to which an output signal of a rear-end stage is input. The first gate-on voltage terminal VGHT1 may be connected to the first gate-on voltage line VGHL1 to which the first gate-on voltage is applied. The first gate-off voltage terminal VGLT1 may be connected to the first gate-off voltage line VGLL1 to which a gate-off voltage is applied. The first gate-on voltage may be a first level voltage and the first gate-off voltage may be a second level voltage. The first node controller NC1 may include a plurality of thin film transistors.

The first clock terminal CT1 may be connected to any one of a first scan clock line SCL1 to which a first scan clock signal is applied and a second scan clock line SCL2 to which a second scan clock signal is applied. The sub-scan stages may be alternately connected to the first scan clock line SCL1 and the second scan clock line SCL2. For example, when the first clock terminal CT1 of the first sub-scan stage SST1 is connected to the first scan clock line SCL1, the first clock terminal CT1 of the second scan stage SST2 may be connected to the second scan clock line SCL2. In FIG. 6, the first sub-scan stage SST1 and the second sub-scan stage SST2 are illustrated as being alternately connected to the two scan clock lines SCL1 and SCL2, but embodiments of the present specification are not limited thereto. For example, the first sub-scan stage SST1 and the second sub-scan stage SST2 may be alternately connected to three or more scan clock lines.

The first output terminal OT1 may be connected to any one of the scan lines SLk-1 and SLk. The sub-scan stages SST1 and SST2 may be sequentially connected to the scan lines SLk-1 and SLk. For example, the first output terminal OT1 of the first sub-scan stage SST1 may be connected to a $(k-1)^{th}$ scan line SLk-1, and the first output terminal OT1 of the second sub-scan stage SST2 may be connected to a $k^{th}$ scan line SLk.

Further, in FIG. 6, the first pull-up transistor TU1, the first pull-down transistor TD1, and the plurality of transistors of the first node controller NC1 of each of the first sub-scan stage SST1 and the second sub-scan stage SST2 are illustrated as being formed as a P-type MOSFET, but the embodiments of this specification are not limited thereto. That is, the first pull-up transistor TU1, the first pull-down transistor TD1, and the plurality of transistors of the first node controller NC1 of each of the first sub-scan stage SST1 and the second sub-scan stage SST2 may be formed as an N-type MOSFET.

Figure 7:
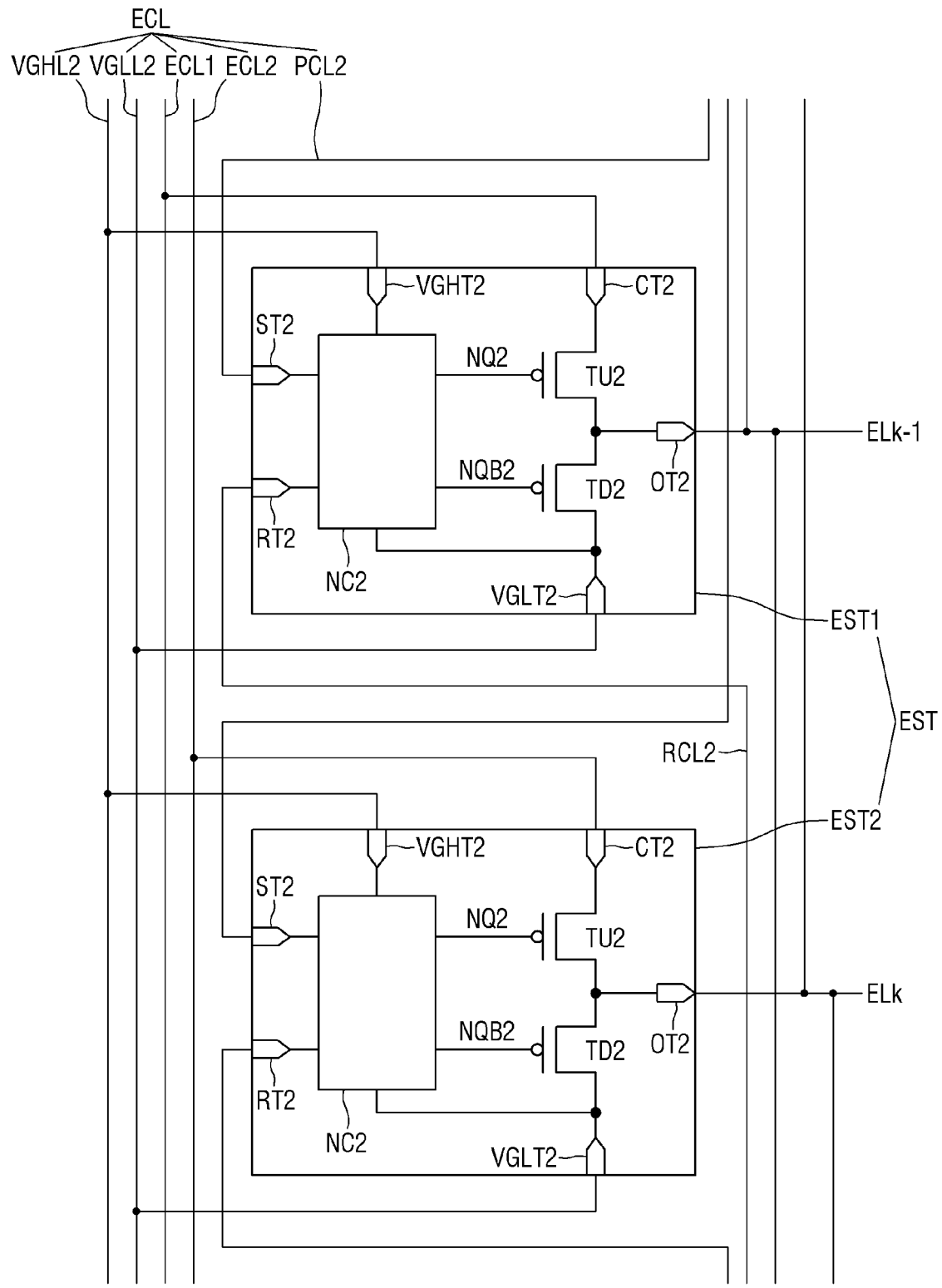
FIG. 7 is a diagram illustrating an example of a light-emitting stage of FIG. 4.

FIG. 7 is a circuit diagram illustrating an example of the light-emitting stage of FIG. 4.

Referring to FIG. 7, a light-emitting stage EST may include a first sub light-emitting stage EST1 and a second sub light-emitting stage EST2.

The first sub light-emitting stage EST1 and the second sub light-emitting stage EST2 may sequentially output light-emitting signals. For example, the first sub light-emitting stage EST1 may be connected to a $(k-1)^{th}$ light-emitting line ELk-1 to output a $(k-1)^{th}$ light-emitting signal. The second sub light-emitting stage EST2 may be connected to a $k^{th}$ light-emitting line ELk to output a $k^{th}$ light-emitting signal.

The first sub light-emitting stage EST1 and the second sub light-emitting stage EST2 may be connected to light-emitting control lines ECL. The light-emitting control lines ECL includes a second front-end carry line PCL2 to which an output signal of a front-end sub light-emitting stage is applied, light-emitting clock lines ECL1 and ECL2 to which light-emitting clock signals are applied, a second gate-on voltage line VGHL2, and a second gate-off voltage line VGLL2. Instead of the second front-end carry line PCL2, a first sub light-emitting stage may include an emitting start signal line to which an emitting start signal is applied as the light-emitting control lines ECL.

Each of the first sub light-emitting stage EST1 and the second sub light-emitting stage EST2 includes a second pull-up node NQ2, a second pull-down node NQB2, a second pull-up transistor TU2 which is turned on when the second pull-up node NQ2 has the second gate-on voltage, a second pull-down transistor TD2 which is turned on when the second pull-down node NQB2 has the second gate-on voltage, and a second node controller NC2 for controlling charging and discharging of the second pull-up node NQ2 and the second pull-down node NQB2, as illustrated in FIG. 7.

Since the first sub light-emitting stage EST1 and the second sub light-emitting stage EST2 receive the light-emitting start signal different from the scan start signal and the light-emitting clock signals different from the scan clock signals, the first sub light-emitting stage EST1 and the second sub light-emitting stage EST2 are difference from the first sub-scan stage SST1 and the second sub-scan stage SST2 described with reference to FIG. 6 in that the light-emitting signals different from the scan signals are output. Therefore, in FIG. 7, descriptions of the first sub light-emitting stage EST1 and the second sub light-emitting stage EST2 will be omitted.

FIG. 8A is a layout diagram illustrating an example of the first pixels of FIG. 4.

Referring to FIG. 8A, each of first pixels PX1 includes a first pixel driver PDU1 and a first pixel light-emitting device PEU1. The first pixel driver PDU1 may include first to fourth sub-pixel drivers SPDU1, SPDU2, SPDU3, and SPDU4, and the first pixel light-emitting device PEU1 may include first to fourth sub-pixel light-emitting devices SPEU1, SPEU2, SPEU3, and SPEU4. Each of the first to fourth sub-pixel drivers SPDU1, SPDU2, SPDU3, and SPDU4 may include the driving transistor DT, the first to sixth transistors ST1, ST2, ST3, ST4, ST5, and ST6, and the capacitor C1 of FIG. 5. Each of the first to fourth sub-pixel light-emitting devices SPEU1, SPEU2, SPEU3, and SPEU4 may include the light-emitting element LEL of FIG. 5.

Each of the first pixels PX1 may include first to fourth sub-pixels SP1, SP2, SP3, and SP4. The first to fourth sub-pixels SP1, SP2, SP3, and SP4 may be sequentially arranged in a first direction (an X-axis direction). The first sub-pixels SP1 and the third sub-pixels SP3 may be alternately disposed in a second direction (a Y-axis direction). The second sub-pixels SP2 and the fourth sub-pixels SP4 may be alternately disposed in the second direction (Y-axis direction).

The first sub-pixel SP1 may include a first sub-pixel light-emitting device SPEU1 which emits light of a first color and a first sub-pixel driver SPDU1 which applies a driving current or a driving voltage to the first sub-pixel light-emitting device SPEU1. The second sub-pixel SP2 may include a second sub-pixel light-emitting device SPEU2 which emits light of a second color and a second sub-pixel driver SPDU2 which applies a driving current or a driving voltage to the second sub-pixel light-emitting device SPEU2. The third sub-pixel SP3 may include a third sub-pixel light-emitting device SPEU3 which emits light of a third color and a third sub-pixel driver SPDU3 which applies a driving current or a driving voltage to the third sub-pixel light-emitting device SPEU3. The fourth sub-pixel SP4 may include a fourth sub-pixel light-emitting device SPEU4 which emits light of a fourth color and a fourth sub-pixel driver SPDU4 which applies a driving current or a driving voltage to the fourth sub-pixel light-emitting device SPEU4.

The first sub-pixel driver SPDU1 and the first sub-pixel light-emitting device SPEU1 may overlap each other in a third direction (a Z-axis direction). An area of the first sub-pixel driver SPDU1 may be greater than an area of the first sub-pixel light-emitting device SPEU1. The first sub-pixel driver SPDU1 may have a rectangular planar shape having a short side in the first direction (X-axis direction) and a long side in the second direction (Y-axis direction). The first sub-pixel light-emitting device SPEU1 may have a rectangular or rhombus planar shape having a side in a fourth direction DR4 and a side in a fifth direction DR5. The fourth direction DR4 and the fifth direction DR5 may be directions orthogonal to each other. The fourth direction DR4 may be a diagonal direction inclined by 45 degrees with respect to the first direction (X-axis direction).

The second sub-pixel driver SPDU2 and the second sub-pixel light-emitting device SPEU2 may overlap each other in the third direction (Z-axis direction). An area of the second sub-pixel driver SPDU2 may be greater than an area of the second sub-pixel light-emitting device SPEU2. The second sub-pixel driver SPDU2 may have a rectangular planar shape having a short side in the first direction (X-axis direction) and a long side in the second direction (Y-axis direction), and the second sub-pixel light-emitting device SPEU2 may have a rectangular planar shape having a short side in the fifth direction DR5 and a long side in the fourth direction DR4.

The third sub-pixel driver SPDU3 and the third sub-pixel light-emitting device SPEU3 may overlap each other in the third direction (Z-axis direction). An area of the third sub-pixel driver SPDU3 may be greater than an area of the third sub-pixel light-emitting device SPEU3. The third sub-pixel driver SPDU3 may have a rectangular planar shape having a short side in the first direction (X-axis direction) and a long side in the second direction (Y-axis direction). The third sub-pixel light-emitting device SPEU3 may have a rectangular or rhombus planar shape having a side in the fourth direction DR4 and a side in the fifth direction DR5.

The fourth sub-pixel driver SPDU4 and the fourth sub-pixel light-emitting device SPEU4 may overlap each other in the third direction (Z-axis direction). An area of the fourth sub-pixel driver SPDU4 may be greater than an area of the fourth sub-pixel light-emitting device SPEU4. The fourth sub-pixel driver SPDU4 may have a rectangular planar shape having a short side in the first direction (X-axis direction) and a long side in the second direction (Y-axis direction), and the fourth sub-pixel light-emitting device SPEU4 may have a rectangular planar shape having a long side in the fifth direction DR5 and a short side in the fourth direction DR4.

The area of the first sub-pixel light-emitting device SPEU3 may be the largest, and the area of the second sub-pixel light-emitting device SPEU2 and the area of the fourth sub-pixel light-emitting device SPEU4 may be the smallest. The area of the second sub-pixel light-emitting device SPEU2 may be substantially the same as the area of the fourth sub-pixel light-emitting device SPEU4.

The first to fourth sub-pixel light-emitting devices SPEU1, SPEU2, SPEU3, and SPEU4 may emit different colors. Alternatively, at least any two of the first to fourth sub-pixel light-emitting devices SPEU1, SPEU2, SPEU3, and SPEU4 may emit the same color. For example, the second sub-pixel light-emitting device SPEU2 and the fourth sub-pixel light-emitting device SPEU4 may emit the same color. In this case, the first color may be red, the second color and the fourth color may be green, and the third color may be blue.

FIG. 8B is a layout diagram illustrating another example of the first pixels of FIG. 4.

The example of FIG. 8B is different from the example of FIG. 8A in that each of first pixels PX1 includes three sub-pixels SP1, SP2, and SP3 and that each of first to third sub-pixel light-emitting devices SPEU1, SPEU2, and SPEU3 has a rectangular planar shape having a short side in the first direction (X-axis direction) and a long side in the second direction (Y-axis direction). In FIG. 8B, the difference from the example of FIG. 8A will be mainly described.

Referring to FIG. 8B, a first pixel driver PDU1 may include first to third sub-pixel drivers SPDU1, SPDU2, and SPDU3, and a first pixel light-emitting device PEU1 may include first to third pixel light-emitting devices SPEU1, SPEU2, and SPEU3. Each of the first to third sub-pixel drivers SPDU1, SPDU2, and SPDU3 may include the driving transistor DT, the first to sixth transistors ST1, ST2, ST3, ST4, ST5, and ST6, and the capacitor C1 of FIG. 5. Each of the first to third pixel light-emitting devices SPEU1, SPEU2, and SPEU3 may include the light-emitting element LEL of FIG. 5.

Each of the first pixels PX1 may include first to third sub-pixels SP1, SP2, and SP3. The first to third sub-pixels SP1, SP2, and SP3 may be sequentially arranged in the first direction (X-axis direction). The first sub-pixels SP1 may be disposed in the second direction (Y-axis direction). The second sub-pixels SP2 may be disposed in the second direction (Y-axis direction). The third sub-pixels SP3 may be disposed in the second direction (Y-axis direction).

Each of the first sub-pixel light-emitting device SPEU1, the second sub-pixel light-emitting device SPEU2, and the third sub-pixel light-emitting device SPEU3 may have a rectangular planar shape having a short side in the first direction (X-axis direction) and a long side in the second direction (Y-axis direction).

The first to third sub-pixel light-emitting devices SPEU1, SPEU2, and SPEU3 may emit light of different colors. In this case, the first color may be red, the second color may be green, and the third color may be blue.

FIG. 8C is a layout diagram illustrating still another example of the first pixels of FIG. 4.

The example of FIG. 8C is different from the example of FIG. 8A in that each of first pixels PX1 includes three sub-pixels SP1, SP2, and SP3, a first sub-pixel light-emitting device SPEU1 and a second sub-pixel light-emitting device SPEU2 have a rectangular planar shape having a long side in a first direction (an X-axis direction) and a short side in a second direction (a Y-axis direction) and that a third sub-pixel light-emitting device SPEU3 has a rectangular planar shape having a short side in the first direction (X-axis direction) and a long side in the second direction (Y-axis direction). In FIG. 8C, the difference from the example of FIG. 8A will be mainly described.

Referring to FIG. 8C, a first pixel driver PDU1 may include first to third sub-pixel drivers SPDU1, SPDU2, and SPDU3, and a first pixel light-emitting device PEU1 may include first to third pixel light-emitting devices SPEU1, SPEU2, and SPEU3. Each of the first to third sub-pixel drivers SPDU1, SPDU2, and SPDU3 may include the driving transistor DT, the first to sixth transistors ST1, ST2, ST3, ST4, ST5, and ST6, and the capacitor C1 of FIG. 5. Each of the first to third pixel light-emitting devices SPEU1, SPEU2, and SPEU3 may include the light-emitting element LEL of FIG. 5.

Each of the first pixels PX1 may include first to third sub-pixels SP1, SP2, and SP3. The first to third sub-pixel drivers SPDU1, SPDU2, and SPDU3 may be sequentially arranged in the first direction (X-axis direction). The first sub-pixel light-emitting device SPEU1 and the second sub-pixel light-emitting device SPEU2 may be alternately disposed in the second direction (Y-axis direction). The third sub-pixel light-emitting device SPEU3 may be disposed in the second direction (Y-axis direction). The third sub-pixel light-emitting device SPEU3 may be disposed between first sub-pixel light-emitting devices SPEU1 adjacent to each other in the first direction (X-axis direction) and between second sub-pixel light-emitting devices SPEU2 adjacent to each other in the first direction (X-axis direction).

The first sub-pixel light-emitting device SPEU1 may overlap the first sub-pixel driver SPDU1 and the second sub-pixel driver SPDU2 in a third direction (a Z-axis direction). The second sub-pixel light-emitting device SPEU2 may overlap the first sub-pixel driver SPDU1 and the second sub-pixel driver SPDU2 in the third direction (Z-axis direction). The third sub-pixel light-emitting device SPEU3 may overlap the third sub-pixel driver SPDU3 in the third direction (Z-axis direction).

Meanwhile, the first pixels PX1 are not limited to those in the examples of FIGS. 8A to 8C. For example, the first pixels PX1 may include sub-pixels having various structures or shapes other than those in the examples of FIGS. 8A to 8C.

Figure 9:
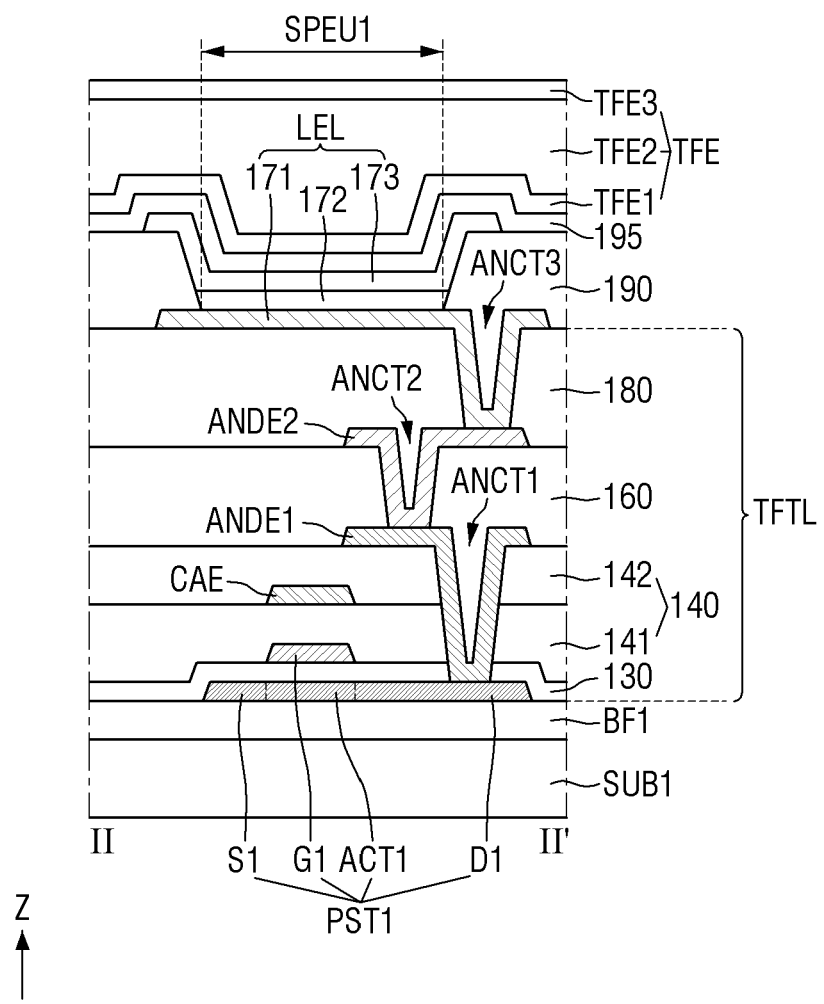
FIG. 9 is a cross-sectional view illustrating an example of a display panel taken along line II-IF of FIG. 8A.

FIG. 9 is a cross-sectional view illustrating an example of the display panel taken along line II-IF of FIG. 8A. In FIG. 9, a portion of the first sub-pixel driver SPDU1 and the first sub-pixel light-emitting device SPEU1 of the first sub-pixel SP1 are illustrated.

Referring to FIG. 9, a buffer film BF1 may be disposed on a substrate SUB1. The substrate SUB1 may be made of an insulating material such as a polymer resin or the like. For example, the substrate SUB1 may include polyimide. The substrate SUB1 may be a flexible substrate that is bendable, foldable, or rollable.

The buffer film BF1 is a film for protecting transistors of a thin film transistor layer TFTL and a light-emitting layer 172 of a light-emitting element layer EML from moisture passing through the substrate SUB1 vulnerable to moisture permeation. The buffer film BF1 may be formed of a plurality of alternately stacked inorganic films. For example, the buffer film BF1 may be formed of multiple films in which one or more inorganic films such as a silicon nitride layer, a silicon oxynitride layer, a silicon oxide layer, a titanium oxide layer, and an aluminum oxide layer, are alternately stacked.

A first pixel transistor PST1 of the first pixel PX1 may be disposed on the buffer film BF1. The first pixel transistor PST1 may include a first active layer ACT1, a first gate electrode G1, a first source electrode S1, and a first drain electrode D1. The first pixel transistor PST1 is illustrated as the driving transistor DT of FIG. 5 in which the fifth transistor ST5 which is connected between the driving transistor DT and the light-emitting element LEL is omitted, but embodiments of the present specification are not limited thereto.

The first active layer ACT1, the first source electrode S1, and the first drain electrode D1 of the first pixel transistor PST1 may be disposed on the buffer film BF1. The first active layer ACT1 of the first pixel transistor PST1 may include polycrystalline silicon, single crystal silicon, low-temperature polycrystalline silicon, amorphous silicon, or an oxide semiconductor. The first active layer ACT1 which overlaps the first gate electrode G1 in a third direction (a Z-axis direction), which is a thickness direction of the substrate SUB1, may be defined as a channel region. The first source S1 and the first drain D1 are regions that do not overlap the first gate electrode G1 in the third direction (Z-axis direction) and a silicon semiconductor or an oxide semiconductor are doped with ions or impurities so that the first source S1 and the first drain D1 may have conductivity.

A gate insulating film 130 may be disposed on the first active layer ACT, the first source S1, and the first drain D1 of the first pixel transistor PST1. The gate insulating film 130 may be formed of an inorganic film, for example, a silicon nitride layer, a silicon oxynitride layer, a silicon oxide layer, a titanium oxide layer, or an aluminum oxide layer. The first gate electrode G1 of the first pixel transistor PST1 may be disposed on the gate insulating film 130. The first gate electrode G1 may overlap the first active layer ACT1 in the third direction (Z-axis direction). The first gate electrode G1 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A first interlayer insulating film 141 may be disposed on the first gate electrode G1 of the first pixel transistor PST1. The first interlayer insulating film 141 may be formed of an inorganic film, for example, a silicon nitride layer, a silicon oxynitride layer, a silicon oxide layer, a titanium oxide layer, or an aluminum oxide layer. The first interlayer insulating film 141 may include a plurality of inorganic films.

A capacitor electrode CAE may be disposed on the first interlayer insulating film 141. The capacitor electrode CAE may overlap the first gate electrode G1 of the third first pixel transistor PST1 in the third direction (Z-axis direction). Since the first interlayer insulating film 141 has predetermined dielectric permittivity, a capacitor may be formed by the capacitor electrode CAE, the first gate electrode G1, and the first interlayer insulating film 141 disposed between the capacitor electrode CAE and the first gate electrode G1. The capacitor electrode CAE may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A second interlayer insulating film 142 may be disposed on the capacitor electrode CAE. The second interlayer insulating film 142 may be formed of an inorganic film, for example, a silicon nitride layer, a silicon oxynitride layer, a silicon oxide layer, a titanium oxide layer, or an aluminum oxide layer. The second interlayer insulating film 142 may include a plurality of inorganic films.

A first connection electrode ANDE1 may be disposed on the second interlayer insulating film 142. The first connection electrode ANDE1 may be connected to the first drain D1 of the first pixel transistor PST1 through a first connection contact hole ANCT1 passing through the gate insulating film 130, the first interlayer insulating film 141, and the second interlayer insulating film 142. The first connection electrode ANDE1 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A first planarization film 160 for planarizing steps caused by the first pixel transistor PST1 may be disposed on the first connection electrode ANDE1. The first planarization film 160 may be formed of an organic film such as an acrylic resin, an epoxy resin, a phenolic resin, a polyamide resin, a polyimide resin, or the like.

A second connection electrode ANDE2 may be disposed on the first planarization film 160. The second connection electrode ANDE2 may be connected to the first connection electrode ANDE1 through a second connection contact hole ANCT2 passing through the first planarization film 160. The second connection electrode ANDE2 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A second planarization film 180 may be disposed on the second connection electrode ANDE2. The second planarization film 180 may be formed of an organic film such as an acrylic resin, an epoxy resin, a phenolic resin, a polyamide resin, a polyimide resin, or the like.

Light-emitting elements LEL and a bank 190 may be disposed on the second planarization film 180. Each of the light-emitting elements LEL may include a first pixel electrode 171, a first light-emitting layer 172, and a common electrode 173.

The first pixel electrode 171 may be formed on the second planarization film 180. The first pixel electrode 171 may be connected to the second anode connection electrode ANDE2 through a third connection contact hole ANCT3 passing through the second planarization film 180.

In a top emission structure in which light is emitted through the common electrode 173, the first pixel electrode 171 may be formed of a metal material having high reflectivity, such as a structure (Ti/Al/Ti) in which aluminum and titanium are stacked, a structure (ITO/Al/ITO) in which aluminum and indium tin oxide (ITO) are stacked, an APC alloy, and a structure (ITO/APC/ITO) in which an APC alloy and ITO are stacked. The APC alloy is an alloy of silver (Ag), palladium (Pd), and copper (Cu).

The bank 190 may be formed to partition the first pixel electrode 171 on the second planarization film 180 in order to define light-emitting areas of sub-pixel light-emitting devices SPEU1, SPEU2, SPEU3, and SPEU4. The bank 190 may be formed to cover an edge of the first pixel electrode 171. The bank 190 may be formed of an organic film such as an acrylic resin, an epoxy resin, a phenolic resin, a polyamide resin, or a polyimide resin.

Each of the sub-pixel light-emitting devices SPEU1, SPEU2, SPEU3, and SPEU4 refers to a region in which the first pixel electrode 171, the first light-emitting layer 172, and the common electrode 173 are sequentially stacked so that holes from the first pixel electrode 171 and electrons from the common electrode 173 are combined in the first light-emitting layer 172, thereby emitting light.

In FIG. 9, for convenience of description, only the first sub-pixel light-emitting device SPEU1 is illustrated. A second sub-pixel light-emitting device SPEU2, a third sub-pixel light-emitting device SPEU3, and a fourth sub-pixel light-emitting device SPEU4 may be substantially the same as the first sub-pixel light-emitting device SPEU1 described with reference to FIG. 9.

The first light-emitting layer 172 is formed on the first pixel electrode 171 and the bank 190. The first light-emitting layer 172 may include an organic material and emit light of a predetermined color. For example, the first light-emitting layer 172 may include a hole transporting layer, an organic material layer, and an electron transporting layer.

The common electrode 173 is formed on the first light-emitting layer 172. The common electrode 173 may be formed to cover the first light-emitting layer 172. The common electrode 173 may be a common layer commonly formed in the sub-pixel light-emitting devices SPEU1, SPEU2, SPEU3, and SPEU4. A capping layer 195 may be formed on the common electrode 173.

In the top emission structure, the common electrode 173 may be formed of a transparent conductive metal material (TCO) such as ITO or indium zinc oxide (IZO) through which light may pass, or a semi-transmissive conductive metal material such as magnesium (Mg), silver (Ag), or an alloy of magnesium (Mg) and silver (Ag). When the common electrode 173 is formed of a semi-transmissive conductive metal material, light emission efficiency may be increased due to a micro cavity.

An encapsulation layer TFE may be disposed on the common electrode 173. The encapsulation layer TFE may include at least one inorganic film to prevent oxygen or moisture from penetrating into the light-emitting element layer EML. Further, the encapsulation layer TFE may include at least one organic film to protect the light-emitting element layer EML from foreign matter such as dust. For example, the encapsulation layer TFE may include a first encapsulation inorganic film TFE1, an encapsulation organic film TFE2, and a second encapsulation inorganic film TFE3.

The first encapsulation inorganic film TFE1 may be disposed on the common electrode 173 on the capping layer 195, the encapsulation organic film TFE2 may be disposed on the first encapsulation inorganic film TFE1, and the second encapsulation inorganic film TFE3 may be disposed on the encapsulation organic film TFE2. The first encapsulation inorganic film TFE1 and the second encapsulation inorganic film TFE3 may be formed of multiple films in which one or more inorganic films such as a silicon nitride layer, a silicon oxynitride layer, a silicon oxide layer, a titanium oxide layer, and an aluminum oxide layer are alternately stacked. The encapsulation organic film TFE2 may be an organic film such as an acrylic resin, an epoxy resin, a phenolic resin, a polyamide resin, a polyimide resin, or the like.

FIG. 10 is a diagram illustrating an example of the second display region of FIG. 4 in detail.

In FIG. 10, for convenience of description, light-emitting control lines ECL and scan control lines SCL are omitted.

Referring to FIG. 10, each of second pixels PX2 includes a second pixel driver PDU2 and a second pixel light-emitting device PEU2. The second pixel driver PDU2 and the second pixel light-emitting device PEU2 may be disposed to be spaced apart from each other not to overlap each other in a plan view. The second pixel driver PDU2 may include first to third sub-pixel drivers SPDU1', SPDU2', and SPDU3', and the second pixel light-emitting device PEU2 may include first to third sub-pixel light-emitting devices SPEU1', SPEU2', and SPEU3'. Each of the first to third sub-pixel drivers SPDU1', SPDU2', and SPDU3' may include the driving transistor DT, the first to sixth transistors ST1, ST2, ST3, ST4, ST5, and ST6, and the capacitor C1 of FIG. 5. Each of the first to third sub-pixel light-emitting devices SPEU1', SPEU2', and SPEU3' may include the light-emitting element LEL of FIG. 5.

Each of the second pixels PX2 may include first to third sub-pixels SP1 SP2', and SP3'. The first sub-pixel SP1' may include a first sub-pixel light-emitting device SPEU1' which emits light of a first color and a first sub-pixel driver SPDU1' which applies a driving current or a driving voltage to the first sub-pixel light-emitting device SPEU1'. The second sub-pixel SP2' may include a second sub-pixel light-emitting device SPEU2' which emits light of a second color and a second sub-pixel driver SPDU2' which applies a driving current or a driving voltage to the second sub-pixel light-emitting device SPEU2'. The third sub-pixel SP3' may include a third sub-pixel light-emitting device SPEU3' which emits light of a third color and a third sub-pixel driver SPDU3' which applies a driving current or a driving voltage to the third sub-pixel light-emitting device SPEU3'. The first color may be red, the second color may be green, and the third color may be blue.

The first sub-pixel driver SPDU1' and the first sub-pixel light-emitting device SPEU1' may be disposed to be spaced apart from each other not to overlap each other in a plan view. The first sub-pixel driver SPDU1' and the first sub-pixel light-emitting device SPEU1' may be connected by a first connection line CL1.

One end of the first connection line CL1 may be connected to the first sub-pixel driver SPDU1' and the other end may be connected to the first sub-pixel light-emitting device SPEU1'. The first sub-pixel driver SPDU1' may have a rectangular or square planar shape having a short side in a first direction (an X-axis direction) and a long side in a second direction (a Y-axis direction). The first sub-pixel light-emitting unit SPEU1' may have a rectangular or square planar shape having a long side in the first direction (X-axis direction) and a short side in the second direction (Y-axis direction).

The second sub-pixel driver SPDU2' and the second sub-pixel light-emitting device SPEU2' may be disposed to be spaced apart from each other not to overlap each other in a plan view. The second sub-pixel driver SPDU2' and the second sub-pixel light-emitting device SPEU2' may be connected by a second connection line CL2. One end of the second connection line CL2 may be connected to the second sub-pixel driver SPDU2' and the other end may be connected to the second sub-pixel light-emitting device SPEU2'. The second sub-pixel driver SPDU2' may have a rectangular or square planar shape having a short side in the first direction (X-axis direction) and a long side in the second direction (Y-axis direction). The second sub-pixel light-emitting device SPEU2' may have a rectangular or square planar shape having a long side in the first direction (X-axis direction) and a short side in the second direction (Y-axis direction).

The third sub-pixel driver SPDU3' and the third sub-pixel light-emitting device SPEU3' may be disposed to be spaced apart from each other not to overlap each other in a plan view. The third sub-pixel driver SPDU3' and the third sub-pixel light-emitting device SPEU3' may be connected by a third connection line CL3. One end of the third connection line CL3 may be connected to the third sub-pixel driver SPDU3' and the other end may be connected to the third sub-pixel light-emitting device SPEU3'. The third sub-pixel driver SPDU3' may have a rectangular or square planar shape having a short side in the first direction (X-axis direction) and a long side in the second direction (Y-axis direction). The third sub-pixel light-emitting device SPEU3' may have a rectangular or square planar shape having a short side in the first direction (X-axis direction) and a long side in the second direction (Y-axis direction).

The first sub-pixel light-emitting device SPEU1' and the second sub-pixel light-emitting device SPEU2' may be disposed in the second direction (Y-axis direction). The first sub-pixel light-emitting device SPEU1' and the third sub-pixel light-emitting device SPEU3' may be disposed in the first direction (X-axis direction). The second sub-pixel light-emitting device SPEU2' and the third sub-pixel light-emitting device SPEU3' may be disposed in the first direction (X-axis direction). A length of the third sub-pixel light-emitting device SPEU3' in the second direction (Y-axis direction) may be greater than a sum of a length of the first sub-pixel light-emitting device SPEU1' in the second direction (Y-axis direction) and a length of the second sub-pixel light-emitting device SPEU2' in the second direction (Y-axis direction).

At least one of the first sub-pixel light-emitting device SPEU1', the second sub-pixel light-emitting device SPEU2', and the third sub-pixel light-emitting device SPEU3' of the second pixel light-emitting device PEU2 may overlap any one of the light-emitting control lines ECL in the third direction (Z-axis direction). For example, the first sub-pixel light-emitting device SPEU1' and the second sub-pixel light-emitting device SPEU2' of the second pixel light-emitting device PEU2 may overlap any one of the light-emitting control lines ECL in the third direction (Z-axis direction) (See FIG. 11).

At least one of the first sub-pixel light-emitting device SPEU1', the second sub-pixel light-emitting device SPEU2', and the third sub-pixel light-emitting device SPEU3' of the second pixel light-emitting device PEU2 may overlap the light-emitting stage EST in the third direction (Z-axis direction). For example, the third sub-pixel light-emitting device SPEU3' of the second pixel light-emitting device PEU2 may overlap the light-emitting stage EST in the third direction (Z-axis direction).

Figure 11:
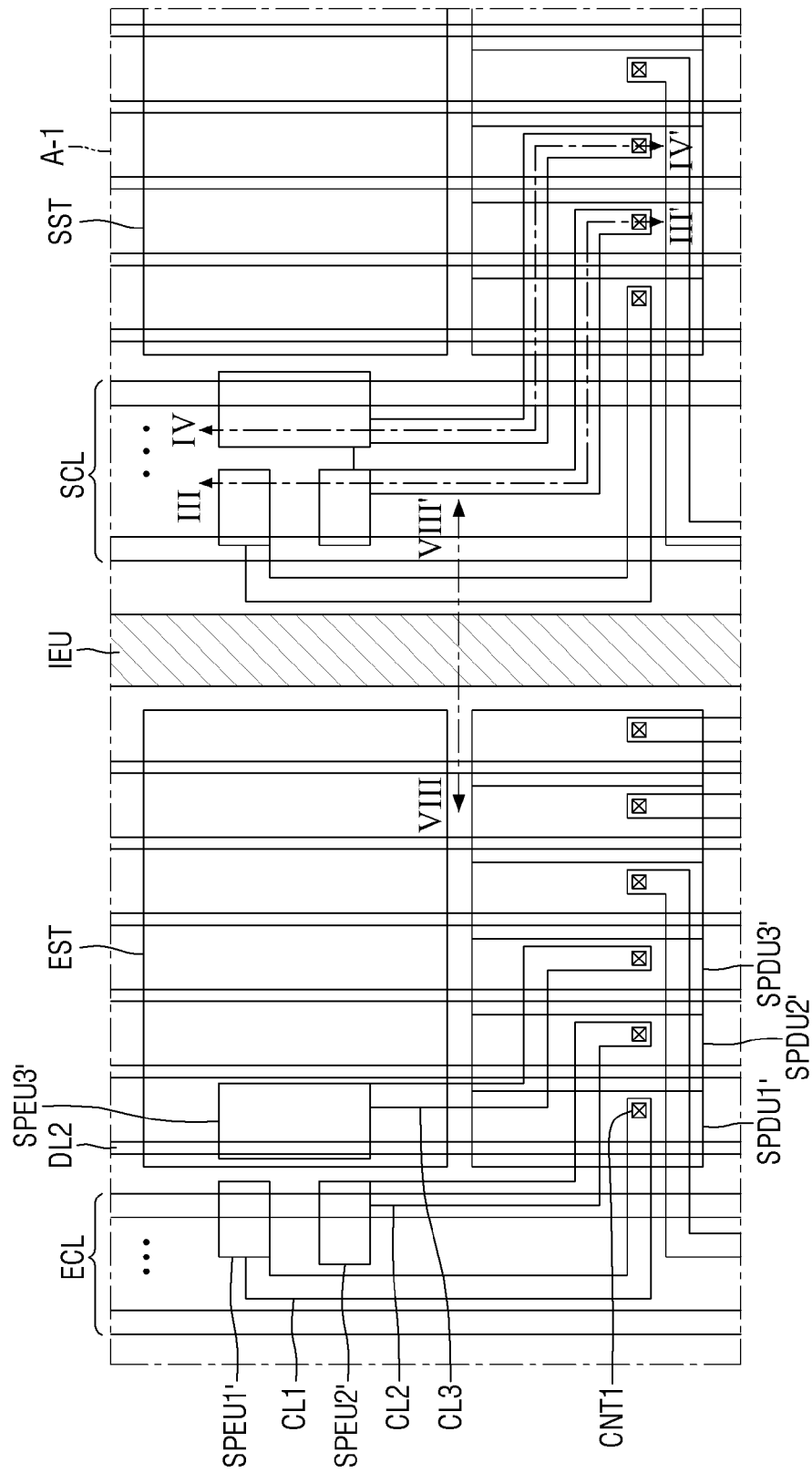
FIG. 11 is a layout diagram illustrating an example of second pixel drivers and second pixel light-emitting devices of second pixels in a second display region of FIG. 10 in detail.

At least one of the first sub-pixel light-emitting device SPEU1', the second sub-pixel light-emitting device SPEU2', and the third sub-pixel light-emitting device SPEU3' of the second pixel light-emitting device PEU2 may overlap any one of the scan control lines SCL in the third direction (Z-axis direction) as illustrated in FIG. 11. For example, each of the first sub-pixel light-emitting device SPEU1', the second sub-pixel light-emitting device SPEU2', and the third sub-pixel light-emitting device SPEU3' of the second pixel light-emitting device PEU2 may overlap any one of the scan control lines SCL in the third direction (Z-axis direction) as illustrated in FIG. 11. In this case, the first sub-pixel light-emitting device SPEU1' and the second sub-pixel light-emitting device SPEU2' may overlap the same scan control line SCL in the third direction (Z-axis direction). Further, the first sub-pixel light-emitting device SPEU1' and the third sub-pixel light-emitting device SPEU3' may overlap different scan control lines SCL in the third direction (Z-axis direction). Further, the second sub-pixel light-emitting device SPEU2' and the third sub-pixel light-emitting device SPEU3' may overlap different scan control lines in the third direction (Z-axis direction)

At least one of the first sub-pixel light-emitting device SPEU1', the second sub-pixel light-emitting device SPEU2', and the third sub-pixel light-emitting device SPEU3' of the second pixel light-emitting device PEU2 may overlap the scan stage SST in the third direction (Z-axis direction). For example, the first sub-pixel light-emitting device SPEU1', the second sub-pixel light-emitting device SPEU2', and the third sub-pixel light-emitting device SPEU3' of the second pixel light-emitting device PEU2 may overlap the scan stage SST in the third direction (Z-axis direction).

The first sub-pixel light-emitting device SPEU1', the second sub-pixel light-emitting device SPEU2', and the third sub-pixel light-emitting device SPEU3' of the second pixel light-emitting device PEU2 may not overlap the scan control lines SCL, the scan stage SST, the light-emitting control lines ECL, and the light-emitting stage EST in the third direction (Z-axis direction).

An inorganic encapsulation portion IEU may be disposed between the scan stage SST and the light-emitting stage EST in the first direction (X-axis direction). The inorganic encapsulation portion IEU may extend in the second direction (Y-axis direction) in a first side portion SS1. Since the inorganic encapsulation portion IEU includes only inorganic films, it is possible to block the movement of moisture and oxygen of the first planarization film 160 and the second planarization film 180. For example, as illustrated in FIG. 13B, it is possible to block the movement of the moisture and oxygen through the first planarization film 160 and the second planarization film 180 which are disposed on light-emitting transistors of the light-emitting stage EST to the first planarization film 160 and the second planarization film 180 which are disposed on scan transistors SCT (see FIG. 12) of the scan stage SST. Therefore, it is possible to prevent the first pixels PX1 of the first display region DA1 and the second pixels PX2 of the second display region DA2 from being oxidized due to the moisture and oxygen through the first planarization film 160 and the second planarization film 180 disposed on the light-emitting transistors of the light-emitting stage EST by the inorganic encapsulation portion IEU as illustrated in FIG. 13B.

As illustrated in FIG. 10, the first to third sub-pixel drivers SPDU1', SPDU2', and SPDU3' of the second pixel driver PDU2 and the first to third sub-pixel light-emitting devices SPEU1', SPEU2', and SPEU3' of the second pixel light-emitting device PEU2 may be disposed to be spaced apart from each other not to overlap each other in a plan view but may be connected by first to third connection lines CL1, CL2, and CL3. In particular, the first to third sub-pixel drivers SPDU1', SPDU2', and SPDU3' of the second pixel driver PDU2 may be disposed between scan stages SST adjacent to each other in the second direction (Y-axis direction) or between light-emitting stages EST adjacent to each other in the second direction (Y-axis direction). In this case, the first to third sub-pixel light-emitting devices SPEU1', SPEU2', and SPEU3' of the second pixel light-emitting device PEU2 may be disposed on any one of the adjacent scan stages SST in the second direction (Y-axis direction) or on any one of the adjacent light-emitting stages EST in the second direction (Y-axis direction). Accordingly, for each second pixel PX2, a difference in distance between the second pixel driver PDU2 and the second pixel light-emitting device PEU2 may be minimized. Therefore, it is possible to minimize or prevent a grayscale difference or a luminance difference from being generated between the second pixel light-emitting devices PEU2 due to a difference in length of the connection lines.

In FIG. 10, the sub-pixel light-emitting devices SPEU1', SPEU2', and SPEU3' of the second pixels PX2 are illustrated as having a structure or shape similar to that of the sub-pixel light-emitting devices SPEU1, SPEU2, and SPEU3 of the first pixels PX1 of FIG. 8C, but embodiments of the present specification are not limited thereto. For example, the sub-pixel light-emitting devices of the second pixels PX2 may have a structure or shape similar to that of the examples of FIGS. 8A and 8B. Alternatively, the sub-pixel light-emitting devices of the second pixels PX2 may include sub-pixel light-emitting devices having various structures or shapes instead of those illustrated in the examples of FIGS. 8A to 8C.

FIG. 11 is a layout diagram illustrating an example of the second pixel drivers and the second pixel light-emitting devices of the second pixels in the second display region of FIG. 10 in detail. FIG. 11 is a layout diagram illustrating region A-1 of FIG. 10 in detail.

Referring to FIG. 11, the second data lines DL2 may extend in the second direction (Y-axis direction). The second data lines DL2 may be defined as data lines disposed in the second display region DA2. The second data lines DL2 may be electrically connected to the display driving circuit 200. Accordingly, the second data lines DL2 may receive data voltages from the display driving circuit 200.

Each of the second data lines DL2 may overlap any one of the first to third sub-pixel drivers SPDU1', SPDU2', and SPDU3' in the third direction (Z-axis direction). Each of the second data lines DL2 may be electrically connected to any one of the first to third sub-pixel drivers SPDU1', SPDU2', and SPDU3'.

The second data line DL2 may overlap the light-emitting stage EST in the third direction (Z-axis direction). Alternatively, the second data line DL2 may overlap at least one of the first to third sub-pixel light-emitting devices SPEU1', SPEU2', and SPEU3' of the second pixel PX2 in the third direction (Z-axis direction).

The first connection line CL1 connects the first sub-pixel driver SPDU1' and the first sub-pixel light-emitting device SPEU1' of the second pixel PX2. One end of the first connection line CL1 may be connected to the first sub-pixel driver SPDU1' through one of a plurality of first contact holes CNT1. The other end of the first connection line CL1 may be directly connected to a second pixel electrode 171' (not shown) of the first sub-pixel light-emitting device SPEU1'. That is, the first connection line CL1 may be disposed on the same layer as the second pixel electrode 171' (not shown) of the first sub-pixel light-emitting device SPEU1' and may be formed of the same material as the second pixel electrode 171'.

The first connection line CL1 may overlap at least one second data line DL2 and at least one of the light-emitting control lines ECL in the third direction (Z-axis direction). Alternatively, the first connection line CL1 may overlap at least one second data line DL2 and at least one of the scan control lines SCL in the third direction (Z-axis direction).

The second connection line CL2 connects the second sub-pixel driver SPDU2' and the second sub-pixel light-emitting device SPEU2' of the second pixel PX2. One end of the second connection line CL2 may be connected to the second sub-pixel driver SPDU2' through one of the plurality of first contact holes CNT1. The other end of the second connection line CL2 may be directly connected to the second pixel electrode 171' (see FIG. 12) of the second sub-pixel light-emitting device SPEU2'. That is, the second connection line CL2 may be disposed on the same layer as the second pixel electrode 171' (see FIG. 12) of the second sub-pixel light-emitting device SPEU2' and may be formed of the same material as the second pixel electrode 171'.

The second connection line CL2 may overlap at least one second data line DL2 and at least one of the light-emitting control lines ECL in the third direction (Z-axis direction). Alternatively, the second connection line CL2 may overlap at least one second data line DL2 and at least one of the scan control lines SCL in the third direction (Z-axis direction).

The third connection line CL3 connects the third sub-pixel driver SPDU3' and the third sub-pixel light-emitting device SPEU3' of the third pixel PX3. One end of the third connection line CL3 may be connected to the third sub-pixel driver SPDU3' through one of the plurality of first contact holes CNT1. The other end of the third connection line CL3 may be directly connected to the second pixel electrode 171' (see FIG. 13) of the third sub-pixel light-emitting device SPEU3'. That is, the third connection line CL3 may be disposed on the same layer as the second pixel electrode 171' (see FIG. 13) of the third sub-pixel light-emitting device SPEU3' and may be formed of the same material as the second pixel electrode 171'.

The third connection line CL3 may overlap at least one second data line DL2 and the light-emitting stage EST in the third direction (Z-axis direction). Alternatively, the third connection line CL2 may overlap at least one second data line DL2 and the scan stage SST in the third direction (Z-axis direction).

Figure 12:
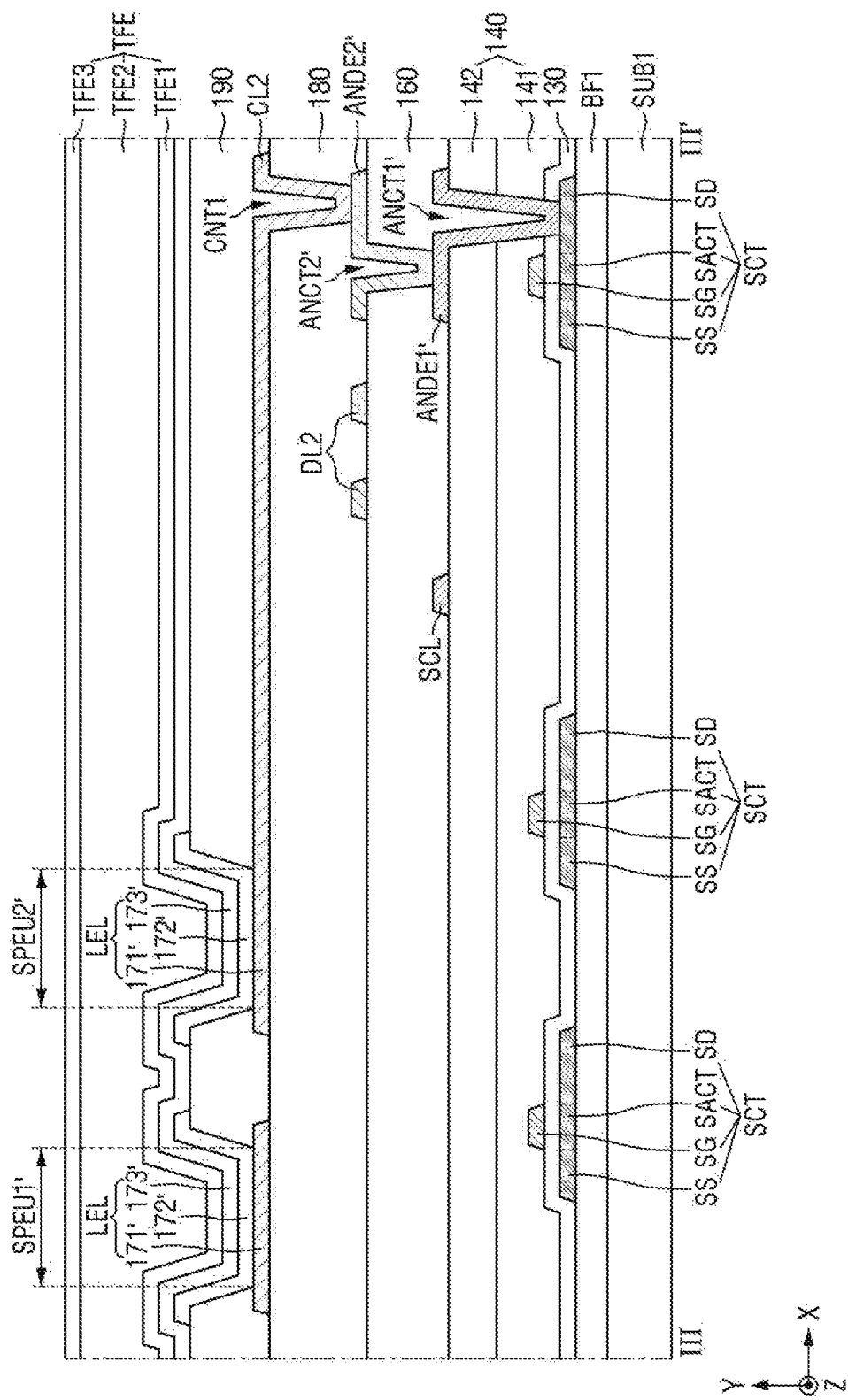
FIG. 12 is a cross-sectional view illustrating an example of the display panel taken along line III-III' of FIG. 11.
Figure 13A:
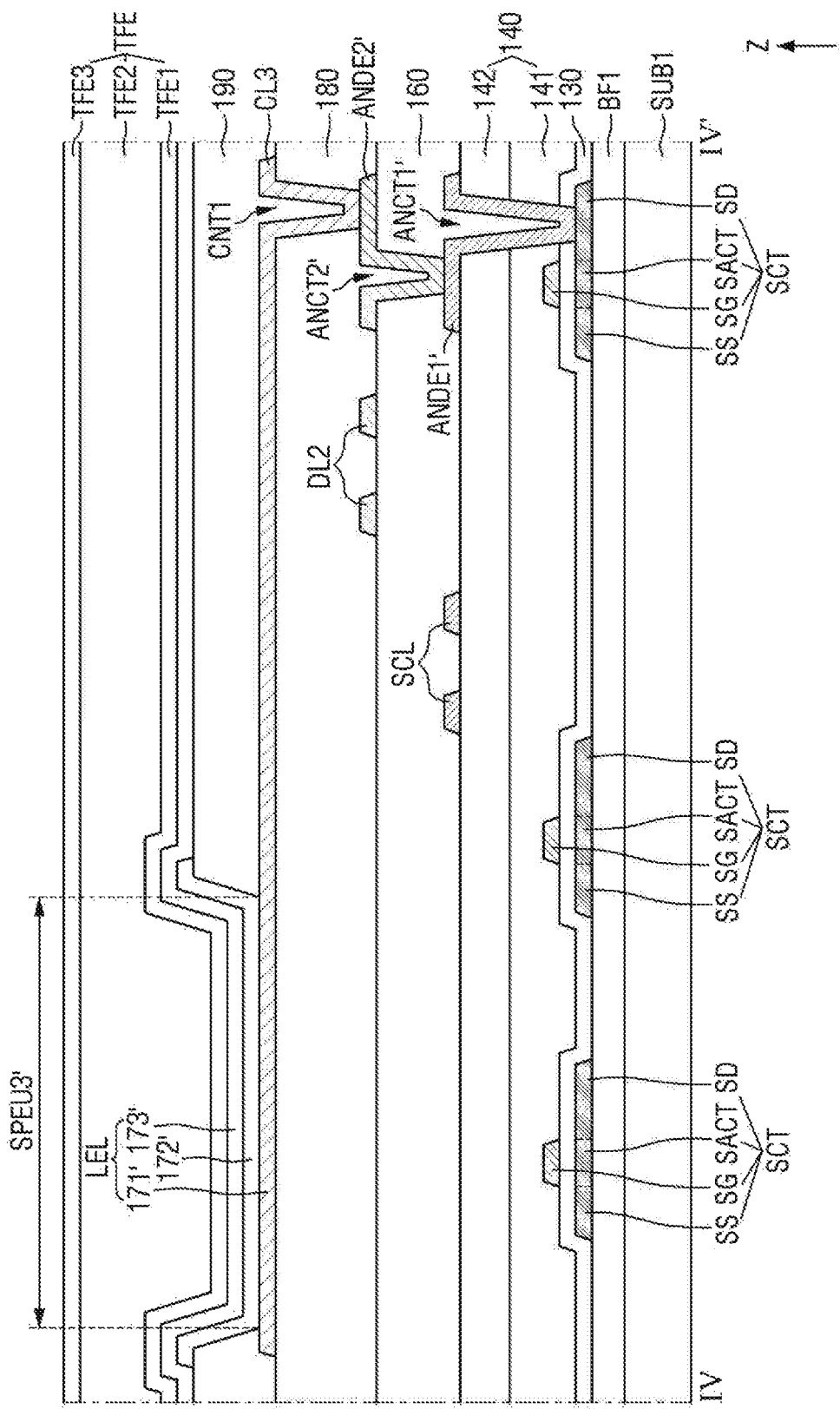
FIG. 13A is a cross-sectional view illustrating an example of the display panel taken along line IV-IV' of FIG. 11.
Figure 13B:
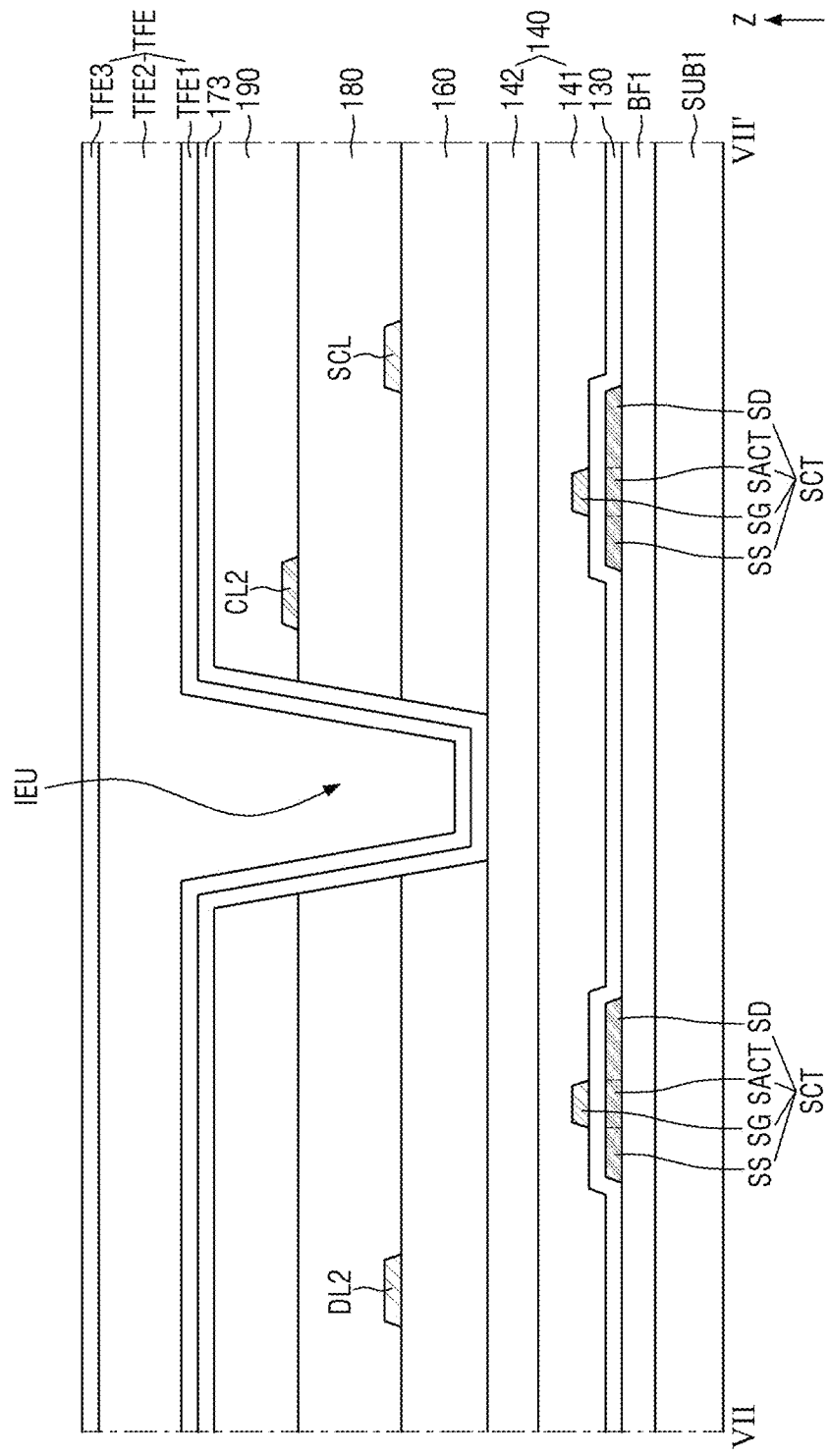
FIG. 13B is a cross-sectional view illustrating an example of the display panel taken along line VIII-VIII' of FIG. 11.

FIG. 12 is a cross-sectional view illustrating an example of the display panel taken along line III-III' of FIG. 11. FIG. 13A is a cross-sectional view illustrating an example of the display panel taken along line IV-IV' of FIG. 11.

Referring to FIGS. 12 and 13A, a second pixel transistor PST2 of the second pixel PX2 may be disposed on the buffer film BF1. Further, the scan transistors SCT of the scan stage SST (see FIG. 11) and the light-emitting transistors of the light-emitting stage EST (see FIG. 11) may be disposed on the buffer film BF1. The second pixel transistor PST2 may be the driving transistor DT of FIG. 5 in which the fifth transistor ST5 which is connected between the driving transistor DT and the light-emitting element LEL is omitted, but embodiments of the present specification are not limited thereto. Each of the scan transistors SCT may be any one of the first pull-up transistor TU1, the first pull-down transistor TD1, and the transistors of the first node controller NC1 of FIG. 6. Each of the light-emitting transistors may be any one of the second pull-up transistor TU2, the second pull-down transistor TD2, and the transistors of the second node controller NC2 of FIG. 7.

The second pixel transistor PST2 may include a second active layer ACT2, a second gate electrode G2, a second source S2, and a second drain D2. Each of the scan transistors SCT may include a scan active layer SACT, a scan gate electrode SG, a scan source SS, and a scan drain SD.

The second active layer ACT2, the second source S2, and the second drain D2 may be disposed on the buffer film BF1. Further, the scan active layer SACT, the scan source SS, and the scan drain SD may be disposed on the buffer film BF1.

The second active layer ACT2, the second source S2, the second electrode D2, the scan active layer SACT, the scan source SS, and the scan drain SD may be disposed on the same layer as the first active layer ACT1, the first source S1, and the first drain D1 and may be formed of the same material as the first active layer ACT1, the first source S1, and the first drain D1.

The second active layer ACT2 overlapping the second gate electrode G2 in the third direction (Z-axis direction) may be defined as a channel region. The second source S2 and the second drain D2 are regions that do not overlap the second gate electrode G2 in the third direction (Z-axis direction) and a silicon semiconductor or an oxide semiconductor are doped with ions or impurities so that the second source S2 and the second drain D2 may have conductivity.

The scan active layer SACT overlapping the scan gate electrode SG in the third direction (Z-axis direction) may be defined as a channel region. The scan source SS and the scan drain SD are regions that do not overlap the scan gate electrode SG in the third direction (Z-axis direction) and a silicon semiconductor or an oxide semiconductor are doped with ions or impurities so that the scan source SS and the scan drain SD may have conductivity. The second gate electrode G2 of the second pixel transistor PST2 and the scan gate electrode SG of the scan transistor SCT may be disposed on the gate insulating film 130. The second gate electrode G2 and the scan gate electrode SG may be disposed on the same layer as the first gate electrode G1 and may be formed of the same material as the first gate electrode G1.

A first connection electrode ANDE1' may be disposed on the second interlayer insulating film 142. The first connection electrode ANDE1' may be connected to the second drain D2 of the second pixel transistor PST2 through a first connection contact hole ANCT1' passing through the gate insulating film 130, the first interlayer insulating film 141, and the second interlayer insulating film 142. The first connection electrode ANDE1' may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The second data lines DL2 and a second connection electrode ANDE2' may be disposed on the first planarization film 160. The second connection electrode ANDE2' may be connected to the first connection electrode ANDE1' through a second connection contact hole ANCT2' passing through the first planarization film 160. The second data lines DL2 and the second connection electrode ANDE2' may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

Since the second pixel electrode 171', the second light-emitting layer 172', and the common electrode 173' are substantially the same as the first pixel electrode 171, the first light-emitting layer 172, and the common electrode 173 described with reference to FIG. 9, descriptions thereof will be omitted.

The first connection line CL1 (not shown), the second connection line CL2, and the third connection line CL3 may be disposed on the second planarization film 180. The first connection line CL1, the second connection line CL2, and the third connection line CL3 may be disposed on the same layer as the first pixel electrode 171 and the second pixel electrode 171' and may be formed of the same material as the first pixel electrode 171 and the second pixel electrode 171'.

Each of the first connection line CL1, the second connection line CL2, and the third connection line CL3 may be connected to the corresponding second connection electrode ANDE2 through the first contact hole CNT1 formed through the second planarization film 180. Each of the first connection line CL1, the second connection line CL2, and the third connection line CL3 may be directly connected to the second pixel electrode 171'.

Each of the first connection line CL1, the second connection line CL2, and the third connection line CL3 may overlap at least one second data line DL2 in the third direction (Z-axis direction). Each of the first connection line CL1, the second connection line CL2, and the third connection line CL3 may overlap at least one of the scan control lines SCL in the third direction (Z-axis direction). Alternatively, each of the first connection line CL1, the second connection line CL2, and the third connection line CL3 may overlap at least one of the light-emitting control lines ECL in the third direction (Z-axis direction).

As illustrated in FIGS. 12 and 13A, the second data lines DL2 may be disposed on the same layer as the second connection electrode ANDE2' and may be formed of the same material as the second connection electrode ANDE2', and the first connection line CL1, the second connection line CL2, and the third connection line CL3 may be disposed on the same layer as the first pixel electrode 171 and the second pixel electrode 171' and may be formed of the same material as the first pixel electrode 171 and the second pixel electrode 171'. Accordingly, when forming the second data lines DL2, the first connection line CL1, the second connection line CL2, and the third connection line CL3 any additional process may not be needed.

Figure 14:
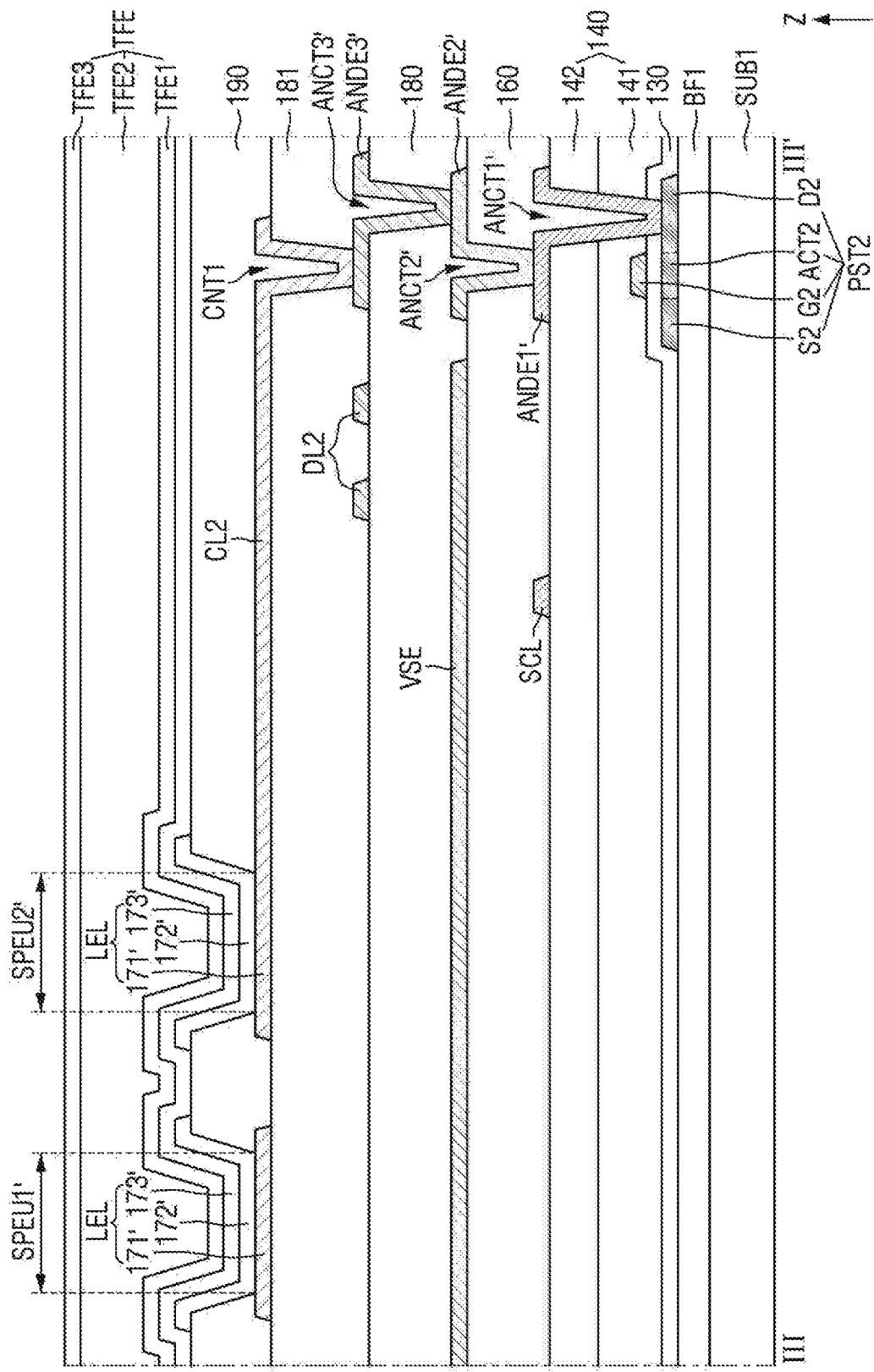
FIG. 14 is a cross-sectional view illustrating another example of the display panel taken along line III-III' of FIG. 11.
Figure 15:
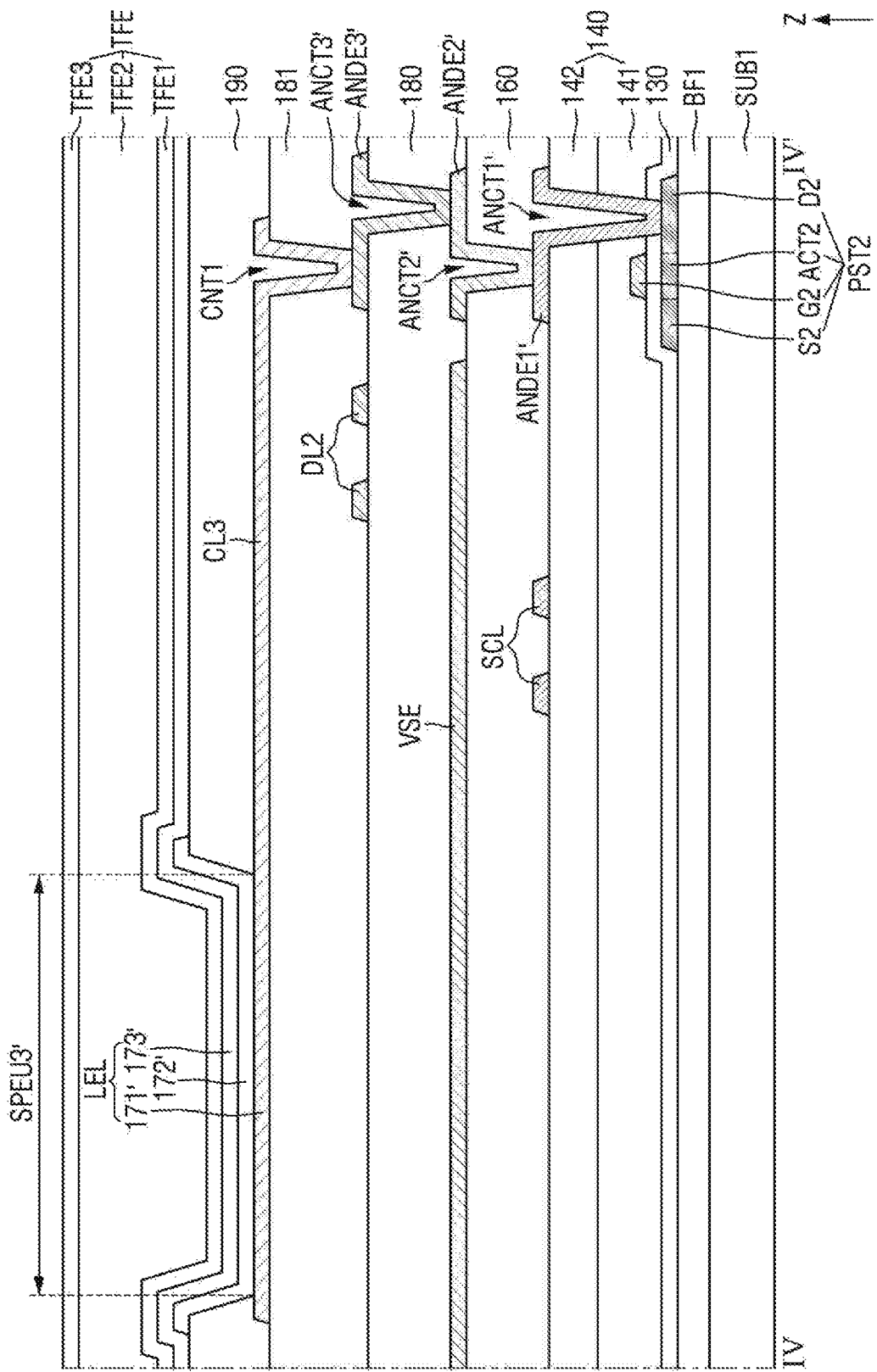
FIG. 15 is a cross-sectional view illustrating another example of the display panel taken along line IV-IV' of FIG. 11.

FIG. 14 is a cross-sectional view illustrating another example of the display panel taken along line III-III' of FIG. 11. FIG. 15 is a cross-sectional view illustrating still another example of the display panel taken along line IV-IV' of FIG. 11.

The examples disclosed in FIGS. 14 and 15 may be different from the examples of FIGS. 12 and 13A in that a third connection electrode ANDE3' is additionally disposed on the second planarization film 180, that a third planarization film 181 is disposed on the third connection electrode ANDE3', and that the first to third connection lines CL1, CL2, and CL3 are disposed on the third planarization film 181. In FIGS. 14 and 15, the difference from the examples of FIGS. 12 and 13A will be mainly described.

Referring to FIGS. 14 and 15, a shielding electrode VSE may be disposed on the first planarization film 160. The shielding electrode VSE may be disposed on the same layer as the second connection electrode ANDE2' and may be formed of the same material as the second connection electrode ANDE2'. The shielding electrode VSE may be electrically connected to the first power line VSL (see FIG. 4). Therefore, a first power voltage may be applied to the shielding electrode VSE.

The second data lines DL2 and the third connection electrode ANDE3' may be disposed on the second planarization film 180. The third connection electrode ANDE3' may be connected to the second connection electrode ANDE2' through a third connection contact hole ANCT3' formed through the second planarization film 180. The second data lines DL2 and the third connection electrode ANDE3' may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The third planarization film 181 may be disposed on the second data lines DL2 and the third connection electrode ANDE3'. The third planarization film 181 may be formed of an organic film such as an acrylic resin, an epoxy resin, a phenolic resin, a polyamide resin, a polyimide resin, or the like. The second pixel electrode 171' and the first to third connection lines CL1, CL2, and CL3 may be disposed on the third planarization film 181.

As illustrated in FIGS. 14 and 15, since the shielding electrode VSE is disposed on the first planarization film 160, the shielding electrode VSE may be disposed between the second data lines DL2 disposed on the second planarization film 180 and the scan control lines SCL disposed on the second interlayer insulating film 142. Therefore, it is possible to prevent the second data lines DL2 and the scan control lines SCL from being affected by each other due to the shielding electrode VSE.

Figure 16:
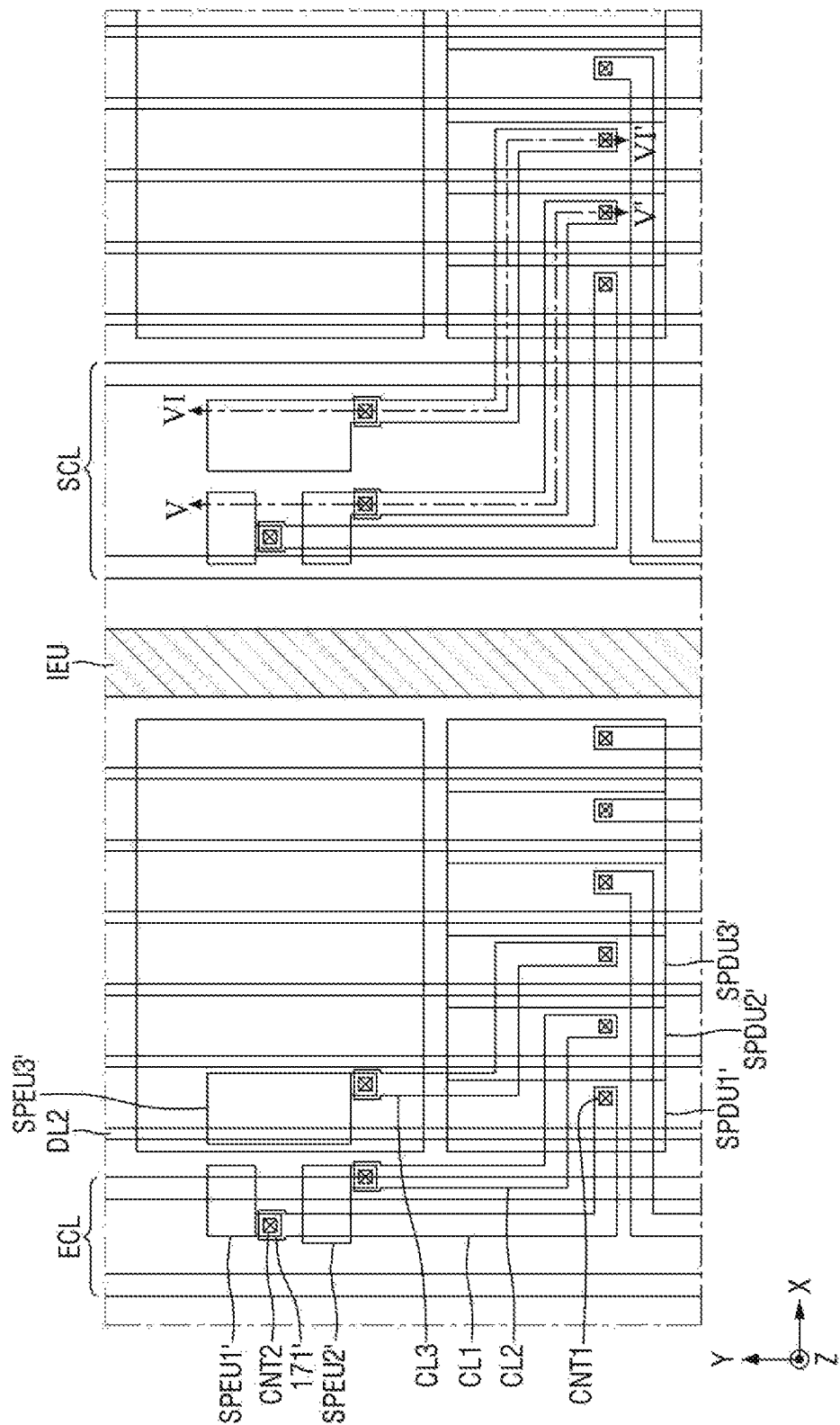
FIG. 16 is a layout diagram illustrating another example of the second pixel drivers and the second pixel light-emitting devices of the second pixels in the second display region of FIG. 10 in detail.

FIG. 16 is a layout diagram illustrating still another example of the second pixel drivers and the second pixel light-emitting devices of the second pixels in the second display region of FIG. 10 in detail.

The example of FIG. 16 is different from the example of FIG. 11 in that the first connection line CL1 is connected to the second pixel electrode 171' of the first sub-pixel light-emitting device SPEU1' through one of the plurality of second contact holes CNT2, that the second connection line CL2 is connected to the second pixel electrode 171' of the second sub-pixel light-emitting device SPEU2' through one of the plurality of second contact holes CNT2, that the third connection line CL3 is connected to the second pixel electrode 171' of the third sub-pixel light-emitting device SPEU3' through one of the plurality of second contact holes CNT2, and that the first connection line CL1 overlaps the second sub-pixel light-emitting device SPEU2' in the third direction (Z-axis direction).

As illustrated in FIG. 16, when the first connection line CL1 is connected to the second pixel electrode 171' of the first sub-pixel light-emitting device SPEU1' through the one of the plurality of second contact holes CNT2, the first connection line CL1 may overlap the second sub-pixel light-emitting device SPEU2' and/or the third sub-pixel light-emitting device SPEU3' in the third direction (Z-axis direction). Further, when the second connection line CL2 is connected to the second pixel electrode 171' of the second sub-pixel light-emitting device SPEU2' through the one of the plurality of second contact hole CNT2, the second connection line CL2 may overlap the first sub-pixel light-emitting device SPEU1' and/or the third sub-pixel light-emitting device SPEU3' in the third direction (Z-axis direction). Furthermore, when the third connection line CL3 is connected to the second pixel electrode 171' of the third sub-pixel light-emitting device SPEU3' through the one of the plurality of second contact hole CNT2, the third connection line CL3 may overlap the first sub-pixel light-emitting device SPEU1' and/or the second sub-pixel light-emitting device SPEU2' in the third direction (Z-axis direction). Therefore, freedom of a design of the arrangement of the first to third connection lines CL1, CL2, and CL3 may be enhanced than the example of FIG. 11.

Figure 17:
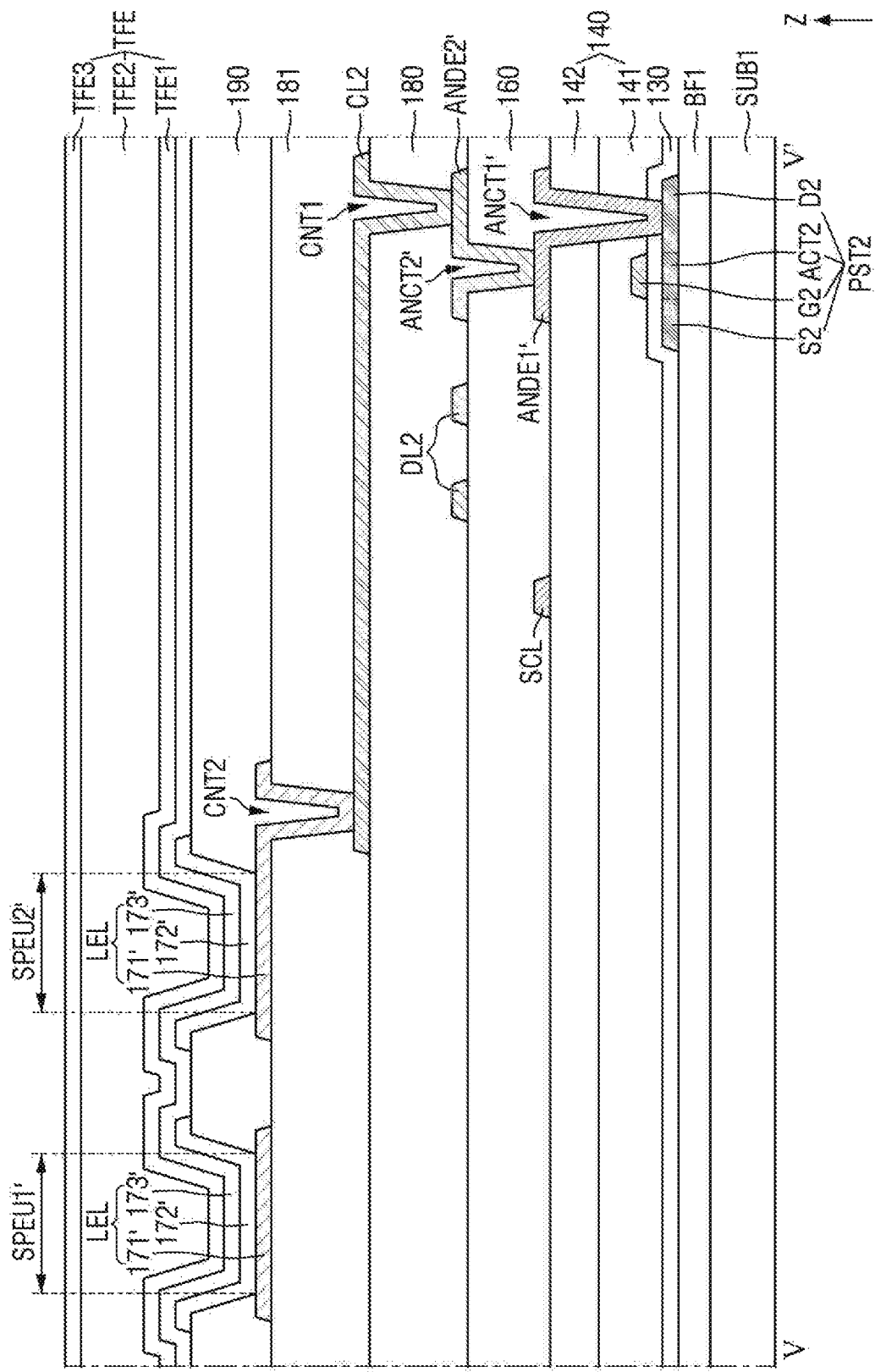
FIG. 17 is a cross-sectional view illustrating another example of the display panel taken along line V-V' of FIG. 16.
Figure 18:
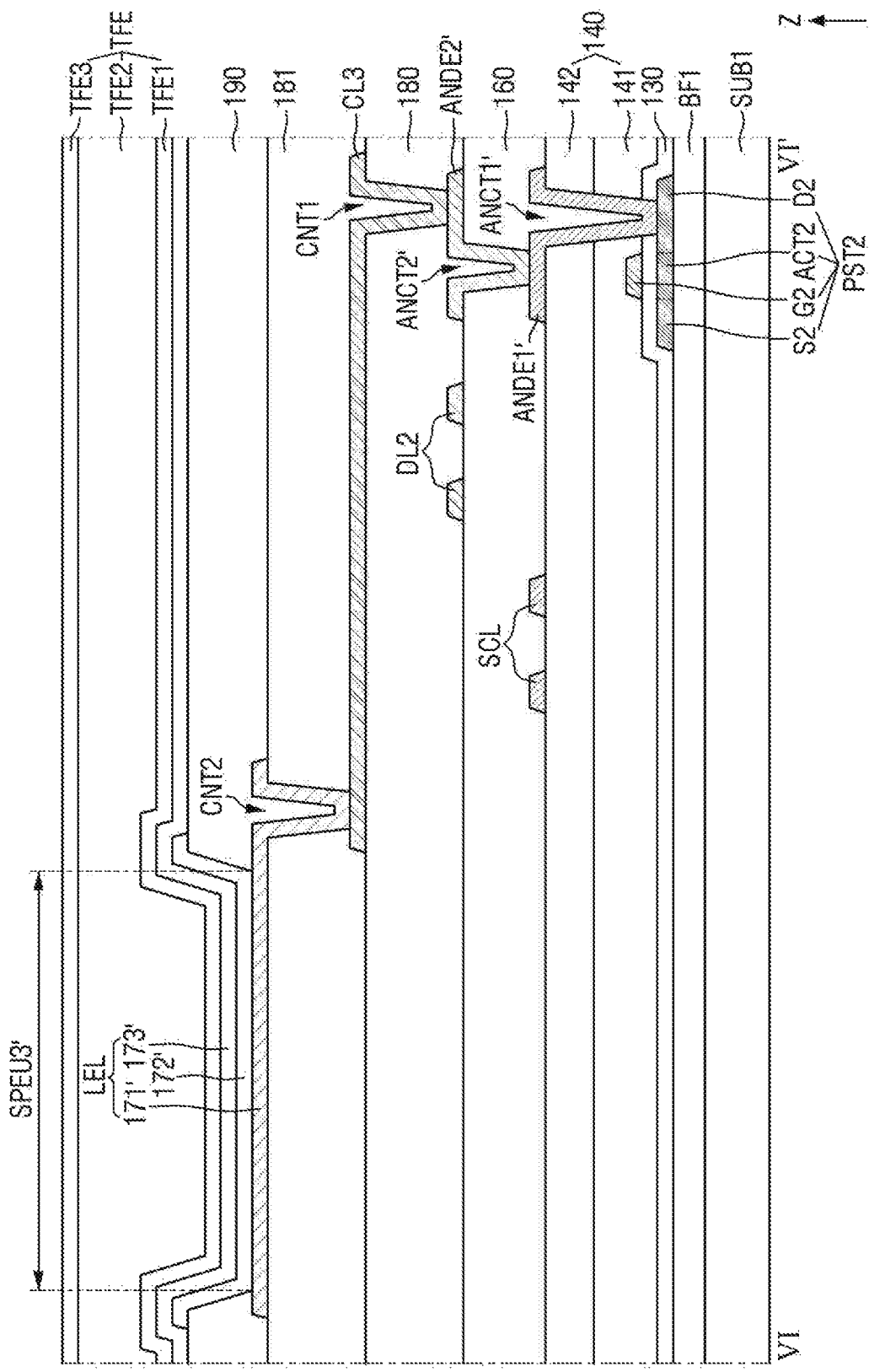
FIG. 18 is a cross-sectional view illustrating another example of the display panel taken along line VI-VI' of FIG. 16.

FIG. 17 is a cross-sectional view illustrating still another example of the display panel taken along line V-V' of FIG. 16. FIG. 18 is a cross-sectional view illustrating still another example of the display panel taken along line VI-VI' of FIG. 16.

The examples of FIGS. 17 and 18 is different from the examples of FIGS. 12 and 13A in that the second pixel electrode 171' of the second sub-pixel light-emitting device SPEU2' is connected to the second connection line CL2 through one of the plurality of second contact holes CNT2 formed through the first planarization film 160, and that the second pixel electrode 171' of the third sub-pixel light-emitting device SPEU3' is connected to the third connection line CL3 through one of the plurality of second contact holes CNT2 formed through the first planarization film 160. In this case, the first pixel electrode 171' of the first sub-pixel light-emitting device SPEU1' may also be connected to the second connection line CL2 through one of the plurality of second contact holes CNT2 formed through the first planarization film 160.

Figure 19:
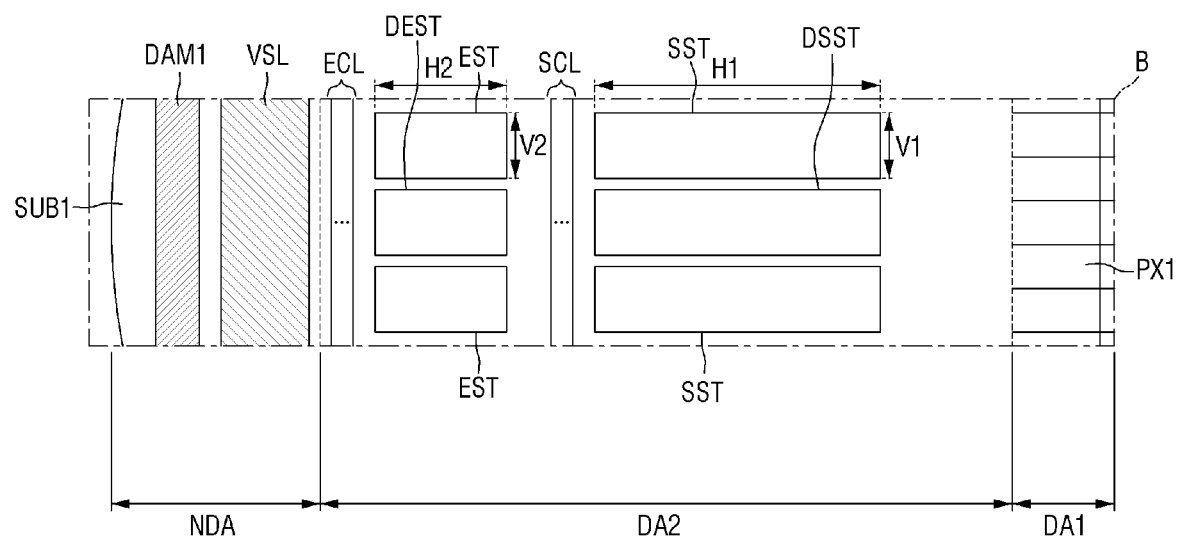
FIG. 19 is a layout diagram illustrating a first display region, a second display region, and a non-display region of a first corner portion of a display panel according to an embodiment.

FIG. 19 is a layout diagram illustrating a first display region, a second display region, and a non-display region of a first corner portion of a display panel according to an embodiment. In FIG. 19, an example of a layout of region B of FIG. 2 is illustrated.

The example of FIG. 19 is different from the example of FIG. 4 in that a dummy scan stage DSST and a dummy light-emitting stage DEST are disposed instead of the second pixel drivers PDU2 of the second pixels PX2. The dummy scan stage DSST is a scan stage that is not connected to a scan line and the dummy light-emitting stage DEST is a light-emitting stage that is not connected to a light-emitting lines. In FIG. 19, the difference from the example of FIG. 4 will be mainly described.

Referring to FIG. 19, the dummy scan stage DSST may be disposed between adjacent scan stages SST. The dummy light-emitting stage DEST may be disposed between adjacent light-emitting stages EST.

When a first corner portion CS1 is rounded to have a predetermined radius of curvature as illustrated in FIG. 2, an outer length of the first corner portion CS1 may be greater than an inner length of the first corner portion CS1. In contrast, an inner length of a first side portion SS1 may be substantially the same as an outer length.

First pixels PX1 may be disposed adjacent to an inner side of the first side portion SS1 and an inner side of the first corner portion CS1, and the scan stages SST may be disposed adjacent to an outer side of the first side portion SS1 and an outer side of the first corner portion CS1. Therefore, an interval between the first pixels PX1 in the first corner portion CS1 may be substantially the same as an interval between the first pixels PX1 in the first side portion SS1. In contrast, an interval between the scan stages SST in the first corner portion CS1 may be greater than an interval between the scan stages SST in the first side portion SS1. When the interval between the scan stages SST in the first corner portion CS1 is designed to be the same as the interval between the scan stages SST in the first side portion SS1, some spaces may remain between the scan stages SST in the first corner portion CS1. Dummy scan stages DSST may be disposed in the spaces remaining between the scan stages SST in the first corner portion CS1.

When the dummy scan stages DSST are not disposed in the spaces, active layers, gate electrodes, source electrodes, and drain electrodes of some transistors of the scan stages SST that are adjacent to the spaces may be over-etched. Accordingly, the driving of the scan stages SST adjacent to the spaces may be affected. For example, there may be a difference between scan signals of the scan stages SST that are adjacent to the spaces and scan signals of other scan stages SST that are not adjacent to the spaces. Therefore, the dummy scan stages DSST are disposed in the spaces as illustrated in FIG. 19, and thus the active layers, the gate electrodes, the source electrodes, and the drain electrodes of some transistors of the first scan stage SST1 and the second scan stage SST2 that are adjacent to the spaces may be prevented from being over-etched.

Further, when the first corner portion CS1 is rounded to have a predetermined curvature as illustrated in FIG. 3, some spaces may remain between the light-emitting stages EST. When the dummy light-emitting stages DEST are not disposed in the spaces, the active layers, the gate electrodes, the source electrodes, and the drain electrodes of some transistors of the light-emitting stages EST that are adjacent to the spaces may be over-etched. Therefore, the dummy light-emitting stages DEST are disposed in the spaces as illustrated in FIG. 19, and thus the active layers, the gate electrodes, the source electrodes, and the drain electrodes of some transistors of the light-emitting stages EST that are adjacent to the spaces may be prevented from being over-etched.

Figure 20:
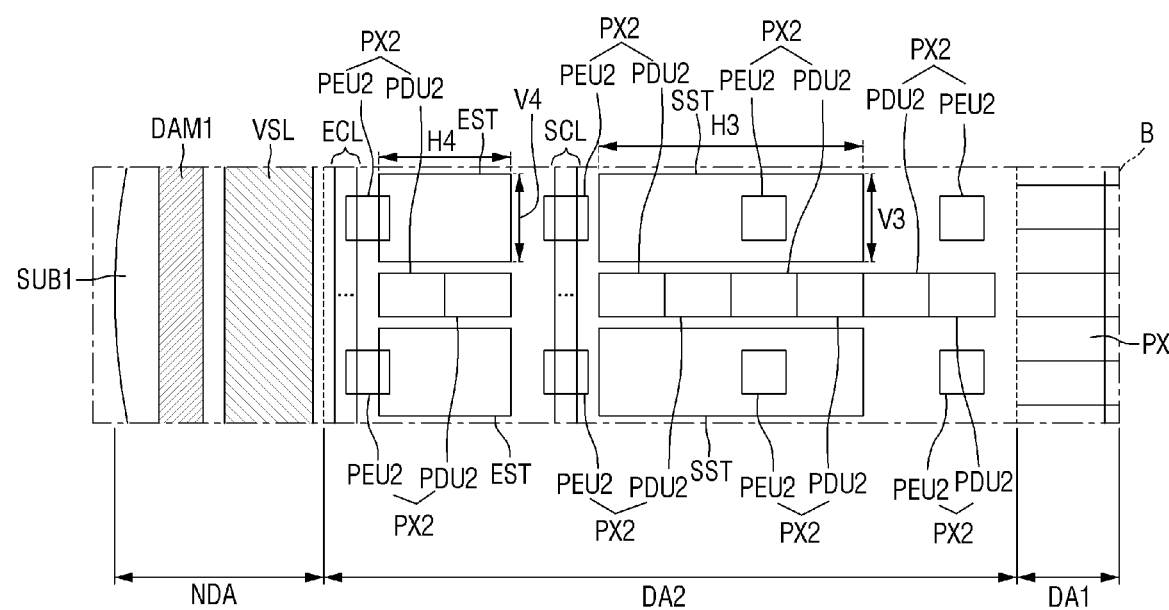
FIG. 20 is a layout diagram illustrating a first display region, a second display region, and a non-display region of a first corner portion of a display panel according to another embodiment.

FIG. 20 is a layout diagram illustrating a first display region, a second display region, and a non-display region of a first corner portion of a display panel according to another embodiment. In FIG. 20, another example of the layout of region B of FIG. 2 is illustrated.

Referring to FIG. 20, in a first corner portion CS1, a dummy scan stage DSST and a dummy light-emitting stage DEST may be removed in order to arrange the second pixel drivers PDU2 of the second pixels PX2. That is, a space for arranging the second pixels PX2 in the first corner portion CS1 is greater than a space for arranging the second pixels PX2 in a first side portion SS1 rather than the first corner portion CS1.

Accordingly, a vertical length V3 of a scan stage SST of the first corner portion CS1 may be greater than a vertical length V1 of a scan stage SST of a region A of the first side portion SS1. An area of the scan stage SST of the first corner portion CS1 may be substantially the same as an area of the scan stage SST of the region A of the first side portion SS1. Therefore, a horizontal length H3 of the scan stage SST of the first corner portion CS1 may be smaller than a horizontal length H1 of the scan stage SST of the region A of the first side portion SS1.

Further, a vertical length V4 of a light-emitting stage EST of the first corner portion CS1 may be greater than a vertical length V2 of a light-emitting stage EST of the region A of the first side portion SS1. An area of the light-emitting stage EST of the first corner portion CS1 may be substantially the same as an area of the light-emitting stage EST of the region A of the first side portion SS1. Therefore, a horizontal length H4 of the light-emitting stage EST of the first corner portion CS1 may be smaller than a horizontal length H2 of the light-emitting stage EST of the region A of the first side portion SS1.

Figure 21:
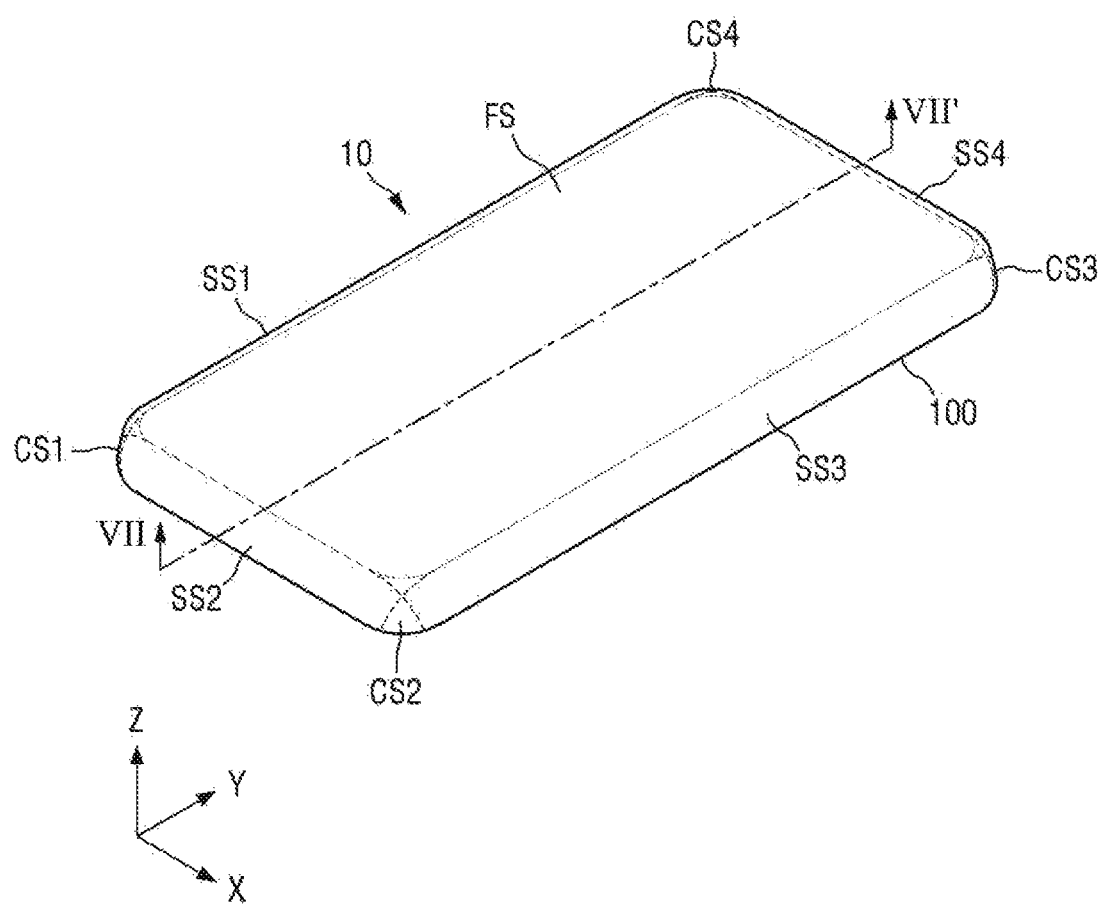
FIG. 21 is a perspective view illustrating a display device according to another embodiment.

FIG. 21 is a perspective view illustrating a display device according to another embodiment.

Referring to FIG. 21, a display device 10 may include a display panel 100 including a front portion FS, a first side portion SS1, a second side portion SS2, a third side portion SS3, a fourth side portion SS4, a first corner portion CS1, a second corner portion CS2, a third corner portion CS3, and a fourth corner portion CS4.

The front portion FS may have a rectangular planar shape having a short side in a first direction (an X-axis direction) and a long side in a second direction (a Y-axis direction), but embodiments of the present specification are not limited thereto. The front portion FS may have another polygonal, circular, or elliptical planar shape. In FIG. 21, the front portion FS is illustrated as being formed flat, but embodiments of the present specification are not limited thereto. The front portion FS may include a curved surface.

The first side portion SS1 may extend from a first side of the front portion FS. The first side portion SS1 may be bent along a first bending line BL1 (see FIG. 22) of the first side of the front portion FS and, accordingly, may have a first radius curvature. The first side of the front portion FS may be a left side of the front portion FS as illustrated in FIG. 21.

The second side portion SS2 may extend from a second side of the front portion FS. The second side portion SS2 may be bent along a second bending line BL2 (see FIG. 22) of a second side of the front portion FS and, accordingly, may have a second radius of curvature. The second radius of curvature may be different from the first curvature, but embodiments of the present specification are not limited thereto. The second side of the front portion FS may be a lower side of the front portion FS as illustrated in FIG. 21.

The third side portion SS3 may extend from a third side of the front portion FS. The third side portion SS3 may be bent along a third bending line BL3 (see FIG. 22) of a third side of the front portion FS and, accordingly, may have a third radius of curvature. The third radius of curvature may be the same as the second curvature, but embodiments of the present specification are not limited thereto. The third side of the front portion FS may be a right side of the front portion FS as illustrated in FIG. 21.

The fourth side portion SS4 may extend from a fourth side of the front portion FS. The fourth side portion SS4 may be bent along a fourth bending line BL4 (see FIG. 22) of a fourth side of the front portion FS and, accordingly, may have a fourth radius of curvature. The fourth radius of curvature may be the same as the first curvature, but embodiments of the present specification are not limited thereto. The fourth side of the front portion FS may be an upper side of the front portion FS as illustrated in FIG. 21.

The first corner portion CS1 may be disposed between the first side portion SS1 and the second side portion SS2. Specifically, the first corner portion CS1 may be connected to a lower side of the first side portion SS1 and a left side of the second side portion SS2. The first corner portion CS1 may be a region having a double radius of curvature, which is bent at the first radius of curvature of the first side portion SS1 and the second radius of curvature of the second side portion SS2. Accordingly, a strain may be applied to the first corner portion CS1 due to a force by which the first corner portion CS1 is bent at the first radius of curvature of the first side portion SS1 and a force by which the first corner portion CS1 is bent at the second radius of curvature of the second side portion SS2.

The second corner portion CS2 may be disposed between the second side portion SS2 and the third side portion SS3. Specifically, the second corner portion CS2 may be connected to a right side of the second side portion SS2 and a lower side of the third side portion SS3. The second corner portion CS2 may be a region having a double radius of curvature, which is bent at the second radius of curvature of the second side portion SS2 and the third radius of curvature of the third side portion SS3. Accordingly, a strain may be applied to the second corner portion CS2 due to a force by which the second corner portion CS2 is bent at the second curvature of the second side portion SS2 and a force by which the second corner portion CS2 is bent at the third curvature of the third side portion SS3.

The third corner portion CS3 may be disposed between the third side portion SS3 and the fourth side portion SS4. Specifically, the third corner portion CS3 may be connected to the upper side of the third side portion SS3 and the right side of the fourth side portion SS4. The third corner portion CS3 may be a region having a double radius of curvature, which is bent at the third radius curvature of the third side portion SS3 and the fourth radius of curvature of the fourth side portion SS4. Accordingly, a strain may be applied to the third corner portion CS3 due to a force by which the third corner portion CS3 is bent at the third radius of curvature of the third side portion SS3 and a force by which the third corner portion CS3 is bent at the fourth radius of curvature of the fourth side portion SS4.

The fourth corner portion CS4 may be disposed between the first side portion SS1 and the fourth side portion SS4. Specifically, the fourth corner portion CS4 may be connected to an upper side of the first side portion SS1 and a left side of the fourth side portion SS4. The fourth corner portion CS4 may be a region having a double radius of curvature, which is bent at the first radius of curvature of the first side portion SS1 and the fourth radius of curvature of the fourth side portion SS4. Accordingly, a strain may be applied to the fourth corner portion CS4 due to a force by which the fourth corner portion CS4 is bent at the first radius of curvature of the first side portion SS1 and a force by which the fourth corner portion CS4 is bent at the fourth radius of curvature of the fourth side portion SS4.

Figure 24:
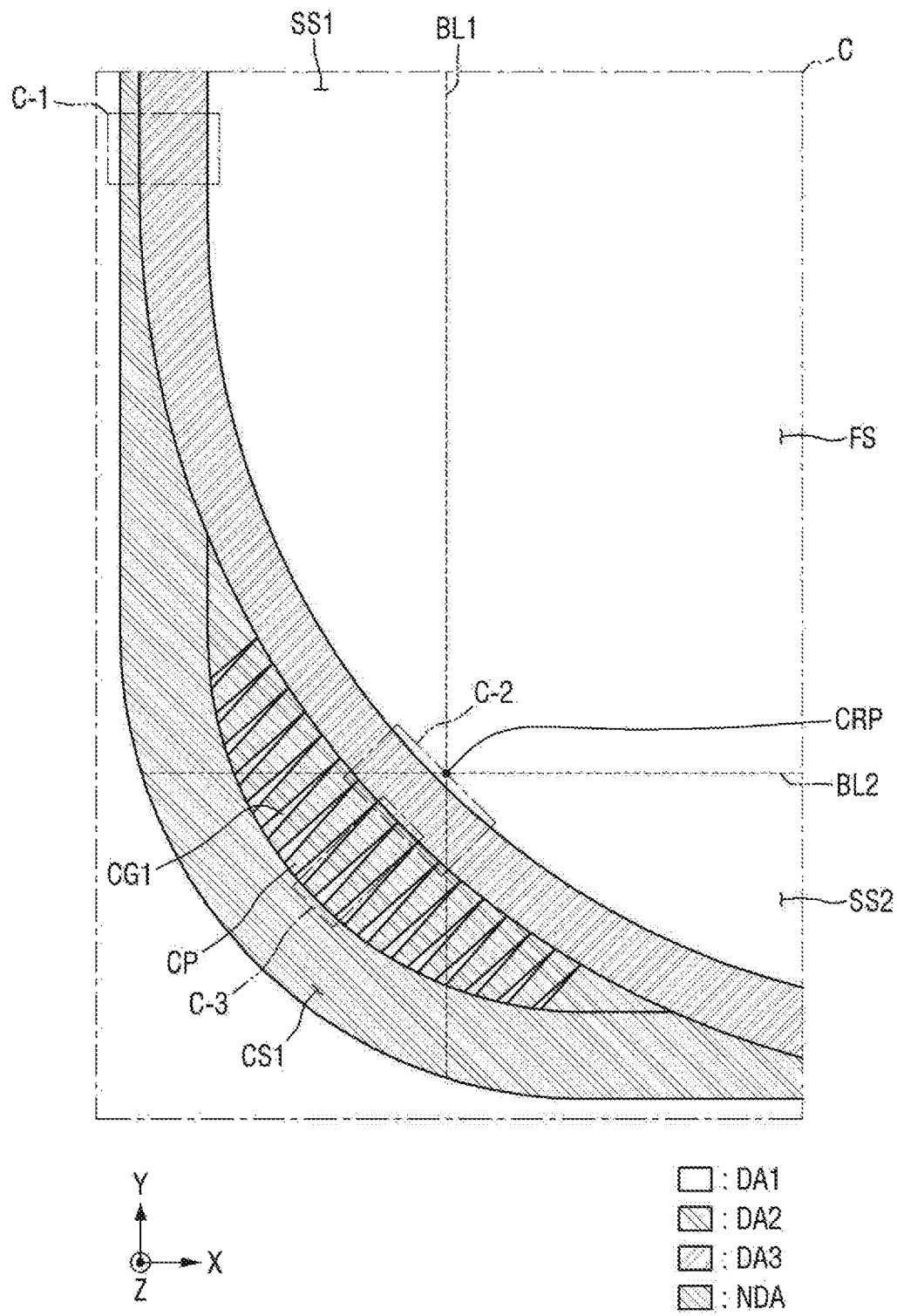
FIG. 24 is a layout diagram illustrating first to third display regions and a non-display region in detail, which are disposed in a first corner portion of a display panel according to an embodiment.

Each of the first corner portion CS1, the second corner portion CS2, the third corner portion CS3, and the fourth corner portion CS4 may include cutout patterns, which are divided by cutout portions as illustrated in FIG. 24, in order to reduce the strain caused by the double curvature. Descriptions of the cutout patterns will be given below with reference to FIG. 24.

Figure 22:
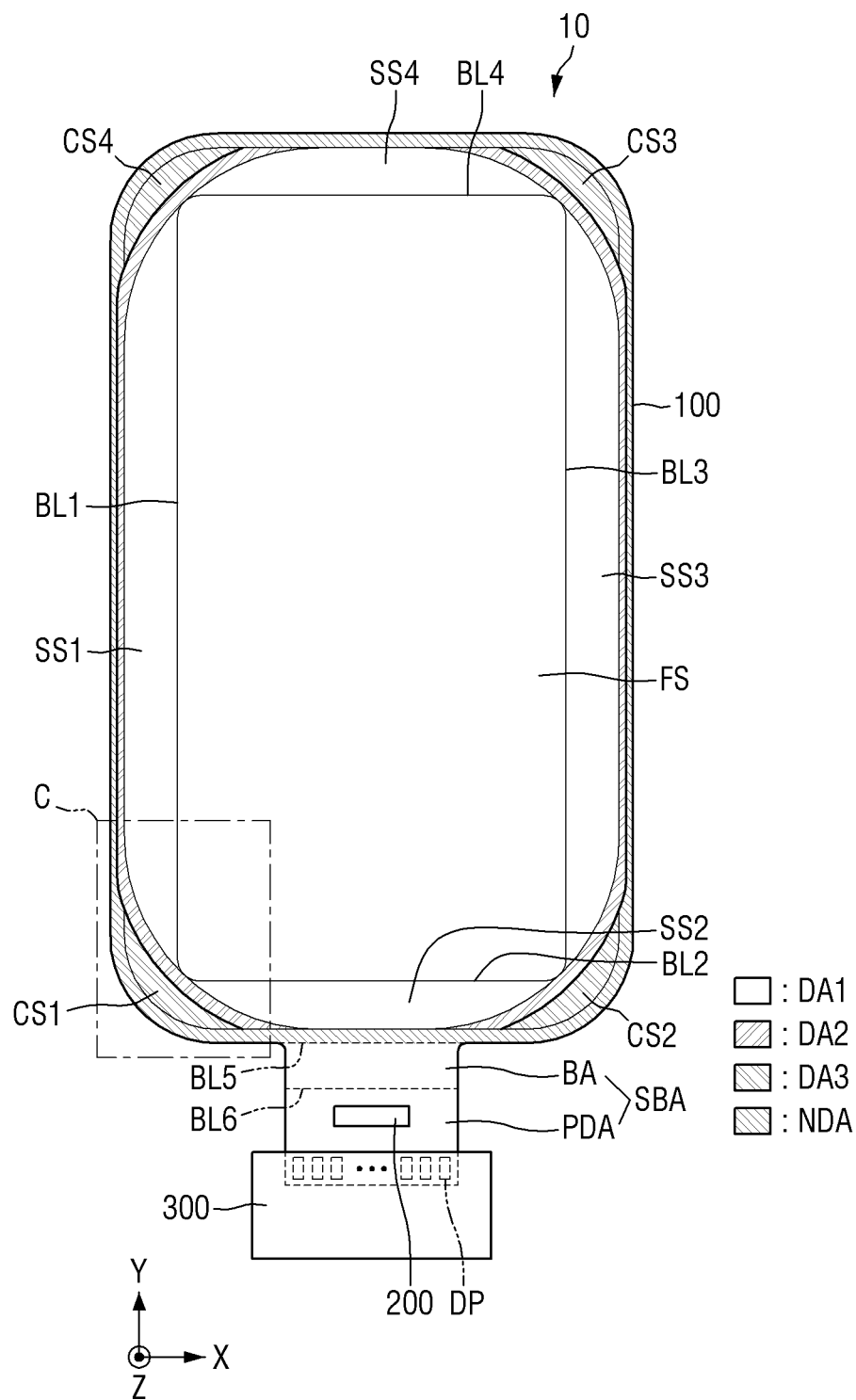
FIG. 22 is an unfolded view illustrating the display device according to another embodiment.

FIG. 22 is an unfolded view illustrating the display device according to another embodiment.

Referring to FIG. 22, a display panel 100 may further include a bending portion BA and a pad portion PDA. The display panel 100 may include first to third display regions DA1 to DA3, a non-display region NDA, a bending portion BA, and a pad portion PA.

The first to third display regions DA1 to DA3 refer to regions which include pixels or light-emitting regions and in which an image is displayed. The non-display region NDA refers to a region which does not include pixels or light-emitting regions and in which an image is not displayed. In the non-display region NDA, signal lines for driving the pixels or the light-emitting regions or a scan driver may be disposed.

The first display region DA1 is a main display region of the display panel 100 and may include a front portion FS, a portion of a first side portion SS1, a portion of a second side portion SS2, a portion of a third side portion SS3, and a portion of the fourth side portion SS4. The portion of the first side portion SS1 refers to a region extending from a first side of the front portion FS and the portion of the second side portion SS2 refers to a region extending from a second side of the front portion FS. The portion of the third side portion SS3 refers to a region extending from a third side of the front portion FS and the portion of the fourth side portion SS4 refers to a region extending from a fourth side of the front portion FS. Each of corners of the first display region DA1 may be rounded to have a predetermined curvature.

The second display region DA2 may be an auxiliary display region that assists the first display region DA1 that is the main display region. A resolution of the second display region DA2 may be different from a resolution of the first display region DAL For example, since the second display region DA2 serves to assist the first display region DA1, the resolution of the second display region DA2 may be lower than the resolution of the first display region DA1. That is, the number of second pixels PX2 (see FIG. 4) per unit area in the second display region DA2 may be smaller than the number of first pixels PX1 (see FIG. 4) per unit area in the first display region DA1. However, embodiments of the present specification are not limited thereto, and the resolution of the second display region DA2 may be substantially the same as the resolution of the first display region DA1.

The second display region DA2 may be disposed on an outer side of any one of the edges of the first display region DA1. At least a portion of the second display region DA2 may be disposed at any one of the corner portions CS1 to CS4. Further, at least a portion of the second display region DA2 may be disposed along any two of the first to fourth side portions SS1 to SS4.

For example, at least a portion of the second display region DA2 disposed outside of a corner in which the lower side and the left side of the first display region DA1 meet may be disposed at the first corner portion CS1, the first side portion SS1, and the second side portion SS2. At least a portion of the second display region DA2 disposed outside of a corner in which the lower side and the right side of the first display region DA1 meet may be disposed at the second corner portion CS2, the second side portion SS2, and the third side portion SS3. At least a portion of the second display region DA2 disposed outside of a corner in which the upper side and the right side of the first display region DA1 meet may be disposed at the third corner portion CS3, the third side portion SS3, and the fourth side portion SS4. At least a portion of the second display region DA2 disposed outside of a corner in which the upper side and the left side of the first display region DA1 meet may be disposed at the fourth corner portion CS4, the first side portion SS1, and the fourth side portion SS4.

The third display region DA3 may be an auxiliary display region that assists the first display region DA1 that is a main display region. A resolution of the third display region DA3 may be different from the resolution of the first display region DAL For example, since the third display region DA3 serves to assist the first display region DA1, the resolution of the third display region DA3 may be lower than the resolution of the first display region DA1. That is, the number of third pixels PX3 (see FIG. 25) per unit area in the third display region DA3 may be smaller than the number of first pixels PX1 (see FIG. 4) per unit area in the first display region DA1. However, embodiments of the present specification are not limited thereto, and the resolution of the third display region DA3 may be substantially the same as the resolution of the first display region DA1.

The third display region DA3 may be disposed outside of the second display region DA2. Accordingly, the second display region DA2 may be disposed between the first display region DA1 and the third display region DA3. At least a portion of the third display region DA3 may be disposed at any one of the corner portions CS1 to CS4. Further, at least a portion of the third display region DA3 may be disposed at any two of the first to fourth side portions SS1 to SS4.

For example, at least a portion of the third display region DA3 disposed outside of a corner in which the lower side and the left side of the first display region DA1 meet may be disposed at the first corner portion CS1, the first side portion SS1, and the second side portion SS2. At least a portion of the third display region DA3 disposed outside of a corner in which the lower side and the right side of the first display region DA1 meet may be disposed at the second corner portion CS2, the second side portion SS2, and the third side portion SS3. At least a portion of the third display region DA3 disposed outside of a corner in which the upper side and the right side of the first display region DA1 meet may be disposed on the third corner portion CS3, the third side portion SS3, and the fourth side portion SS4. At least a portion of the third display region DA3 disposed outside of a corner in which the upper side and the left side of the first display region DA1 meet may be disposed at the fourth corner portion CS4, the first side portion SS1, and the fourth side portion SS4.

The non-display region NDA may include the first side portion SS1, the second side portion SS2, the third side portion SS3, the fourth side portion SS4, the first corner portion CS1, the second corner portion CS2, the third corner portion CS3, and the fourth corner portion CS4. The non-display region NDA may be disposed outside of the first display region DA1 at the side portions SS1, SS2, SS3, and SS4. For example, the non-display region NDA may be disposed on a left edge of the first side portion SS1, a lower edge of the second side portion SS2, a right edge of the third side portion SS3, and an upper edge of the fourth side portion SS4.

The non-display region NDA may be disposed on the outer side of the third display region DA3 at the corner portions CS1, CS2, CS3, and CS4. For example, the non-display region NDA may be disposed outside of a corner in which the lower side and the left side of the first corner portion CS1 meet, outside a corner in which the lower side and the right side of the second corner portion CS2 meet, outside a corner in which the upper side and the right side of the third corner portion CS3 meet, and outside a corner in which the upper side and the left side of the fourth corner portion CS4 meet.

The bending portion BA may extend from a lower side of the second side portion SS2. The bending portion BA may be disposed between the second side portion SS2 and the pad portion PA. A length of the bending portion BA in the first direction (X-axis direction) may be smaller than a length of the second side portion SS2 in the first direction (X-axis direction). The bending portion BA may be bent along a fifth bending line BL5 of the lower side of the second side portion SS2.

The pad portion PDA may extend from a lower side of the bending portion BA. A length of the pad portion PDA in the first direction (X-axis direction) may be greater than a length of the bending portion BA in the first direction (X-axis direction), but embodiments of the present specification are not limited thereto. The length of the pad portion PDA in the first direction (X-axis direction) may be substantially the same as the length of the bending portion BA in the first direction (X-axis direction). The pad portion PDA may be bent along a sixth bending line BL6 of the lower side of the bending portion BA. The pad portion PDA may be disposed on a lower surface of the display panel 100 opposing the front portion FS.

A display driving circuit 200 and pads DP may be disposed on the pad portion PDA. The display driving circuit 200 may be formed as an integrated circuit (IC). The display driving circuit 200 may be attached onto the pad portion PDA by a COP method or an ultrasonic method. Alternatively, the display driving circuit 200 may be disposed on a display circuit board 300 attached to the pads DP of the pad portion PDA.

The display circuit board 300 may be attached onto the pads DP of the pad portion PDA using an anisotropic conductive film. Accordingly, the pads DP of the pad portion PDA may be electrically connected to the display circuit board 300.

As illustrated in FIG. 22, the display regions DA1, DA2, and DA3 may be disposed on the front portion FS, the first side portion SS1, the second side portion SS2, the third side portion SS3, the fourth side portion SS4, the first corner portion CS1, the second corner portion CS2, the third corner portion CS3, and the fourth corner portion CS4 of the display panel 100. Therefore, an image may be displayed not only on the front portion FS, the first side portion SS1, the second side portion SS2, the third side portion SS3, and the fourth side portion SS4 of the display panel 100, but also on the first corner portion CS1, the second corner portion CS2, the third corner portion CS3, and the fourth corner portion CS4.

Figure 23:
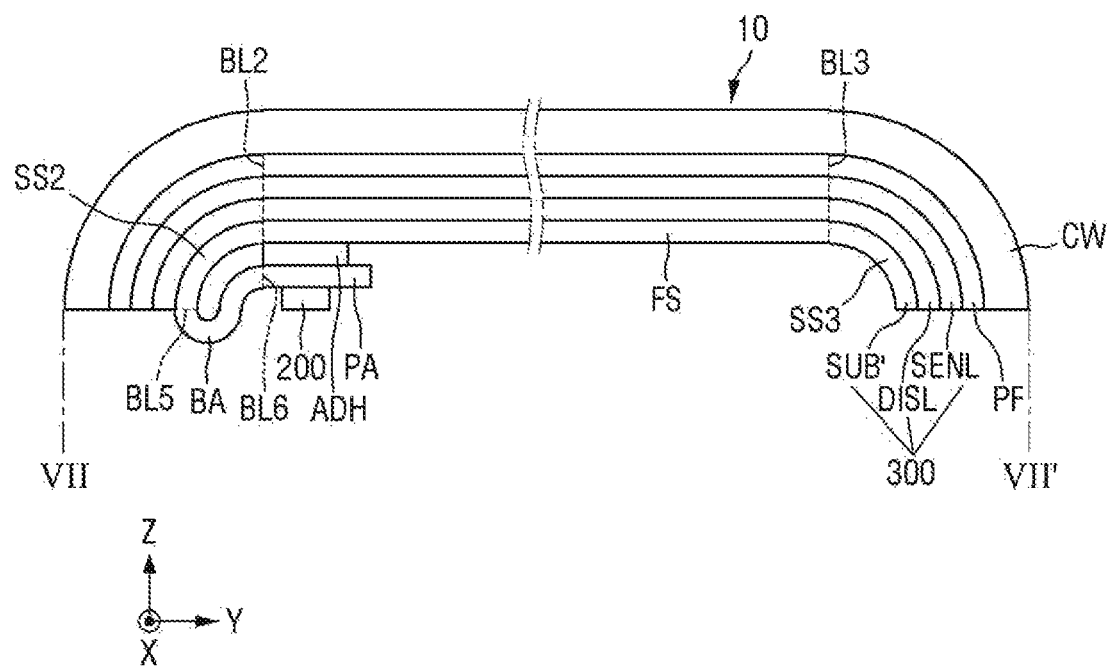
FIG. 23 is a cross-sectional view illustrating the display device according to another embodiment.

FIG. 23 is a cross-sectional view illustrating the display device according to another embodiment. In FIG. 23, an example of the display device 10 taken along line VII-VII' of FIG. 21 is illustrated.

Referring to FIG. 23, the display device 10 may further include a cover window CW and a polarizing film PF disposed on a display panel 100. The display panel 100 may include a substrate SUB, a display layer DISL, and a sensor electrode layer SENL. The polarizing film PF may be disposed on the display panel 100 and the cover window CW may be disposed on the polarizing film PF.

The display layer DISL may be disposed on the substrate SUB1. The display layer DISL may include display regions DA1, DA2, and DA3 (see FIG. 22) and a non-display region NDA. The display layer DISL may include a thin film transistor layer TFTL (see FIG. 9), a light-emitting element layer EML (see FIG. 9) in which light-emitting elements emitting light are disposed, and an encapsulation layer TFE (see FIG. 9) for encapsulating the light-emitting element layer EML (see FIG. 9).

The sensor electrode layer SENL, the polarizing film PF, and the cover window CW may be disposed on the second side portion SS2 and the third side portion SS3. Further, the sensor electrode layer SENL, the polarizing film PF, and the cover window CW may be disposed on the first side portion SS1 and the fourth side portion SS4.

The bending portion BA may be bent along the fifth bending line BL5 and may be disposed on a lower surface of the display panel 100 opposing the second side portion SS2. The pad portion PDA may be bent along the sixth bending line BL6 and may be disposed on a lower surface of the display panel 100 opposing the front portion FS. The pad portion PDA may be attached onto the lower surface of the display panel 100 opposing the front portion FS using an adhesive member ADH. The adhesive member ADH may be a pressure sensitive adhesive.

FIG. 24 is a layout diagram illustrating first to third display regions and a non-display region in detail, which are disposed at a first corner portion of a display panel according to an embodiment. In FIG. 24, an enlarged view of region C of FIG. 22 is illustrated.

Referring to FIG. 24, an intersection point CRP of the first bending line BL1 and the second bending line BL2 may be disposed on the first display region DA1. In this case, the first display region DA1 may be disposed on the front portion FS, the first side portion SS1, the second side portion SS2, and the first corner portion CS1. The second display region DA2 may be disposed at the first side portion SS1, the second side portion SS2, and the first corner portion CS1. The third display region DA3 may be disposed at the first side portion SS1, the second side portion SS2, and the first corner portion CS1. The non-display region NDA may be disposed at the first side portion SS1, the second side portion SS2, and the first corner portion CS1.

Meanwhile, a position of the intersection point CRP of the first bending line BL1 and the second bending line BL2 is not limited to that illustrated in FIG. 24, and the intersection point CRP of the first bending line BL1 and the second bending line BL2 may be disposed at the second display region DA2 or the third display region DA3.

The first display region DA1 may include first pixels PX1 (see FIG. 4) for displaying an image. The second display region DA2 may be disposed outside of the first display region DA1. The second display region DA2 may include second pixels PX2 (see FIG. 4) for displaying an image.

When the second display region DA2 is a non-display region, a user may recognize the non-display region between the first display region DA1 and the third display region DA3. That is, the user may recognize a gap between the image displayed on the first display region DA1 and the image displayed on the third display region DA3. When the second display region DA2 including the second pixels PX2 (see FIG. 4) is disposed between the first display region DA1 and the third display region DA3, the gap between the image displayed on the first display region DA1 and the image displayed on the third display region DA3 may be prevented from being visually recognized by the user.

The third display region DA3 may be disposed on an outer side of the second display region DA2. The non-display region NDA may be disposed outside of the third display region DA3. The third display region DA3 may include third pixels PX3 (see FIG. 25) for displaying an image.

The third display region DA3 may include cutout patterns CP and cutout portions CG. The third pixels PX3 (see FIG. 25) may be disposed on the cutout patterns CP. The cutout patterns CP may be formed by various processes such as a process of cutting the substrate SUB1 (see FIG. 23) of the display panel 100 using a laser, a process of etching the substrate SUB1 (see FIG. 23) by an etching process, and the like. For example, when the substrate SUB1 (see FIG. 23) is formed of polyimide, the cutout patterns CP may be formed by a process of etching polyimide. In this case, the etching process may be a dry etching process in which polyimide is etched by a physical or chemical reaction of ions or radical particles in plasma.

Adjacent cutout patterns CP may be disposed to be spaced apart from each other due to the cutout portions CG. A space may be provided between adjacent cutout patterns CP due to the cutout portions CG. Accordingly, even when the first corner portion CS1 has a double curvature, the first corner portion CS1 may be stretched and contracted, and thus a strain which is applied to the first corner portion CS1 may be reduced due to the cutout portions CG.

One end of each of the cutout patterns CP may be connected to the second display region DA2 and the other end may be connected to the non-display region NDA. A length of each of the cutout patterns CP may be reduced from the second display region DA2 toward the non-display region NDA. The length of the cutout pattern CP connected to the second display region DA2 may be greater than the length of the cutout pattern CP connected to the non-display region NDA.

An outer radius of curvature of the third display region DA3 may be greater than an inner radius of curvature thereof. For example, the third display region DA3 may have a crescent plane shape. Accordingly, areas of the cutout patterns CP in the first corner portion CS1 may be different from each other. Further, lengths of the cutout patterns CP in the first corner portion CS1 may be different from each other. The length of each of the cutout patterns CP in the first corner portion CS1 may be a minimum length between a position where the cutout pattern CP and the second display region DA2 are connected and a position where the cutout pattern CP and the non-display region NDA are connected.

A plurality of cutout patterns CP may be disposed in the first corner portion CS1 and one cutout pattern CP may be disposed in each of the first side portion SS1 and the second side portion SS2. An area of the cutout pattern CP of each of the first side portion SS1 and the second side portion SS2 may be greater than an area of any one of the cutout patterns CP in the first corner portion CS1.

A scan driver which applies scan signals to the first pixels PX1 (see FIG. 4) of the first display region DA1, the second pixels PX2 (see FIG. 4) of the second display region DA2, and the third pixels PX3 (see FIG. 25) of the third display region DA3, and a light-emission driver which applies light-emitting signals to the first pixels PX1, the second pixels PX2, and the third pixels PX3 may be disposed in the second display region DA2.

Meanwhile, the display regions DA1, DA2, and DA3 and the non-display region NDA which are disposed in the second corner portion CS2, the third corner portion CS3, and the fourth corner portion CS4 illustrated in FIG. 22 may be similar to those described with reference to FIG. 24. Therefore, descriptions of the second corner portion CS2, the third corner portion CS3, and the fourth corner portion CS4 will be omitted.

Further, since a region C-1 of FIG. 24 is substantially the same as the region A of FIG. 2 which is described with reference to FIG. 4, a description of the C-1 region of FIG. 24 will be omitted.

Furthermore, since a C-2 region of FIG. 24 is substantially the same as the region B of FIG. 2 which is described with reference to FIG. 4, a description of the C-2 region of FIG. 24 will be omitted.

Figure 25:
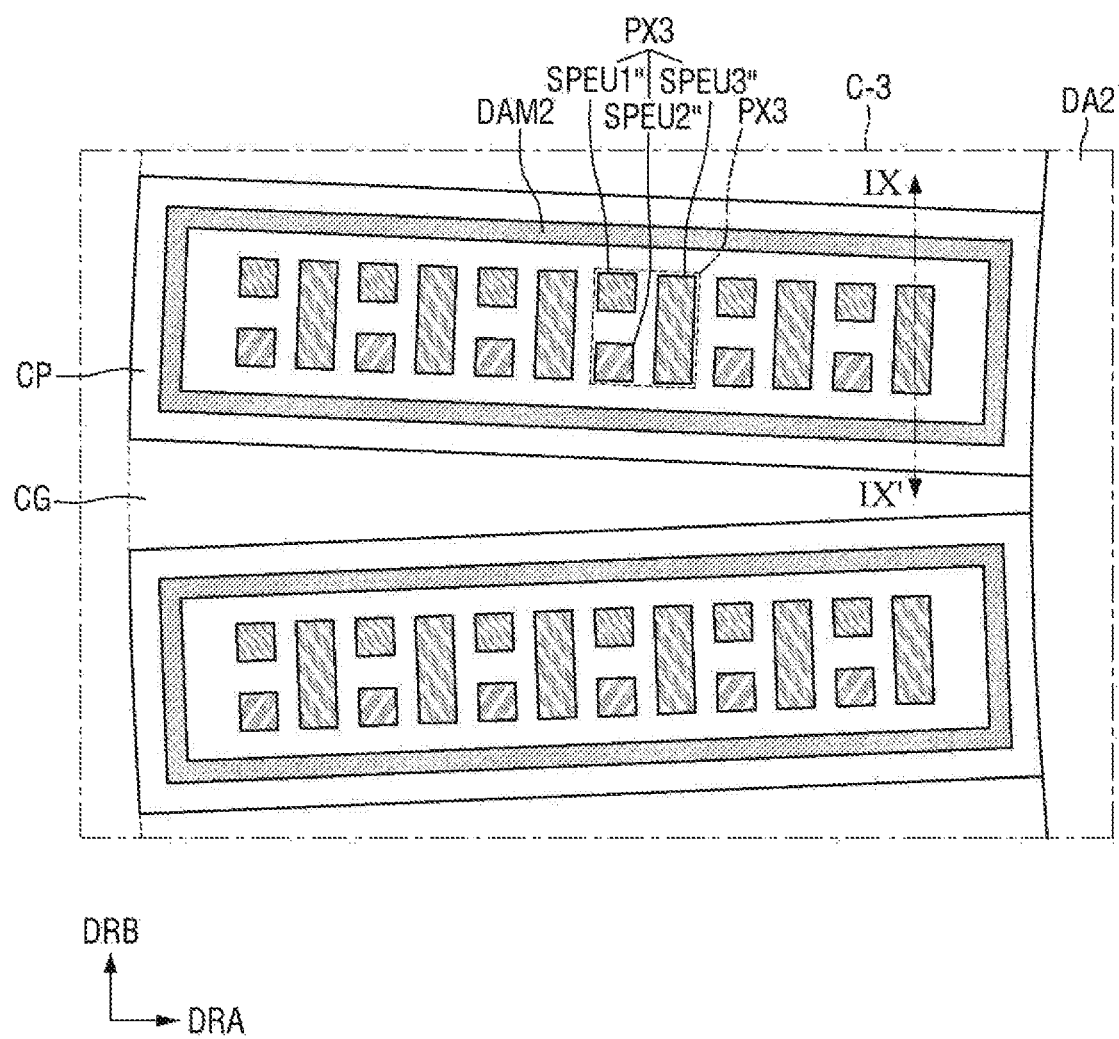
FIG. 25 is a layout diagram illustrating an example of the third display region of FIG. 24.

FIG. 25 is a layout diagram illustrating an example of the third display region of FIG. 24. In FIG. 25, an example of a region C-3 of FIG. 24 is illustrated.

Referring to FIG. 25, a third display region DA3 may include a plurality of cutout patterns CP and cutout portions CG. Accordingly, the cutout portion CG may be present between adjacent cutout patterns CP. One end of each of the cutout patterns CP may be connected to a second display region DA2 and the other end may be connected to a non-display region NDA.

Third pixels PX3 and a dam DAM2 may be disposed in each of the cutout patterns CP.

The third pixels PX3 may be arranged in an A direction DRA. Each of the third pixels PX3 may include a plurality of light-emitting regions SPEU1", SPEU2", and SPEU3". The light-emitting regions SPEU1", SPEU2", and SPEU3" of each of the third pixels PX3 may be substantially the same as the light-emitting regions SPEU1, SPEU2, and SPEU3 of each of the first pixels PX1 described with reference to FIG. 8C. Therefore, descriptions of the light-emitting regions SPEU1", SPEU2", and SPEU3" of each of the third pixels PX3 will be omitted.

The dam DAM2 may be disposed to surround the third pixels PX3. The dam DAM2 may be disposed on edges of each of the cutout patterns CP.

As illustrated in FIG. 25, when the third display region DA3 includes the cutout patterns CP and the cutout portions CG, a space may be provided between adjacent cutout patterns CP due to the cutout portions CG. Accordingly, even when the first corner portion CS1 has a double curvature, the first corner portion CS1 may be stretched and contracted, and thus a strain which is applied to the first corner portion CS1 may be reduced due to the cutout portions CG.

Figure 26:
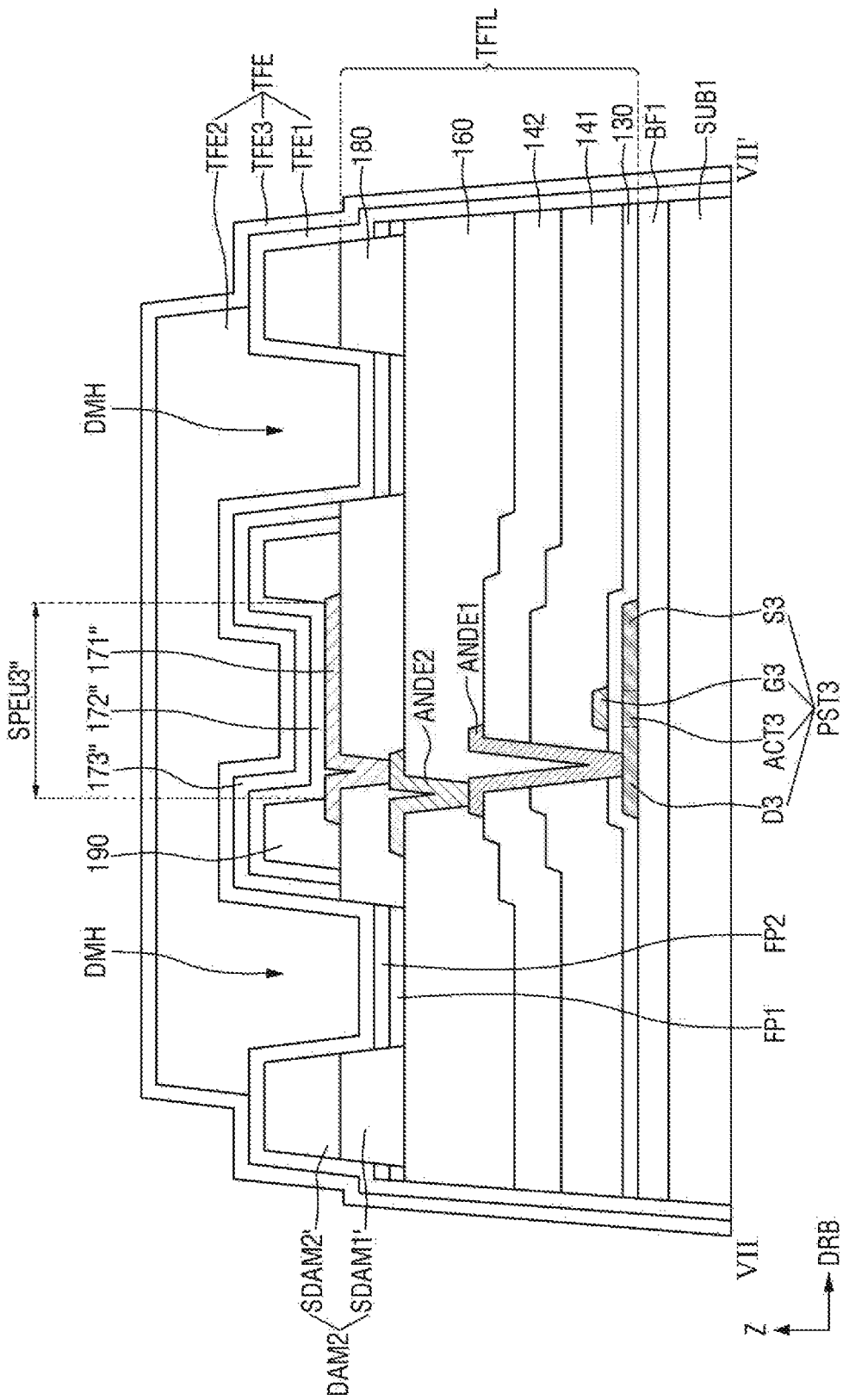
FIG. 26 is a cross-sectional view illustrating an example of the display panel taken along line IX-IX' of FIG. 25.

FIG. 26 is a cross-sectional view illustrating an example of the display panel taken along line IX-IX' of FIG. 25.

Referring to FIG. 26, a thin film transistor layer TFTL may include third thin film transistors PST3. The third thin film transistor PST3 may include a third active layer ACT3, a third gate electrode G3, a third source S3, and a third drain D3. Since the third active layer ACT3, the third gate electrode G3, the third source S3, and the third drain D3 of the third thin film transistor PST3 are substantially the same as the first active layer ACT1, the first gate electrode G1, the first source S1, and the first drain D1 of the first thin film transistor ST1 described with reference to FIG. 9, a description of the third thin film transistor PST3 will be omitted.

Further, since a third pixel electrode 171", a third light-emitting layer 172", and a third common electrode 173" of the light-emitting element layer EML are substantially the same as the first pixel electrode 171, the first light-emitting layer 172, and the common electrode 173 described with reference to FIG. 9, descriptions thereof will be omitted. Further, since a thin film encapsulation layer TFE is substantially the same as that described with reference to FIG. 9, a description of the thin film encapsulation layer TFE will be omitted.

The dam DAM2 may include a first sub dam SDAM1' formed of the same material as the second planarization film 180, and a second sub dam SDAM2' formed of the same material as the bank 190. The dam DAM2 may further include a third sub dam (not shown) disposed on the second sub dam SDAM2'.

A dam hole DMH may be disposed inside the dam DAM2. A first floating pattern FP1, a second floating pattern FP2, and a first encapsulation inorganic film TFE1 may be disposed in the dam hole DMH, and the dam hole DMH may be filled with an encapsulation organic film TFE2. In this case, the third light-emitting layer 172" and the third common electrode 173" may have poor step coverage. Therefore, the third light-emitting layer 172" and the third common electrode 173" may not be disposed on a sidewall of the dam hole DMH. Accordingly, the third light-emitting layer 172" and the third common electrode 173" may be disconnected in the dam hole DMH. The step coverage refers to a conformality which is the measure of how much coating is on the bottom/sidewall of a feature with respect to the top areas. Having a good step coverage means that a film deposited by a predetermined deposition method is formed so as to be connected without disconnection even in a portion where a step is formed.

The first floating pattern FP1 may be disposed on the second planarization film 180 in the dam hole DMH. The first floating pattern FP1 may be the third light-emitting layer 172" that is simultaneously formed when forming the third light-emitting layer 172". The first floating pattern FP1 may be disconnected to the third light-emitting layer 172" because the third light-emitting layer 172" is not a conformal film. The first floating pattern FP1 may be made of the same material as the third light-emitting layer 172". When a size of the dam hole DMH is small, the first floating pattern FP1 may not be formed. That is, the first floating pattern FP1 may not be formed in the dam hole DMH. Meanwhile, the first floating pattern FP1 may be disposed on the second sub dam SDAM2'.

Further, the second floating pattern FP2 may be disposed on the first floating pattern FP1 in the dam hole DMH. The second floating pattern FP2 may be the third common electrode 173" that is simultaneously formed when forming the third common electrode 173". The second floating pattern FP1 may be disconnected to the third common electrode 173" because the third common electrode 173" is not a conformal film. The second floating pattern FP2 may be made of the same material as the third common electrode 173". When a size of the dam hole DMH is small, the second floating pattern FP2 may not be formed. That is, the second floating pattern FP2 may not be formed in the dam hole DMH. Meanwhile, the second floating pattern FP2 may be disposed on the second sub dam SDAM2'.

Further, the first encapsulation inorganic film TFE1 and the second encapsulation inorganic film TFE3 may be disposed on a cutout surface or a side surface of the cutout pattern CP. For example, the first encapsulation inorganic film TFE1 and the second encapsulation inorganic film TFE3 may be disposed on cutout surfaces or side surfaces of the substrate SUB, the first buffer film BF1, the gate insulating film 130, the first interlayer insulating film 141, the second interlayer insulating film 142, and the first planarization film 160 of the cutout pattern CP. Because the first encapsulation inorganic film TFE1 and the second encapsulation inorganic film TFE3 are conformal films which has an excellent step coverage, the first encapsulation inorganic film TFE1 and the second encapsulation inorganic film TFE3 may be formed on cutout surfaces or side surfaces of the substrate SUB, the first buffer film BF1, the gate insulating film 130, the first interlayer insulating film 141, the second interlayer insulating film 142, and the first planarization film 160 of the cutout pattern CP. Accordingly, it is possible to prevent the third light-emitting layer 172" from being damaged due to moisture or oxygen introduced through the cutout surface or the side surface of the cutout pattern CP.

The current disclosure should not be construed as being limited to the embodiments set forth herein. Rather, these embodiments are provided so that this disclosure will be thorough and complete and will fully convey the concept of the inventive concept to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:
1. A display device comprising:
a first display region in which a plurality of first pixels is disposed;
a second display region adjacent to the first display region and in which a plurality of second pixels is disposed; and
an inorganic encapsulation portion disposed in the second display region,
wherein each of the plurality of first pixels includes a first pixel driver and a first pixel light-emitting device connected to the first pixel driver and emitting light,
wherein each of the plurality of second pixels includes a second pixel driver and a second pixel light-emitting device connected to the second pixel driver and emitting light, and
wherein the inorganic encapsulation portion does not overlap the second pixel driver and the second pixel light-emitting device in a plan view.

2. The display device of claim 1, wherein the second pixel driver and the second pixel light-emitting device are disposed apart from each other.

3. The display device of claim 1, further comprising a connection line which connects the second pixel driver to the second pixel light-emitting device.

4. The display device of claim 3, wherein the inorganic encapsulation portion does not overlap the connection line in a plan view.

5. The display device of claim 1, further comprising an organic film disposed on a first pixel transistor of the first pixel driver and a second pixel transistor of the second pixel driver,
wherein the inorganic encapsulation portion includes a hole formed through the organic film in the second display region.

6. The display device of claim 5, further comprising an encapsulation layer includes an encapsulation inorganic film and an encapsulation organic film,
wherein the encapsulation inorganic film and the encapsulation organic film are disposed in the hole of the inorganic encapsulation portion.

7. The display device of claim 6, wherein the second pixel transistor includes a gate electrode and an active layer,
wherein the active layer is disposed on a substrate,
wherein the gate electrode is disposed on a first insulating film to cover the active layer,
wherein a second insulating film covers the gate electrode, and
wherein the encapsulation inorganic film contacts the second insulating film.

8. The display device of claim 7, wherein each of the first insulating film and the second insulating film are an inorganic film.

9. The display device of claim 1, further comprising a plurality of scan stages which is disposed in the second display region, each of the scan stages being connected to a scan line extending along a first direction,
wherein the inorganic encapsulation portion does not overlap the plurality of scan stages in a plan view.

10. The display device of claim 9, further comprising a plurality of scan control lines which is disposed in the second display region and are connected to the scan stages,
wherein the inorganic encapsulation portion does not overlap the plurality of scan control lines in a plan view.

11. The display device of claim 9, further comprising a plurality of light-emitting stages which is disposed in the second display region, each of the light-emitting stages being connected to a light-emitting line extending along the first direction,
wherein the inorganic encapsulation portion does not overlap the plurality of scan stages in a plan view.

12. The display device of claim 11, further comprising a plurality of light-emitting control lines which is disposed in the second display region and are connected to the light-emitting stages,
  wherein the inorganic encapsulation portion does not overlap the plurality of light-emitting control lines in a plan view.

13. The display device of claim 12, wherein the plurality of scan control lines is disposed more adjacent to the inorganic encapsulation portion than the plurality of light-emitting control lines are.

14. The display device of claim 11, wherein the inorganic encapsulation portion is disposed between the plurality of scan stages and the plurality of light-emitting stages in the first direction.

15. The display device of claim 11, wherein the scan line and the light-emitting line are connected to a first pixel among the plurality of first pixels and a second pixel among the plurality of second pixels.

16. A display device comprising:
  a first display region in which a plurality of first pixels is disposed;
  a second display region disposed adjacent to the first display region and in which a plurality of second pixels is disposed; and
  a plurality of light-emitting stages which is disposed in the second display region, each of the light-emitting stages being connected to a light-emitting line extending along a first direction,
  wherein each of the plurality of first pixels includes a first pixel driver and a first pixel light-emitting device connected to the first pixel driver and emitting light,
  wherein each of the plurality of second pixels includes a second pixel driver and a second pixel light-emitting device connected to the second pixel driver and emitting light, and
  wherein the second pixel driver is disposed between adjacent light-emitting stages among the plurality of light-emitting stages along a second direction crossing the first direction.

17. The display device of claim 16, further comprising a connection line which connects the second pixel driver to the second pixel light-emitting device,
  wherein the second pixel driver and the second pixel light-emitting device are disposed to be spaced apart from each other.

18. The display device of claim 17, further comprising a plurality of light-emitting control lines which is disposed in the second display region and are connected to the light-emitting stages,
  wherein the connection line overlaps any one light-emitting control line among the plurality of light-emitting control lines in a plan view.

19. The display device of claim 16, wherein the second pixel light-emitting device overlaps any one light-emitting stage among the plurality of light-emitting stages in a plan view.

* * * * *